(12) United States Patent
Tatsuoka et al.

(10) Patent No.: US 10,625,347 B2
(45) Date of Patent: Apr. 21, 2020

(54) SURFACE-COATED CUTTING TOOL WITH HARD COATING LAYER THAT EXHIBITS EXCELLENT CHIPPING RESISTANCE AND MANUFACTURING METHOD THEREOF

(71) Applicant: MITSUBISHI MATERIALS CORPORATION, Tokyo (JP)

(72) Inventors: Sho Tatsuoka, Naka (JP); Kenichi Sato, Naka (JP); Kousuke Yanagisawa, Naka (JP); Shin Nishida, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 169 days.

(21) Appl. No.: 15/771,022

(22) PCT Filed: Oct. 31, 2016

(86) PCT No.: PCT/JP2016/082353
§ 371 (c)(1),
(2) Date: Apr. 25, 2018

(87) PCT Pub. No.: WO2017/073789
PCT Pub. Date: May 4, 2017

(65) Prior Publication Data
US 2018/0311742 A1    Nov. 1, 2018

(30) Foreign Application Priority Data

Oct. 30, 2015   (JP) .................................. 2015-214520
Oct. 30, 2015   (JP) .................................. 2015-214524
(Continued)

(51) Int. Cl.
*B23B 27/14*   (2006.01)
*C23C 16/34*   (2006.01)
(Continued)

(52) U.S. Cl.
CPC ............. *B23B 27/14* (2013.01); *C23C 16/34* (2013.01); *C23C 16/36* (2013.01);
(Continued)

(58) Field of Classification Search
USPC ........... 407/119; 51/307, 309; 428/216, 336, 428/697, 698, 699, 701, 702
See application file for complete search history.

(56) References Cited

U.S. PATENT DOCUMENTS

2010/0323176 A1   12/2010   Van Den Berg et al.
2011/0003126 A1   1/2011    Van Den Berg et al.
(Continued)

FOREIGN PATENT DOCUMENTS

CN      1396029 A      2/2003
CN      103097058 A    5/2013
(Continued)

OTHER PUBLICATIONS

Kimura et al., "Misorientation Analysis of Plastic Deformation of Austenitic Stainless Steel by EBSD and X-Ray Diffraction Methods", *Journal of the Japan Society of Mechanical Engineers (Part A)*, Article No. 05-0367, 2005, pp. 1722-1728 vol. 71, No. 712 (Dec. 2005).
(Continued)

Primary Examiner — Archene A Turner
(74) Attorney, Agent, or Firm — Leason Ellis LLP

(57) ABSTRACT

In a hard coating layer that contains at least any of a layer of a complex nitride or a complex carbonitride (composition formula: $(Ti_{1-x}Al_x)(C_yN_{1-y})$) of chemically-vapor-deposited Ti and Al, a layer of a complex nitride or a complex carbonitride (composition formula: $(Ti_{1-\alpha-\beta}Al_\alpha Mr_\beta)(C_\gamma N_{1-\gamma})$) of Ti, Al, and Me, and a layer of a complex nitride or a complex carbonitride (composition formula: $(Cr_{1-p}Al_p)(C_qN_{1-q})$) of Cr and Al in a surface-coated cutting tool, some
(Continued)

crystal grains that form the layer of a complex nitride or a complex carbonitride have cubic structures, and a predetermined average crystal grain misorientation and inclined angle frequency distribution are present in the crystal grains that have cubic structures.

9 Claims, 12 Drawing Sheets

(30) Foreign Application Priority Data

Oct. 30, 2015 (JP) .................................. 2015-214527
Oct. 28, 2016 (JP) .................................. 2016-211414

(51) Int. Cl.
    *C23C 16/36*     (2006.01)
    *C23C 16/455*     (2006.01)
    *C23C 30/00*     (2006.01)
    *C23C 28/04*     (2006.01)

(52) U.S. Cl.
    CPC ...... *C23C 16/45523* (2013.01); *C23C 28/044* (2013.01); *C23C 30/005* (2013.01); *B23B 2228/10* (2013.01)

(56) References Cited

U.S. PATENT DOCUMENTS

2016/0040285 A1* 2/2016 Tatsuoka ................. C23C 16/36
                                                                407/119
2017/0198400 A1* 7/2017 Tatsuoka ................. B23B 27/14

FOREIGN PATENT DOCUMENTS

| | | |
|---|---|---|
| CN | 103403222 A | 11/2013 |
| CN | 103572250 A | 2/2014 |
| EP | 3135412 A1 | 3/2017 |
| JP | 2000-144376 A | 5/2000 |
| JP | 2006-082207 A | 3/2006 |
| JP | 2009-056539 A | 3/2009 |
| JP | 2011-513594 A | 4/2011 |
| JP | 2011-516722 A | 5/2011 |
| JP | 2012-020391 A | 2/2012 |
| JP | 2013-248675 A | 12/2013 |
| JP | 2014-024130 A | 2/2014 |
| JP | 2014-133267 A | 7/2014 |
| JP | 2014-198362 A | 10/2014 |
| JP | 2014-208394 A | 11/2014 |
| JP | 2015-157351 A | 9/2015 |

OTHER PUBLICATIONS

International Search Report dated Jan. 17, 2017 for the corresponding PCT International Patent Application No. PCT/JP2016/082353.
Office Action dated Mar. 18, 2019 for the related Chinese Patent Application No. 201680073046.3.
European Search Report dated Mar. 13, 2019 for the corresponding European Patent Application No. 16860017.9.

* cited by examiner

SURFACE-COATED CUTTING TOOL WITH HARD COATING LAYER THAT EXHIBITS EXCELLENT CHIPPING RESISTANCE AND MANUFACTURING METHOD THEREOF

CROSS-REFERENCE TO RELATED PATENT APPLICATIONS

This application is a U.S. National Phase Application under 35 U.S.C. § 371 of International Patent Application No. PCT/JP2016/082353 filed on Oct. 31, 2016 and claims the benefit of Japanese Patent Applications No. 2015-214520, filed Oct. 30, 2015, No. 2015-214524, filed Oct. 30, 2015, No. 2015-214527, filed Oct. 30, 2015, and No. 2016-211414, filed Oct. 28, 2016, all of which are incorporated herein by reference in their entireties. The International Application was published in Japanese on May 4, 2017 as International Publication No. WO/2017/073789 under PCT Article 21(2).

FIELD OF THE INVENTION

The present invention relates to a surface-coated cutting tool (hereinafter, referred to as "coated tool") with a hard coating layer that has excellent chipping resistance and exhibits excellent cutting performance in use over a long period of time in a high-speed intermittent cutting of alloy steel or the like during which high temperature is generated and impact loads are exerted on a cutting edge.

BACKGROUND OF THE INVENTION

In the related art, a coated tool in which a Ti—Al-based or Cr—Al-based complex nitride layer is coated as a hard coating layer on a surface of a tool body that is formed of a tungsten carbide (hereinafter, referred to as WC)-based cemented carbide, titanium carbonitride (hereinafter, referred to as TiCN)-based cermet, or a cubic crystal boron nitride (hereinafter, referred to as cBN)-based ultra-high-pressure sintered body (hereinafter, collectively referred to as a tool body) by a physical vapor deposition method is typically known, and it is known that this exhibits excellent wear resistance.

However, since the coated tool in the related art, in which the Ti—Al-based or Cr—Al-based complex nitride layer is coated, has relatively excellent wear resistance while abnormal wear such as chipping tends to occur in a case in which the coated tool is used under high-speed intermittent cutting conditions, various suggestions have been made to improve the hard coating layer.

For example, Japanese Unexamined Publication No. 2012-20391 discloses a surface-coated cutting tool that can obtain excellent wear resistance and fracture resistance by a configuration in which a hard coating layer is formed on a surface of a tool body, in which the hard coating layer is formed of one layer or a plurality of layers, T1<T2 is satisfied where T1 represents the thickness of the thinnest portion of the hard coating layer at a ridge line portion of a cutting edge, and T2 represents the thickness at a location of 1 mm away from the ridge line of the cutting edge in a rake face direction, Da and Db are inside specific numerical ranges where a represents a location that is a distance Da in the rake face direction from the ridge line of the cutting edge on the surface of the hard coating layer, and b represents a location that is a distance Db in a flank face direction therefrom, and unevenness in a crystal orientation of crystal grains that form the hard coating layer is equal to or greater than 5 degrees and less than 10 degrees in a region corresponding to 10% or more of a region E that occupies the thickness 0.1T1 to 0.9T1 from the surface of the hard coating layer from the location a to the location b.

In addition, Japanese Unexamined Publication No. 2000-144376 discloses that a film with excellent wear resistance, seizure resistance, and oxidation resistance, with a low friction coefficient, and excellent sliding properties is obtained by forming a complex hard film that is formed of at least two kinds of metal nitride from among nitrides of Cr, Ti, Al, and V on the surface of a tool body and setting an intensity ratio I(111)/I(200) between X-ray diffraction peaks I(111) and I(200) of a (111) plane and a (200) plane that are obtained by X-ray diffraction for the hard film to be a value from 3 to 6.

However, there is a disclosure that TiAlN is deposited as the hard coating layer in the aforementioned coated tool while there is neither disclosure nor indication that the content ratio x of Al is set to be equal to or greater than 0.65.

From such a viewpoint, a technology of increasing the content ratio x of Al to about 0.9 by forming the hard coating layer by a chemical vapor deposition method has also been proposed.

For example, Japanese Unexamined Publication No. 2011-516722 describes that it is possible to deposit a $(Ti_{1-x}Al_x)N$ layer in which the value of the content ratio x of Al ranges from 0.65 to 0.95 by performing chemical vapor deposition within a temperature range of 650 to 900° C. in mixed reaction gas of $TiCl_4$, $AlCl_3$, and $NH_3$. However, since an $Al_2O_3$ layer is further applied onto the $(Ti_{1-x}Al_x)N$ layer for the purpose of enhancing a thermal insulation effect, it is not obvious in this document how the formation of the $(Ti_{1-x}Al_x)N$ layer in which the value of the content ratio x of Al is increased up to 0.65 to 0.95 affects cutting performance.

In addition, Japanese Unexamined Publication No. 2011-513594, for example, proposes that heat resistance and fatigue strength of a coated tool are improved by coating, as an outer layer, a $(Ti_{1-x}Al_x)N$ layer (where an atomic ratio of x ranges from 0.65 to 0.90) with a cubic structure or a hexagonal structure by a chemical vapor deposition method on a TiCN layer and an $Al_2O_3$ layer that are inner layers and applying compressive stress of 100 to 1100 MPa to the outer layer.

For example, Japanese Unexamined Publication No. 2006-82207 discloses a surface-coated cutting tool that includes a tool body and a hard coating layer formed on the body thereof, in which wear resistance and oxidation resistance of the hard coating layer are significantly improved due to either or both Al and Cr elements, at least one kind of element selected from a group consisting of Group 4a elements, Group 5a elements, and Group 6a elements in the periodic table and Si, a compound that is formed from at least one kind of element selected from a group consisting of carbon, nitrogen, oxygen, and boron, and chlorine being contained.

For example, Japanese Unexamined Publication No. 2014-208394 proposes that the adhesion strength between a lower layer and an upper layer may be improved, and chipping resistance and wear resistance may thus be improved by providing a hard coating layer that is formed of the lower layer, an intermediate layer, and an upper layer on a surface of a tool body such that the lower layer has a predetermined average layer thickness and is formed of a TiAl compound that has a cubic structure formed of one layer or two or more layers from among a $Ti_{1-x}Al_xN$ layer, a $Ti_{1-x}Al_xC$ layer, and a $Ti_{1-x}Al_xCN$ layer (X is the content ratio (atomic ratio) of Al and satisfies 0.65≤X≤0.95), the intermediate layer has a predetermined average layer thickness and is formed of a CrAl compound that has a cubic structure formed of one layer or two or more layers from among a $Cr_{1-Y}Al_YN$ layer, a $Cr_{1-Y}Al_YC$ layer, and a $Cr_{1-Y}Al_YCN$ layer (Y is the content ratio (atomic ratio) of Al and satisfies 0.60≤Y≤0.90), and upper layer is formed of $Al_2O_3$ that has a predetermined average layer thickness, in order to improve the chipping resistance and the wear resistance in a high-speed intermittent cutting of stainless steel, a Ti alloy, or the like.

In addition, Japanese Unexamined Publication No. 2014-198362 proposes that the adhesion strength between a lower layer and an upper layer may be improved, and the upper layer be formed of an $Al_2O_3$ layer that has fine pores with a predetermined pore diameter and pore density to alleviate mechanical and thermal impacts, thereby improving chipping resistance and wear resistance, by providing a hard coating layer that is formed of the lower layer, an intermediate layer, and the upper layer on a surface of a tool body such that the lower layer is formed of a Ti compound that has a cubic crystal structure formed of one layer or two or more layers from among a $Ti_{1-X}Al_XN$ layer, a $Ti_{1-X}Al_XC$ layer, and a $Ti_{1-X}Al_XCN$ layer (X is an atomic ratio that indicates a content portion of Al and satisfies 0.65≤X≤0.95) with a predetermined average layer thickness per layer, the intermediate layer is formed of a Cr compound that has a cubic crystal structure formed of one layer or two or more layers from among a $Cr_{1-Y}Al_YN$ layer, a $Cr_{1-Y}Al_YC$ layer, and a $Cr_{1-Y}Al_YCN$ layer (Y is an atomic ratio that indicates the content ratio of Al and satisfies 0.60≤Y≤0.90), and the upper layer is formed of $Al_2O_3$ that has fine pores with a predetermined pore diameter and pore density and an average layer thickness, in order to improve the chipping resistance and the wear resistance in a high-speed intermittent cutting of a heat-resistant alloy such as precipitation hardening stainless steel and an Inconel alloy.

Further, Japanese Unexamined Publication No. 2009-56539 proposes that the high-temperature strength of an $(Al_{1-X}Cr_X)N$ layer may be improved, and fracture resistance of a hard coating layer in a heavy-duty cutting may thus be improved by providing the hard coating layer formed of the $(Al_{1-X}Cr_X)N$ layer (where X is an atomic ratio and satisfies X=0.3 to 0.6) on the surface of the tool body, and forming a crystal orientation and a constituent atom shared lattice point distribution form such that in an inclined angle frequency distribution graph created by measuring inclined angles formed by normal lines of {100} planes with respect to a normal line of a polished surface as a surface of the tool body, the highest peak is present in an inclined angle section from 30 to 40 degrees and the total frequencies thereof accounts for equal to or greater than 60% with respect to the entire frequencies, and in a constituent atom shared lattice point distribution graph created by measuring inclined angles formed by normal lines of {112} planes with respect to the normal line of the polished surface as a surface, the highest peak is present at Σ3, and the distribution ratio thereof is equal to or greater than 50% with respect to the entire frequencies, in order to enhance fracture resistance of the hard coating layer in heavy-duty cutting of steel or cast iron, in which a large load acts on the cutting edge.

Problems to be Solved by the Invention

Requirements for saving power and energy in a cutting have increased in recent years, which has been accompanied by trends to a higher speed and efficiency in the cutting, and a coated tool has been required to have higher abnormal damage resistance such as chipping resistance, fracture resistance, and peeling resistance and also to have excellent wear resistance for use over a long period of time.

However, since the coated tools described in Japanese Unexamined Publications No. 2012-20391 and No. 2000-144376 described above do not take an increase in the content ratio x of Al in the hard coating layer formed of the $(Ti_{1-x}Al_x)N$ layer into consideration, there is a problem that it is not possible to state that the wear resistance and the chipping resistance are sufficient in a case in which the coated tool is used in high-speed intermittent cutting of alloy steel.

Meanwhile, since in the $(Ti_{1-x}Al_x)N$ layer deposited by the chemical vapor deposition method described in Japanese Unexamined Publication No. 2011-516722 described above, the content ratio x of Al can be increased and cubic structures are formed, it is possible to obtain a hard coating layer with predetermined hardness and excellent wear resistance. However, there is a problem that toughness is poor.

Furthermore, since the coated tool described in Japanese Unexamined Publication No. 2011-513594 described above has poor toughness although it has predetermined hardness and excellent wear resistance, there is a problem that abnormal damages, such as chipping, fracture, and peeling tend to occur and it is not possible to state that the coated tool exhibits satisfactory cutting performance in a case in which the coated tool is used in a high-speed intermittent cutting or the like of alloy steel.

In addition, although the coated tool described in Japanese Unexamined Publication No. 2006-82207 described above is intended to improve wear resistance and oxidation resistant properties, there is a problem that chipping resistance is not sufficient under cutting conditions with impacts, such as high-speed intermittent cutting.

In addition, since the coated tools described in Japanese Unexamined Publications No. 2014-208394 and No. 2014-198362 described above do not have sufficient strength and hardness for a CrAl compound and Cr compound themselves although the adhesion strength between the lower layer and the upper layer is improved and chipping resistance is enhanced by causing the CrAl compound and the Cr compound to be interposed as the intermediate layer in the hard coating layer, it is not possible to state that chipping resistance and wear resistance are sufficient in a case in which the coated tool is used in a high-speed intermittent cutting.

In addition, since the coated tool described in Japanese Unexamined Publication No. 2009-56539 described above also do not have sufficient strength and hardness for the $(Ti_{1-x}Al_x)N$ layer although it is possible to improve the strength of the hard coating layer, and as a result, it is possible to improve chipping resistance and fracture resistance by adjusting the content ratio of Cr in the hard coating layer formed of $(Ti_{1-x}Al_x)$ N and controlling a crystal orientation and a constituent atom shared lattice point distribution form, there is a problem that the coated tool may not exhibit excellent chipping resistance and wear resistance in use over a long period of time and a tool life for high-speed intermittent cutting of alloy steel may be short.

Thus, a technical problem to be solved by the present invention, namely an object of the present invention is to provide a coated tool that has excellent toughness and exhibits excellent chipping resistance and wear resistance in use over a long period of time even in a case in which the coated tool is used in high-speed intermittent cutting of carbon steel, alloy steel, cast iron, or the like.

SUMMARY OF THE INVENTION

Means for Solving the Problems

Thus, the present inventors has gained the following knowledge as a result of extensive research to improve chipping resistance and wear resistance of a coated tool in which a hard coating layer that contains at least a complex nitride or a complex carbonitride of Ti and Al (hereinafter, also referred to as "(Ti, Al)(C, N)" or "$(Ti_{1-x}Al_x)(C_yN_{1-y})$" in some cases) and a complex nitride or a complex carbonitride of Cr and Al (hereinafter, also referred to as "(Cr, Al)(C, N) or $(Cr_{1-p}Al_p)(C_qN_{1-q})$" in some cases) is deposited, from the aforementioned viewpoint.

That is, a hard coating layer that includes at least one $(Ti_{1-x}Al_x)(C_yN_{1-y})$ layer and one $(Cr_{1-p}Al_p)(C_qN_{1-q})$ layer and has a predetermined average layer thickness has high wear resistance in a case in which the $(Ti_{1-x}Al_x)(C_yN_{1-y})$ layer and the $(Cr_{1-p}Al_p)(C_qN_{1-q})$ layer are formed into columnar shapes in a direction perpendicular to the tool body. On the other hand, toughness of the $(Ti_{1-x}Al_x)(C_yN_{1-y})$ layer and the $(Cr_{1-p}Al_p)(C_qN_{1-q})$ layer decreases as anisotropy of the $(Ti_{1-x}Al_x)(C_yN_{1-y})$ layer and the $(Cr_{1-p}Al_p)(C_qN_{1-q})$ layer increases. As a result, chipping resistance and fracture resistance decrease, sufficient wear resistance cannot be exhibited in use over a long period of time, and it is not possible to state that the tool life is satisfactory.

Thus, the present inventors have found new knowledge that it is possible to successfully improve both hardness and toughness by causing strain in crystal grains that have NaCl-type face-centered cubic structures (hereinafter, also simply referred to as "cubic structures") and to improve chipping resistance and fracture resistance of the hard coating layer as a result on the basis of the following completely new ideas (1) to (3), as a result of intensive studies regarding the $(Ti_{1-x}Al_x)(C_yN_{1-y})$ layer and the $(Cr_{1-p}Al_p)(C_qN_{1-q})$ layer that form the hard coating layer.

(1) An idea that the $(Ti_{1-x}Al_x)(C_yN_{1-y})$ layer that is a complex nitride or a complex carbonitride of Ti and Al contains crystal grains that have NaCl-type face-centered cubic structures and average crystal grain misorientations of the crystal grains that have cubic structures are set to be equal to or greater than 2 degrees.

(2) An idea that the hard coating layer is caused to contain one kind of element (hereinafter, referred to as "Me" selected from Si, Zr, B, V, and Cr, the $(Ti_{1-\alpha-\beta}Al_\alpha Me_\beta)(C_yN_{1-y})$ layer which is a complex nitride or a complex carbonitride of Ti, Al, and Me contains crystal grains that have NaCl-type face-centered cubic structures, and the average crystal grain misorientations of the crystal grains that have a cubic structure are set to be equal to or greater than 2 degrees.

(3) An idea that the $(Cr_{1-p}Al_p)(C_qN_{1-q})$ layer that is a complex nitride or a complex carbonitride of Cr and Al contains crystal grains that have NaCl-type face-centered cubic structure, and the average crystal grain misorientations of the crystal grains that have a cubic structures are set to be equal to or greater than 2 degrees.

Further, the present inventors have found new knowledge that a higher ratio of the {111} orientation on the side of the film surface than on the side of the surface of the tool body in the columnar-shaped crystal grain causes further improvement in toughness.

Specifically, the present inventors have found that in a case in which the hard coating layer:

(1) contains at least a layer of a complex nitride or a complex carbonitride of Ti and Al and is represented by a composition formula: $(Ti_{1-x}Al_x)(C_yN_{1-y})$, particularly, and the average content ratio $x_{avg}$ of Al with respect to the total amount of Ti and Al and the average content ratio of C with respect to the total amount of C and N (where both $x_{avg}$ and $y_{avg}$ are atomic ratios) satisfy $0.60 \leq x_{avg} \leq 0.95$ and $0 \leq y_{avg} \leq 0.005$, respectively, it is possible to cause strain in crystal grains that have a cubic structures when some crystal grains that form the layer of a complex nitride or a complex carbonitride have cubic structure, and crystal grains with average crystal grain misorientations of equal to or greater than 2 degrees are present at an area ratio of 20% or greater in the layer of a complex nitride or a complex carbonitride in a case in which the crystal orientations of the crystal grains are analyzed in a vertical sectional direction by using an electron backscatter diffraction apparatus, and the average crystal grain misorientations of the individual crystal grains are obtained;

(2) contains at least a layer of a complex nitride or a complex carbonitride of Ti, Al, and Me (where Me is one kind of element selected from Si, Zr, B, V, and Cr) and is represented by a composition formula: $(Ti_{1-\alpha-\beta}Al_\alpha Me_\beta)(C_yN_{1-y})$, particularly, when an average content ratio $\alpha_{avg}$ of Al with respect to the total amount of Ti, Al, and Me, an average content ratio $\beta_{avg}$ of Me with respect to the total amount of Ti, Al and Me, and an average content ratio $\gamma_{avg}$ of C with respect to the total amount of C and N (where all of $\alpha_{avg}$, $\beta_{avg}$ and $\gamma_{avg}$ are atomic ratios) satisfy $0.60 \leq \alpha_{avg}$, $0.005 \leq \beta_{avg} \leq 0.10$, $0 \leq \gamma_{avg} \leq 0.005$, and $0.605 \leq \alpha_{avg} + \beta_{avg} \leq 0.95$, respectively, it is possible to cause strain in crystal grains that have cubic structures when some crystal grains that form the layer of a complex nitride or a complex carbonitride have cubic structures and crystal grains with average crystal grain misorientations of equal to or greater than 2 degrees are present at an area ratio of 20% or greater in the layer of a complex nitride or a complex carbonitride in a case in which the crystal orientations of the crystal grains are analyzed in the vertical sectional direction by using an electron backscatter diffraction apparatus, and the average crystal grain misorientations of the individual crystal grains are obtained; and (3) contains at least a layer of a complex nitride or a complex carbonitride of Cr and Al and is represented by a composition formula: $(Cr_{1-p}Al_p)(C_qN_{1-q})$, particularly, when an average content ratio $p_{avg}$ of Al with respect to the total amount of Cr and Al and an average content ratio $q_{avg}$ of C with respect to the total amount of C and N (where both $p_{avg}$ and $q_{avg}$ are atomic ratios) satisfy $0.70 \leq p_{avg} \leq 0.95$ and $0 \leq q_{avg} \leq 0.005$, respectively, it is possible to cause strain in crystal grains that have cubic structures when some crystal grains that form the layer of a complex nitride or a complex carbonitride have cubic structures, and crystal grains with average crystal grain misorientations of equal to or greater than 2 degrees are present at an area ratio of 20% or greater in the layer of a complex nitride or a complex carbonitride in a case in which the crystal orientations of the crystal grains are analyzed in the vertical sectional direction by using an electron backscatter diffraction apparatus and the average crystal grain misorientations of the individual crystal grains are obtained, and (4) further, in any of (1) to (3) described above, toughness is improved by setting a higher ratio of the {111} orientation of the crystal grains on the side of the film surface than on the side of the surface of the tool body.

As a result, the present inventors have found that a cutting tool with such a hard coating layer formed thereon has improved chipping resistance and fracture resistance and exhibits excellent wear resistance over a long period of time.

Further, the $(Ti_{1-x}Al_x)(C_yN_{1-y})$ layer, the $(Ti_{1-\alpha-\beta}Al_\alpha Me_\beta)(C_yN_{1-y})$ layer, and the $(Cr_{1-p}Al_p)(C_qN_{1-q})$ layer with the aforementioned configurations can be formed by the following chemical vapor deposition methods, in which a reaction gas composition is periodically changed on the surface of the tool body, for example.

(1) Concerning $(Ti_{1-x}Al_x)(C_yN_{1-y})$ Layer

A gas group A consisting of $NH_3$, $N_2$, and $H_2$ and a gas group B consisting of $TiCl_4$, $Al(CH_3)_3$, $AlCl_3$, $N_2$, and $H_2$ are supplied to a reactor of a chemical vapor deposition reaction apparatus which is to beused from separate gas supply tubes. The gas group A and the gas group B are supplied into the reaction apparatus such that the gas flows over time intervals with a specific cycle for a shorter time than the cycle and a phase difference in a shorter time than the gas supply time occurs in the gas supply of the gas group A and the gas group B, thereby temporarily changing the reaction gas composition on the surface of the tool body among the gas group A, mixed gas of the gas group A and the gas group B, and the gas group B. Incidentally, there is no need to introduce a gas discharge process over a long time intended to strictly substitute the gas in the present invention. Therefore, it is also possible to realize a gas supply method by rotating a gas supply port, rotating a tool body, or reciprocating the tool body to temporarily change the reaction gas composition on the surface of the tool body among mixed gas mainly containing the gas group A (first reaction gas), mixed gas of the gas group A and the gas group B (second reaction gas), and mixed gas mainly containing the gas group B (third reaction gas).

The $(Ti_{1-x}Al_x)(C_yN_{1-y})$ layer with a predetermined target layer thickness is formed by performing a thermal CVD method on the surface of the tool body for a predetermined time by setting the reaction gas composition (% by volume with respect to the total of the gas group A and the gas group B) to $NH_3$: 1.0 to 1.5%, $N_2$: 1.0 to 2.0%, and $H_2$: 55 to 60% as the gas group A, $AlCl_3$: 0.6 to 0.9%, $TiCl_4$: 0.2 to 0.3%, $Al(CH_3)_3$: 0 to 0.5%, $N_2$: 12.5 to 15.0%, and $H_2$: the remaining amount as the gas group B, for example, under conditions of a reaction atmosphere pressure: 4.5 to 5.0 kPa, a reaction atmosphere temperature: 700 to 900° C., a supply cycle: 1 to 5 seconds, a gas supply time per cycle: 0.15 to 0.25 seconds, and a supply phase difference between the gas group A and the gas group B: 0.10 to 0.20 seconds.

Then, local strain in crystal lattice is formed in the crystal grains due to introduction of local unevenness in composition, dislocation, and point defect, and it is possible to change degrees of {111} orientation of the crystal grains on the side of the surface of the tool body and on the side of the film surface, by supplying the gas group A and the gas group B such that a difference occurs between a time at which the gas group A reaches the surface of the tool body and a time at which the gas group B reaches the surface of the tool body, setting $NH_3$: 1.0 to 1.5% as a nitrogen raw material gas in the gas group A, and setting $AlCl_3$: 0.6 to 0.9%, $TiCl_4$: 0.2 to 0.3%, and $Al(CH_3)_3$: 0 to 0.5% as metal chloride raw materials or carbon raw materials in the gas group B as described above. It has been found that as toughness is significantly improved while wear resistance is maintained as a result. The present inventors have found that as a result, fracture resistance and chipping resistance, in particular, are improved while wear resistance is maintained, and the hard coating layer can exhibit an excellent cutting performance in use for a long period of time even in a case in which the coated tool is used in a high-speed intermittent cutting of alloy steel or the like in which an intermittent and impact load are exterted on the cutting edge.

(2) Concerning $(Ti_{1-\alpha-\beta}Al_\alpha Me_\beta)(C_yN_{1-y})$

A gas group A consisting of $NH_3$, $N_2$, and $H_2$ and a gas group B consisting of $TiCl_4$, $Al(CH_3)_3$, $AlCl_3$, $MeCl_n$ (chloride of Me), $N_2$, and $H_2$ are supplied to a reactor of a chemical vapor deposition reaction apparatus which is to be used from separate gas supply tubes. The gas group A and the gas group B are supplied into the reaction apparatus such that the gas flows over time intervals with a specific cycle for a shorter time than the cycle and a phase difference in a shorter time than the gas supply time occurs in the gas supply of the gas group A and the gas group B, thereby temporarily changing the reaction gas composition on the surface of the tool body among the gas group A, mixed gas of the gas group A and the gas group B, and the gas group B. Incidentally, there is no need to introduce a gas discharge process over a long time intended to strictly substitute the gas in the present invention. Therefore, it is also possible to realize a gas supply method by rotating a gas supply port, rotating a tool body, or reciprocating the tool body to temporarily change the reaction gas composition on the surface of the tool body among mixed gas mainly containing the gas group A (first reaction gas), mixed gas of the gas group A and the gas group B (second reaction gas), and mixed gas mainly containing the gas group B (third reaction gas).

The $(Ti_{1-\alpha-\beta}Al_\alpha Me_\beta)(C_yN_{1-y})$ layer with a predetermined target layer thickness is formed by performing a thermal CVD method on the surface of the tool body for a predetermined time by setting the reaction gas composition (% by volume with respect to the total of the gas group A and the gas group B) to $NH_3$: 1.0 to 1.5%, $N_2$: 1.0 to 2.0%, and $H_2$: 55 to 60% as the gas group A, $AlCl_3$: 0.6 to 0.9%, $TiCl_4$: 0.2 to 0.3%, $MeCl_n$ (chloride of Me): 0.1 to 0.2%, $Al(CH_3)_3$: 0 to 0.5%, $N_2$: 12.5 to 15.0%, and $H_2$: the remaining amount as the gas group B, for example, under conditions of a reaction atmosphere pressure: 4.5 to 5.0 kPa, a reaction atmosphere temperature: 700 to 900° C., a supply cycle: 1 to 5 seconds, a gas supply time per cycle: 0.15 to 0.25 seconds, and a supply phase difference between the gas group A and the gas group B: 0.10 to 0.20 seconds.

Thus, local strain in crystal lattice is formed in the crystal grains due to introduction of local unevenness in composition, dislocation, and point defect, and it is possible to change degrees of {111} orientation of the crystal grains on the side of the surface of the tool body and on the side of the film surface, by supplying the gas group A and the gas group B such that a difference occurs between a time at which the gas group A reaches the surface of the tool body and a time at which the gas group B reaches the surface of the tool body, setting $NH_3$: 1.0 to 1.5% as a nitrogen raw material gas in the gas group A, and setting $AlCl_3$: 0.6 to 0.9%, $TiCl_4$: 0.2 to 0.3%, $MeCl_n$ (chloride of Me): 0.1 to 0.2%, and $Al(CH_3)_3$: 0 to 0.5% as metal chloride raw materials or carbon raw materials in the gas group B as described above. The present inventors have found that as a result, toughness is significantly improved. The present inventors have found that as a result, the hard coating layer can exhibit an excellent cutting performance in use for a long period of time even in a case in which the coated tool is used in a high-speed intermittent cutting of alloy steel or the like in which an intermittent and impact load are exterted on the cutting edge.

(3) Concerning $(Cr_{1-p}Al_p)(C_qN_{1-q})$ Layer

A gas group A consisting of $NH_3$, $N_2$, and $H_2$ and a gas group B consisting of $CrCl_3$, $AlCl_3$, $Al(CH_3)_3$, $N_2$, and $H_2$ are supplied to a reactor of a chemical vapor deposition reaction apparatus used from separate gas supply tubes. The gas group A and the gas group B are supplied into the reaction apparatus such that the gas flows over time intervals with a specific cycle for a shorter time than the cycle and a phase difference in a shorter time than the gas supply time occurs in the gas supply of the gas group A and the gas group B, thereby temporarily changing the reaction gas composition on the surface of the tool body among the gas group A, mixed gas of the gas group A and the gas group B, and the gas group B. Incidentally, there is no need to introduce a gas discharge process over a long time intended to strictly substitute the gas in the present invention. Therefore, it is also possible to realize a gas supply method by rotating a gas supply port, rotating a tool body, or reciprocating the tool body to temporarily change the reaction gas composition on the surface of the tool body among mixed gas mainly containing the gas group A (first reaction gas), mixed gas of the gas group A and the gas group B (second reaction gas), and mixed gas mainly containing the gas group B (third reaction gas).

The $(Cr_{1-p}Al_p)(C_qN_{1-q})$ layer with a predetermined target layer thickness is formed by performing a thermal CVD method on the surface of the tool body for a predetermined time by setting the reaction gas composition (% by volume with respect to the total of the gas group A and the gas group B) to $NH_3$: 1.0 to 1.5%, $N_2$: 1.0 to 2.0%, and $H_2$: 55 to 60% as the gas group A, $AlCl_3$: 0.6 to 0.9%, $CrCl_3$: 0.2 to 0.3%, $Al(CH_3)_3$: 0 to 0.5%, $N_2$: 12.5 to 15.0%, and $H_2$: the remaining amount as the gas group B, for example, under conditions of a reaction atmosphere pressure: 4.5 to 5.0 kP, a reaction atmosphere temperature: 750 to 900° C., a supply cycle: 1 to 5 seconds, a gas supply time per cycle: 0.15 to 0.25 seconds, and a supply phase difference between the gas group A and the gas group B: 0.10 to 0.20 seconds.

Thus, local strain in crystal lattice is formed in the crystal grains due to introduction of local unevenness in composition, dislocation, and point defect, and it is possible to change degrees of {111} orientation of the crystal grains on the side of the surface of the tool body and on the side of the film surface, by supplying the gas group A and the gas group B such that a difference occurs between a time at which the gas group A reaches the surface of the tool body and a time at which the gas group B reaches the surface of the tool body, setting $NH_3$: 1.0 to 1.5% as a nitrogen raw material gas in the gas group A, and setting $AlCl_3$: 0.6 to 0.9%, $CrCl_3$: 0.2 to 0.3%, and $Al(CH_3)_3$: 0 to 0.5% as metal chloride raw materials or carbon raw materials in the gas group B as described above. The present inventors have found that as a result, toughness is significantly improved while wear resistance is maintained. The present inventors have found that as a result, fracture resistance and chipping resistance, in particular, are improved, and the hard coating layer can exhibit an excellent cutting performance in use for a long period of time even in a case in which the coated tool is used in a high-speed intermittent cutting of alloy steel or the like in which an intermittent and impact load are exterted on the cutting edge.

The present invention has been made on the basis of the aforementioned knowledge and has aspects described below.

(1) A surface-coated cutting tool in which a hard coating layer is formed on a surface of a tool body that is formed of any of tungsten-carbide-based cemented carbide, titanium-carbonitride-based cermet, and a cubic boron-nitride-based ultra-high-pressure sintered body, wherein (a) the hard coating layer contains at least any of a layer of a complex nitride or a complex carbonitride of Ti and Al or a layer of a complex nitride or a complex carbonitride of Ti, Al, and Me (where Me is one kind of element selected from Si, Zr, B, V, and Cr), or a layer of a complex nitride or a complex carbonitride of Cr and Al, with an average layer thickness of 2 to 20 μm, (b) the layer of a complex nitride or a complex carbonitride contains at least a phase of a complex nitride or a complex carbonitride that has an NaCl-type face-centered cubic structure, (c) in a case in which crystal orientations of crystal grains that have NaCl-type face-centered cubic structures from among crystal grains that form the layer of a complex nitride or a complex carbonitride are analyzed in a vertical sectional direction by using an electron backscatter diffraction apparatus, and average crystal grain misorientations in the individual crystal grains are obtained, crystal grains with average crystal grain misorientations of 2 degrees or more are present at an area ratio of 20% with respect to the entire area of the layer of a complex nitride or a complex carbonitride, (d) further, in a case in which inclined angles formed by normal lines of {111} planes, which are crystal plane, with respect to a normal line direction of a surface of a tool body of the crystal grains are measured in a region on a side of the tool body and a region on a side of the surface obtained by equally dividing the layer of a complex nitride or a complex carbonitride into two regions in a layer thickness direction, and frequencies at which measured inclined angles within a range of 0 to 45 degrees with respect to the normal line direction are present from among the measured inclined angles in the respective sections obtained by dividing the inclined angles into each pitch of 0.25 degrees are aggregated, in a case where a ratio of total frequencies of the presence in a range of 0 to 12 degrees with respect to the entire frequencies in inclined angle frequency distribution is set as be $M_{deg}$, $M_{deg}$ ranges from 10 to 40% in the region on the side of the tool body, and in a case where a highest peak is present in an inclined angle section within a range of 0 to 12 degrees in a region on the side of the surface, a ratio of total frequencies of the presence in the range of 0 to 12 degrees with respect to the entire frequencies in inclined angle frequency distribution is set as be $N_{deg}$, $N_{deg}$ is $M_{deg}+10$ to $M_{deg}+30\%$.

(2) The surface-coated cutting tool according to (1), in which the layer of a complex nitride or a complex carbonitride is a layer of a complex nitride or a complex carbonitride of Ti and Al, and in a case in which a composition thereof is represented by a composition formula: $(Ti_{1-x}Al_x)(C_yN_{1-y})$, an average content ratio $x_{avg}$ of Al with respect to the total amount of Ti and Al and an average content ratio $y_{avg}$ of C with respect to the total amount of C and N (where both $x_{avg}$ and $y_{avg}$ are atomic ratios) in the layer of a complex nitride or a complex carbonitride satisfy $0.60 \leq x_{avg} \leq 0.95$ and $0 \leq y_{avg} \leq 0.005$, respectively.

(3) The surface-coated cutting tool according to (1), in which the layer of a complex nitride or a complex carbonitride is a layer of a complex nitride or a complex carbonitride of Ti, Al, and Me (where Me is one kind of element selected from Si, Zr, B, V, and Cr), and in a case in which a composition thereof is represented by a composition formula: $(Ti_{1-\alpha-\beta}Al_\alpha Me_\beta)(C_yN_{1-y})$, an average content ratio $\alpha_{avg}$ of Al with respect to the total amount of Ti, Al, and Me, an average content ratio $\beta_{avg}$ of Me with respect to the total amount of Ti, Al, and Me, and an average content ratio $\gamma_{avg}$ of C with respect to the total amount of C and N (where all of $\alpha_{avg}$, $\beta_{avg}$ and $\gamma_{avg}$ are atomic ratios) in the layer of a complex nitride or a complex carbonitride satisfy $0.60 \leq \alpha_{avg}$, $0.005 \leq \beta_{avg} \leq 0.10$, $0 \leq \gamma_{avg} \leq 0.005$, and $0.605 \leq \alpha_{avg} + \beta_{avg} \leq 0.95$, respectively.

(4) The surface-coated cutting tool according to (1), in which the layer of a complex nitride or a complex carbonitride is a layer of a complex nitride or a complex carbonitride of Cr and Al, and in a case in which a composition thereof is represented by a composition formula: $(Cr_{1-p}Al_p)(C_qN_{1-q})$, an average content ratio $p_{avg}$ of Al with respect to the total amount of Cr and Al and an average content ratio $q_{avg}$ of C with respect to the total amount of C and N (where both $p_{avg}$ and $q_{avg}$ are atomic ratios) in the layer of a complex nitride or a complex carbonitride satisfy $0.70 \leq p_{avg} \leq 0.95$ and $0 \leq q_{avg} \leq 0.005$, respectively.

(5) The surface-coated cutting tool according to any one of (1) to (4), in which the layer of a complex nitride or a complex carbonitride contains at least 70% by area or more of a phase of a complex nitride or a complex carbonitride that has an NaCl-type face-centered cubic structure.

(6) The surface-coated cutting tool according to any one of (1) to (5), in which in a case where the layer of a complex nitride or a complex carbonitride is observed in a vertical sectional direction of the layer, the layer of a complex nitride or a complex carbonitride has a columnar structure in which an average crystal grain width W ranges from 0.1 to 2 μm and an average aspect ratio A ranges from 2 to 10 of the individual crystal grains that have NaCl-type face-centered cubic structures.

(7) The surface-coated cutting tool according to any one of (1) to (6), in which a lower layer that is formed of a Ti compound layer including one layer or two or more layers from among a carbide layer, a nitride layer, a carbonitride layer, a oxycarbide layer, and a oxycarbonitride layer of Ti and that has a total average layer thickness of 0.1 to 20 μm is present between the tool body and the layer of a complex nitride or a complex carbonitride.

(8) The surface-coated cutting tool according to any one of (1) to (7), in which an upper layer that contains at least an aluminum oxide layer and has a total average layer thickness of 1 to 25 μm is formed above the layer of a complex nitride or a complex carbonitride.

(9) A manufacturing method of the surface-coated cutting tool according to any one of (1) to (8), comprising: forming the layer of a complex nitride or a complex carbonitride by a chemical vapor deposition method in which at least trimethyl aluminum is contained as a reaction gas component.

Note that the "average crystal grain misorientation" means a value of grain orientation spread (GOS), which will be described later.

Effects of the Invention

By configuring a surface-coated cutting tool in which a hard coating layer is formed on a surface of a tool body according to an aspect of the present invention (hereinafter, referred to as "the surface-coated cutting tool according to the present invention" or "the cutting tool according to the present invention") such that the hard coating layer contains at least any of a layer of a complex nitride or a complex carbonitride of Ti and Al or a layer of a complex nitride or a complex carbonitride of Ti, Al, and Me (where Me is one kind of element selected from Si, Zr, B, V, and Cr), or a layer of a complex nitride or a complex carbonitride of Cr and Al, with an average layer thickness of 2 to 20 μm, and in a case in which some crystal grains that form the layer of a complex nitride or a complex carbonitride have cubic structures, crystal orientations of crystal grains that have cubic structures from among crystal grains that form the layer of a complex nitride or a complex carbonitride are analyzed in a vertical sectional direction by using an electron backscatter diffraction apparatus, and average crystal grain misorientations in the individual crystal grains are obtained, crystal grains with average crystal grain misorientations of 2 degrees or more are present at an area ratio of 20% with respect to the entire area of the layer of a complex nitride or a complex carbonitride, further, in a case in which inclined angles formed by normal lines of $\{111\}$ planes, which are crystal planes, with respect to a normal line direction of a surface of a tool body of the crystal grains are measured in a region on a side of the tool body and a region on a side of the surface obtained by equally dividing the layer of a complex nitride or a complex carbonitride into two regions in a layer thickness direction, and frequencies at which measured inclined angles within a range of 0 to 45 degrees with respect to the normal line direction are present from among the measured inclined angles in the respective sections obtained by dividing the inclined angles into each pitch of 0.25 degrees are aggregated, a) $M_{deg}$ ranges from 10 to 40% when a ratio of total frequencies of the presence in a range of 0 to 12 degrees with respect to the entire frequencies in inclined angle frequency distribution is set as be $M_{deg}$, and b) $N_{deg}$ is $M_{deg}+10$ to $M_{deg}+30\%$ when a highest peak is present in an inclined angle section within a range of 0 to 12 degrees in a region on the side of the surface, and a ratio of total frequencies of the presence in the range of 0 to 12 degrees with respect to the entire frequencies in inclined angle frequency distribution is set as be $N_{deg}$, and in a case in which the layer of a complex nitride or a complex carbonitride is observed from the side of the film section, the layer of a complex nitride or a complex carbonitride has a columnar structure in which an average crystal grain width W ranges from 0.1 to 2 μm and an average aspect ratio A ranges from 2 to 10 of the individual crystal grains that have NaCl-type face-centered cubic structures, strain occurs in the crystal grains that have cubic structures, and grain boundary slipping of the crystal grains is suppressed due to an increase in degrees of the $\{111\}$ orientation. Therefore, the hardness and toughness of the crystal gains are improved. As a result, an effect that chipping resistance is improved without degrading wear resistance is achieved, the hard coating layer exhibits a superior cutting performance in use over a long period of time, and a long life of the coated tool is achieved, as compared with the hard coating layer in the related art.

DETAILED DESCRIPTION OF THE INVENTION

Figure 1:
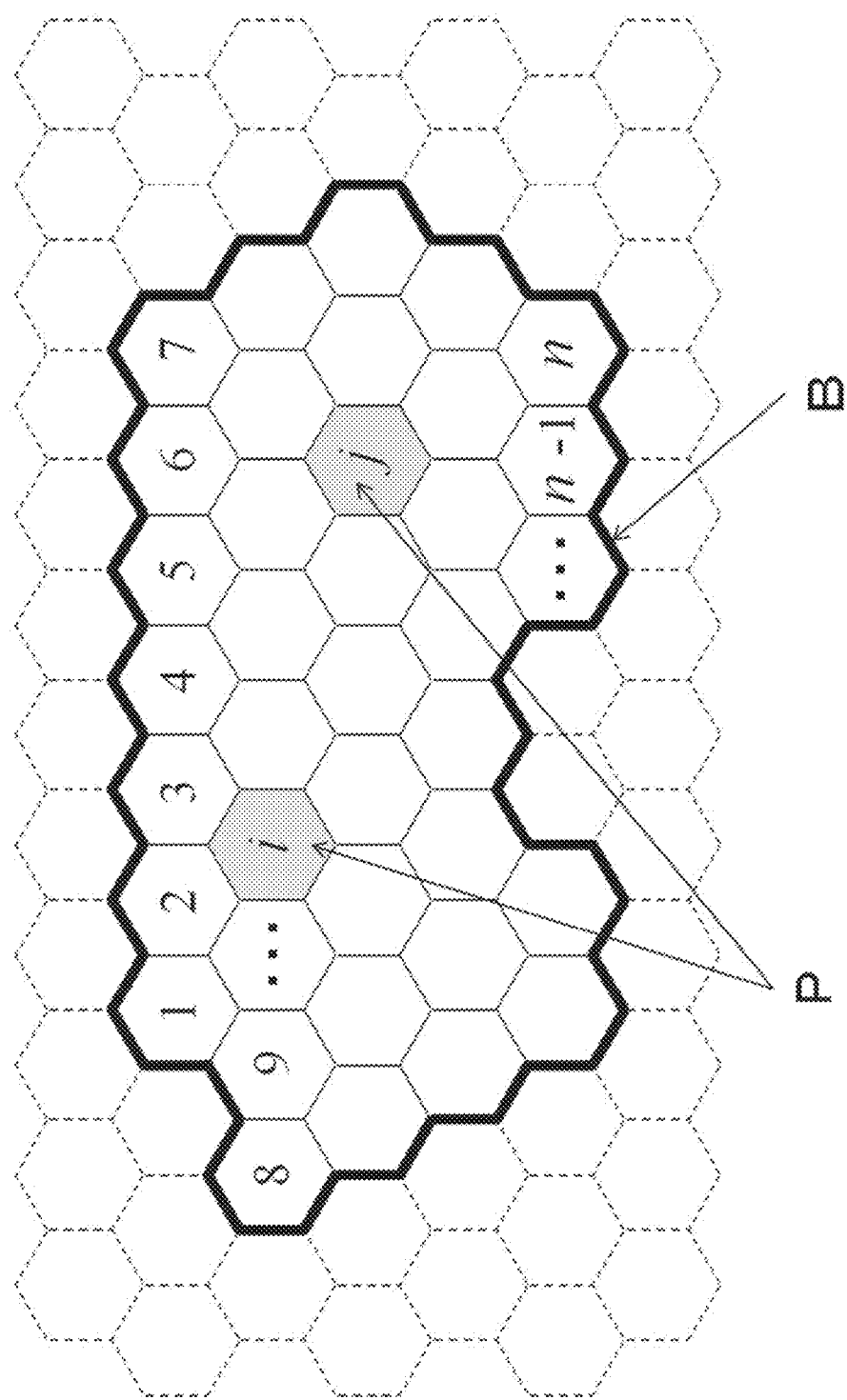
FIG. 1 is an explanatory outline diagram showing a method of measuring an average crystal grain misorientation of a crystal grain that has an NaCl-type face-centered cubic structure (cubic crystal) in a layer of a complex nitride or a complex carbonitride of Ti and Al, Ti, Al and Me, or Cr and Al in a coated tool according to the present invention.

Embodiments to implement the present invention will be described below.

Average Layer Thickness of Layer of a Complex Nitride or a Complex Carbonitride that Forms Hard Coating Layer:

A hard coating layer that has a surface-coated cutting tool according to the present invention contains at least any of a layer of a complex nitride or a complex carbonitride of chemically-vapor-deposited Ti and Al (composition formula: $(Ti_{1-x}Al_x)(C_yN_{1-y})$), a layer of a complex nitride or a complex carbonitride of Ti, Al, and Me (composition formula: $(Ti_{1-\alpha-\beta}Al_\alpha Me_\beta)(C_\gamma N_{1-\gamma})$), or a layer of a complex nitride or a complex carbonitride of Cr and Al (composition formula: $(Cr_{1-p}Al_p)(C_q N_{1-q})$). This layer of a complex nitride or a complex carbonitride has high hardness and excellent wear resistance, and effects are significantly exhibited especially when an average layer thickness ranges from 2 to 20 µm. This is because it is not possible to sufficiently secure wear resistance in use over a long period of time when the average layer thickness is less than 2 µm that is thin, and meanwhile, the crystal grains in the layer of a complex nitride or a complex carbonitride tend to become coarse and chipping tends to occur when the average layer thickness exceeds 20 µm. Therefore, the average layer thickness is defined as 2 to 20 µm.

Composition of layer of a complex nitride or a complex carbonitride that forms hard coating layer:
(1) Concerning Complex Nitride or Complex Carbonitride of Ti and Al According to the Present Invention In a case in which the composition is represented by a composition formula: $(Ti_{1-x}Al_x)(C_yN_{1-y})$, it is preferable that an average content ratio $x_{avg}$ of Al with respect to the total amount of Ti and Al and an average content ratio $y_{avg}$ of C with respect to the total amount of C and N (where both $x_{avg}$ and $y_{avg}$ are atomic ratios) satisfy $0.60 \leq x_{avg} \leq 0.95$ and $0 \leq y_{avg} \leq 0.005$, respectively.

This is because wear resistance is not sufficient in a case in which the coated tool is used in high-speed intermittent cutting of alloy steel or the like since the layer of a complex nitride or a complex carbonitride of Ti and Al has poor hardness when the average content ratio $x_{avg}$ of Al is less than 0.60. Meanwhile, the average content ratio $x_{avg}$ of Al exceeding 0.95 brings about a relative decrease in the content ratio of Ti, thus leads to embrittlement, and degrades chipping resistance. Therefore, the average content ratio $x_{avg}$ of Al is defined as $0.60 \leq x_{avg} \leq 0.95$.

In addition, when the content ratio (atomic ratio) $y_{avg}$ of the C component included in the layer of a complex nitride or a complex carbonitride is low and within a range of $0 \leq y_{avg} \leq 0.005$, adhesion between the layer of a complex nitride or a complex carbonitride and a tool body or a lower layer is increased, and lubricity is increased, thereby alleviating impacts at the time of cutting, and improving fracture resistance and chipping resistance of the layer of a complex nitride or a complex carbonitride as a result. Meanwhile, it is not preferable that the average content ratio $y_{avg}$ of the C component deviate from the range of $0 \leq y_{avg} \leq 0.005$ since toughness of the layer of a complex nitride or a complex carbonitride is then degraded, and fracture resistance and chipping resistance are thus degraded in an opposite manner Therefore, the average content ratio $y_{avg}$ of the C component is defined as $0 \leq y_{avg} \leq 0.005$.

(2) Concerning Complex Nitride or Complex Carbonitride of Ti, Al, and Me According to the Present Invention In a case in which the composition is represented by a composition formula: $(Ti_{1-\alpha-\beta}Al_\alpha Me_\beta)(C_\gamma N_{1-\gamma})$ (where Me is one kind of element selected from Si, Zr, B, V, and Cr), it is preferable to control average content ratios such that an average content ratio $\alpha_{avg}$ of Al with respect to the total amount of Ti, Al, and Me, an average content ratio $\beta_{avg}$ of Me with respect to the total amount of Ti, Al, and Me, and an average content ratio $\gamma_{avg}$ of C with respect to the total amount of C and N (where all of a $\alpha_{avg}$, $\beta_{avg}$ and $\gamma_{avg}$ are atomic ratios) satisfy $0.60 \leq \alpha_{avg}$, $0.005 \leq \beta_{avg} \leq 0.10$, $0 \leq \gamma_{avg} \leq 0.005$, and $0.605 \leq \alpha_{avg} + \beta_{avg} \leq 0.95$.

This is because hardness of the layer of a complex nitride or a complex carbonitride of Ti, Al and Me is degraded when the average content ratio $\alpha_{avg}$ of Al is less than 0.60, and wear resistance is thus not sufficient in a case in which the coated tool is used in high-speed intermittent cutting of alloy steel or the like.

Since hardness of the layer of a complex nitride or a complex carbonitride of Ti, Al, and Me is degraded when the average content ratio $\beta_{avg}$ of Me is less than 0.005, wear resistance is not sufficient in a case in which the coated tool is used in high-speed intermittent cutting of alloy steel or the like. Meanwhile, when the average content ratio $\beta_{avg}$ of Me exceeds 0.10, toughness of the layer of a complex nitride or a complex carbonitride of Ti, Al, and Me is degraded due to segregation or the like of Me at the grain boundaries, and chipping resistance is not sufficient in a case in which the coated tool is used in high-speed intermittent cutting of alloy steel or the like. Therefore, the average content ratio $\beta_{avg}$ of Me is defined as $0.005 \leq \beta_{avg} \leq 0.10$.

Meanwhile, when the sum $\alpha_{avg} + \beta_{avg}$ of the average content ratio $\alpha_{avg}$ of Al and the average content ratio $\beta_{avg}$ of Me is less than 0.605, hardness of the layer of a complex nitride or a complex carbonitride of Ti, Al and Me is degraded, and wear resistance is thus not sufficient in a case in which the coated tool is used in high-speed intermittent cutting of alloy steel or the like. When the sum $\alpha_{xvg} + \beta_{avg}$ exceeds 0.95, the content ratio of Ti relatively decreases, which leads to embrittlement and degradation of chipping resistance. Therefore, the sum $\alpha_{avg} + \beta_{avg}$ of the average content ratio $\alpha_{avg}$ of Al and the average content ratio $\beta_{avg}$ of Me is defined as $0.605 \leq \alpha_{avg} + \beta_{avg} \leq 0.95$.

Here, one kind of element selected from Si, Zr, B, V, and Cr is used as a specific component for Me.

Since in a case in which an Si component or a B component is used as Me such that $\beta_{avg}$ is equal to or greater than 0.005, hardness of the layer of a complex nitride or a complex carbonitride is improved, and wear resistance is thus improved, a Zr component has an effect of reinforcing the crystal grain boundaries, a V component improves toughness, thus further improving chipping resistance, and the Cr component improves oxidation resistance, a longer tool life can then be expected. However, since the average content ratios of the Al component and the Ti component relatively decrease when the average content ratio $\beta_{avg}$ of any of these components exceeds 0.10, and wear resistance or chipping resistance exhibits decrease trends, the average content ratio $\beta_{avg}$ that exceeds 0.10 has to be avoided.

In addition, when the average content ratio (atomic ratio) $\gamma_{avg}$ of C contained in the layer of a complex nitride or a complex carbonitride is low and within a range of $0 \leq \gamma_{avg} \leq 0.005$, adhesion between the layer of a complex nitride or a complex carbonitride and the tool body or the lower layer is improved, and lubricity is improved, impacts at the time of cutting are thus alleviated, and as a result, fracture resistance and chipping resistance of the layer of a complex nitride or a complex carbonitride are improved. In contrast, when the average content ratio $\gamma_{avg}$ of C is outside the range of $0 \leq \gamma_{avg} \leq 0.005$, toughness of the layer of a complex nitride or a complex carbonitride is degraded, and fracture resistance and chipping resistance are thus degraded in an opposite manner, which is unfavorable. Therefore, the average content ratio $\gamma_{avg}$ of C is defined as $0 \leq \gamma_{avg} \leq 0.005$.

(3) Concerning Complex Nitride or Complex Carbonitride of Cr and Al

In a case in which the composition is represented by a composition formula $(Cr_{1-p}Al_p)(C_qN_{1-q})$, it is preferable to control average content ratios such that an average content ratio $p_{avg}$ of Al with respect to the total amount of Cr and Al and an average content ratio $q_{avg}$ of C with respect to the total amount of C and N (where both $p_{avg}$ and $q_{avg}$ are atomic ratios) satisfy $0.70 \leq p_{avg} \leq 0.95$ and $0 \leq q_{avg} \leq 0.005$.

This is because high-temperature hardness of the layer of a complex nitride or a complex carbonitride of Cr and Al is degraded, and oxidation resistance thereof is also degraded when the average content ratio $p_{avg}$ of Al is less than 0.70, and wear resistance is thus not sufficient in a case in which the coated tool is used in high-speed intermittent cutting of alloy steel or the like. Meanwhile, the average content ratio $p_{avg}$ of Al exceeding 0.95 relatively decreases the content ratio of Cr, thus leads to embrittlement, and degrades chipping resistance. Therefore, the average content ratio $p_{avg}$ of Al is defined as $0.70 \leq p_{avg} \leq 0.95$.

In addition, when the content ratio (atomic ratio) $q_{avg}$ of the C component contained in the layer of a complex nitride or a complex carbonitride is low and within a range of $0 \leq q_{avg} \leq 0.005$, adhesion between the layer of a complex nitride or a complex carbonitride and the tool body or the lower layer is improved, lubricity is improved, impacts at the time of cutting are thus alleviated, and as a result, fracture resistance and chipping resistance of the layer of a complex nitride or a complex carbonitride are improved. Meanwhile, when the average content ratio of the C component is outside the range of $0 \leq q_{avg} \leq 0.005$, toughness of the layer of a complex nitride or a complex carbonitride is degraded, and fracture resistance and chipping resistance are thus degraded in an opposite manner, which is unfavorable. Therefore, the average content ratio $q_{avg}$ of the C component is defined as $0 \leq q_{avg} \leq 0.005$.

Average Crystal Grain Misorientations (GOS Values) of Individual Crystal Grains that Form Layer of a Complex Nitride or a Complex Carbonitride and have Cubic Structures:

First, an electron backscatter diffraction apparatus is used to analyze the coated tool at intervals of 0.1 μm in the vertical sectional direction, and in a case in which there is a misorientation of 5 degrees or greater between adjacent measurement points P (hereinafter, referred to as pixels) as shown in FIG. 1, the point is defined as a grain boundary B in the present invention. The vertical sectional direction means a direction perpendicular to a vertical section. The vertical section means a section of a tool perpendicular to the surface of the tool body. In addition, a region surrounded by a grain boundary B is defined as one crystal grain. However, a pixel P that has misorientations of 5 degrees or greater with respect to all adjacent pixels P and is present alone is not regarded as a crystal grain, and a crystal grain to which two or more pixels are coupled is handled as a crystal grain.

Further, a value obtained by calculating misorientations between a certain pixel P in a crystal grain and all the other pixels in the same crystal grain and averaging the misorientations is defined as a grain orientation spread (GOS) value. An outline diagram is shown in FIG. 1. The GOS value is described in the literature "Transactions of the Japan Society of Mechanical Engineers, Series A, Vol. 71, No. 712 (2005-12), Article No. 05-0367 1722 to 1728", for example. Note that the "average crystal grain misorientation" in the present invention means this GOS value. In a case in which a GOS value is represented by an equation, the GOS value can be expressed by the following equation, where n represents the number of pixels in the same crystal grain, i and j represents numbers applied to different pixels in the crystal grain (here, $1 \leq i$ and $j \leq n$), and $\alpha_{ij(i*j)}$ represents a crystal misorientation obtained from a crystal orientation at a pixel i and a crystal orientation at a pixel j.

[Expression 1]
$$GOS = \frac{\sum_{i,j=1}^{n} \alpha_{ij(i*j)}}{n(n-1)}$$

Note that it is possible to state in other words that the average crystal grain misorientation, namely the GOS value is a numerical value acquired by obtaining misorientations between pixels P in a crystal grain and all the other pixels in the same crystal grain and averaging the values thereof, and becomes a larger numerical value as a continuous change in orientations in the crystal grain becomes larger.

An electron backscatter diffraction apparatus was used (1) to analyze a layer of a complex nitride or a complex carbonitride of Ti and Al or a layer of a complex nitride or a complex carbonitride of Cr and Al at intervals of 0.1 μm in the vertical sectional direction thereof and perform measurement in the vertical sectional direction within a measurement range in five fields of view with a width of 10 μm and a longitudinal length of the film thickness, (2) to measure a polished surface as a surface as a surface within a measurement range of 25×25 μm at intervals of 0.1 μm in a direction perpendicular to the surface of a layer of a complex nitride or a complex carbonitride of Ti, Al and Me in five fields of view, the total numbers of pixels that belonged to crystal grains that had cubic structures and formed the layer of a complex nitride or a complex carbonitride were thus obtained, the average crystal grain misorientations were divided at intervals of 1 degree, and the pixels P of the crystal grains with the average crystal grain misorientations within a range of these values were aggregated and divided according to the total numbers of pixels, thereby enabling creation of a histogram that represented an area ratio of the average crystal grain misorientations. As a result, it was found that the crystal orientations in crystal grains varied, and that the crystal grains with the average crystal grain misorientations of 2 degrees or greater were present at an area ratio of 20% or greater with respect to the entire layer of a complex nitride or a complex carbonitride of Al and Ti in the obtained histogram (see FIG. 3 of the measurement in accordance with (1) described above for one example).

Since the crystal grains that form the layer of a complex nitride or a complex carbonitride of Al and Ti, the complex nitride or the complex carbonitride of Ti, Al, and Me, or the complex nitride or the complex carbonitride of Al and Cr included in the surface coated cutting tool according to the present invention include greater variation of crystal orientations in the crystal grains, that is, the crystal grains include strain as compared with crystal grains in the related art that form a TiAlN layer or a CrAlN layer as described above, this contributes to improvement in hardness and toughness.

A preferable area ratio of the crystal grains with the average crystal grain misorientations of 2 degrees or greater with respect to the area of the layer of a complex nitride or a complex carbonitride ranges from 30 to 60%. A more preferable area ratio of the crystal grains with the average crystal grain misorientations of 2 degrees or greater with respect to the area of the layer of a complex nitride or a complex carbonitride ranges from 35 to 55%. In addition, a further preferable area ratio of the crystal grains with the average crystal grain misorientations of 2 degrees or greater with respect to the area of the layer of a complex nitride or a complex carbonitride ranges from 40 to 50% in a case of the complex nitride or the complex carbonitride of Al and Ti or a complex nitride or a complex carbonitride of Al and Cr.

Crystal orientation in a region on side of tool body and region on side of surface, which is obtained by equally dividing layer of a complex nitride or a complex carbonitride into two regions in the layer thickness direction Since crystal grains that form the layer of a complex nitride or a complex carbonitride are orientated in a greater degree in a normal line direction of the surface of the tool body, that is, toward the {111} plane on the side of the surface than on the side of the surface (boundary surface) of the tool body, effects specific to the present invention that grain boundary slipping of the crystal grains is suppressed and that toughness is improved are exhibited.

However, when a ratio of an increase in the degree of {111} plane orientation on the side of the surface is less than 10% as compared with the side of the tool body, the ratio of the increase in the degree of {111} plane orientation is low, and the effect of improving toughness while maintaining wear resistance expected in the present invention is not sufficiently exhibited. Meanwhile, when the ratio exceeds 30%, epitaxial growth of the crystals is inhibited due to a rapid change in the orientation, and toughness is rather degraded. In addition, it has been found that the ratio of the increase in the degree of the {111} plane orientation becomes equal to or greater than 30% when the degree of the {111} plane orientation on the side of the tool body is less than 10%, and that the ratio of the increase in the degree of the {111} plane orientation on the surface becomes less than 10% when the degree of the {111} plane orientation on the side of the tool body exceeds 40%. Therefore, in a case in which inclined angles formed by the normal lines of the {111} planes, which are crystal planes of the crystal grains, with respect to the normal line direction of the surface of the tool body are measured in the region on the side of the tool body and the region on the side of the surface, which are obtained by equally dividing the layer of a complex nitride or a complex carbonitride into two regions in the layer thickness direction, and frequencies at which the measured inclined angles are present in each section obtained by dividing the measured inclined within a range of 0 to 45 degrees with respect to the normal line direction into each pitch of 0.25 degrees are aggregated, a) $M_{deg}$ ranges from 10 to 40% when a ratio of the total of the frequencies at which the measured inclined angles are present within a range of 0 to 12 degrees with respect to the total frequencies in the inclined angle frequency distribution in the region on the side of the tool body is set as be $M_{deg}$, and b) $N_{deg}$ is defined to be $M_{deg}+10$ to $M_{deg}$ to 30% when the highest peak is present in the inclined angle sections in the range of 0 to 12 degrees and a ratio of the total frequencies at which the measured inclined angles are present within the range of 0 to 12 degrees with respect to the total frequencies in the inclined angle frequency distribution in the region on the side of the surface is set as Ndeg.

Area Ratio of Layer of a Complex Nitride or a Complex Carbonitride:

The layer of a complex nitride or a complex carbonitride of Ti and Al, Ti, Al and Me, or Cr and Al exhibits excellent wear resistance by at least a phase of a complex nitride or a complex carbonitride that has an NaCl-type face-centered cubic structure being contained, and exhibits especially excellent wear resistance by the area ratio thereof exceeding 70%.

Average crystal grain width W and average aspect ratio A of individual crystal grains that have cubic structures in layer of a complex nitride or a complex carbonitride:

The aforementioned effects that toughness and wear resistance are improved can be further exhibited by employing such a configuration in which the individual crystal grains that have cubic structures in the layer of a complex nitride or a complex carbonitride of Ti and Al, Ti, Al and Me, or Cr and Al have columnar structures with an average crystal grain width W of 0.1 to 2 μm and an average aspect ratio A of 2 to 10.

That is, the average crystal grain width W is set to 0.1 to 2 μm because when the average crystal grain width W is less than 0.1 μm, a ratio of atoms that belong to TiAlCN crystal grain boundaries, TiAlMeCN crystal grain boundaries, or CrAlCN crystal grain boundaries with respect to atoms exposed to the surface of the coated layer relatively increases, reactivity with a work material to be cut thus increases, and as a result, wear resistance cannot sufficiently be exhibited, and when the average crystal grain width W exceeds 2 μm, the ratio of the atoms that belong to the TiAlCN crystal grain boundaries, the TiAlMeCN crystal grain boundaries, or the CrAlCN crystal grain boundaries with respect to the entire coated layer relatively decreases, toughness is thus degraded, and chipping resistance cannot sufficiently be exhibited. Therefore, it is preferable to set the average crystal grain width W to 0.1 to 2 μm.

In addition, in a case in which the average aspect ratio A is less than 2, sufficient columnar structures are not achieved, this leads to dropping out of equiaxial crystals with low aspect ratios, and as a result, wear resistance cannot sufficiently be exhibited. Meanwhile, when the average aspect ratio A exceeds 10, the strength of the crystal grains themselves cannot be maintained, and chipping resistance is rather degraded, which is unfavorable. Therefore, it is preferable to set the average aspect ratio A to 2 to 10.

Note that for the average aspect ratio A in the present invention, an aspect ratio a (=1/w) of each crystal grain is calculated by observing the hard coating layer on a side of a film section perpendicular to the surface of the tool body in vertical section observation of the hard coating layer within a range including the width of 100μ and the height of the entire hard coating layer by using a scanning electron microscope, and measuring the crystal grain width w in a direction parallel to the surface of the body and the crystal grain length L in a direction perpendicular to the surface of the body, and the average value of the aspect ratios a obtained for the individual crystal grains is calculated for the average aspect ratio A. In addition, an average value of the crystal grain widths w obtained for the individual crystal grains is calculated for the average crystal grain width W.

Lower Layer and Upper Layer:

In addition, the layer of a complex nitride or a complex carbonitride of Ti and Al, Ti, Al and Me, or Cr and Al that the surface-coated cutting tool according to the present invention has exhibits sufficient effects alone. However, in a case in which a lower layer that is made of a Ti compound layer including one layer or two or more layers from among a carbide layer, a nitride layer, a carbonitride layer, a oxycarbide layer, and a oxycarbonitride layer of Ti and has a total average layer thickness of 0.1 to 20 μm is provided and/or in a case in which an upper layer that includes an aluminum oxide layer that has an average layer thickness of 1 to 25 μm is provided, superior properties can be produced along with the effects that these layers exhibit. In a case in which a lower layer that is formed of a Ti compound layer including one layer or two or more layers from among a carbide layer, a nitride layer, a carbonitride layer, a oxycarbide layer, and a oxycarbonitride layer of Ti, and the total average layer thickness of the lower layer is less than 0.1 μm, the effects of the lower layer are not sufficiently exhibited. Meanwhile, when the total average layer thickness of the lower layer exceeds 20 μm, the crystal grains tend to be coarse, and chipping tends to occur. In addition, when the total average layer thickness of the upper layer that includes an aluminum oxide layer is less than 1 μm, the effects of the upper layer are not sufficiently exhibited. Meanwhile, when the total average layer thickness of the upper layer exceeds 25 μm, the crystal grain tends to be coarse, and chipping tends to occur.

Figure 2:
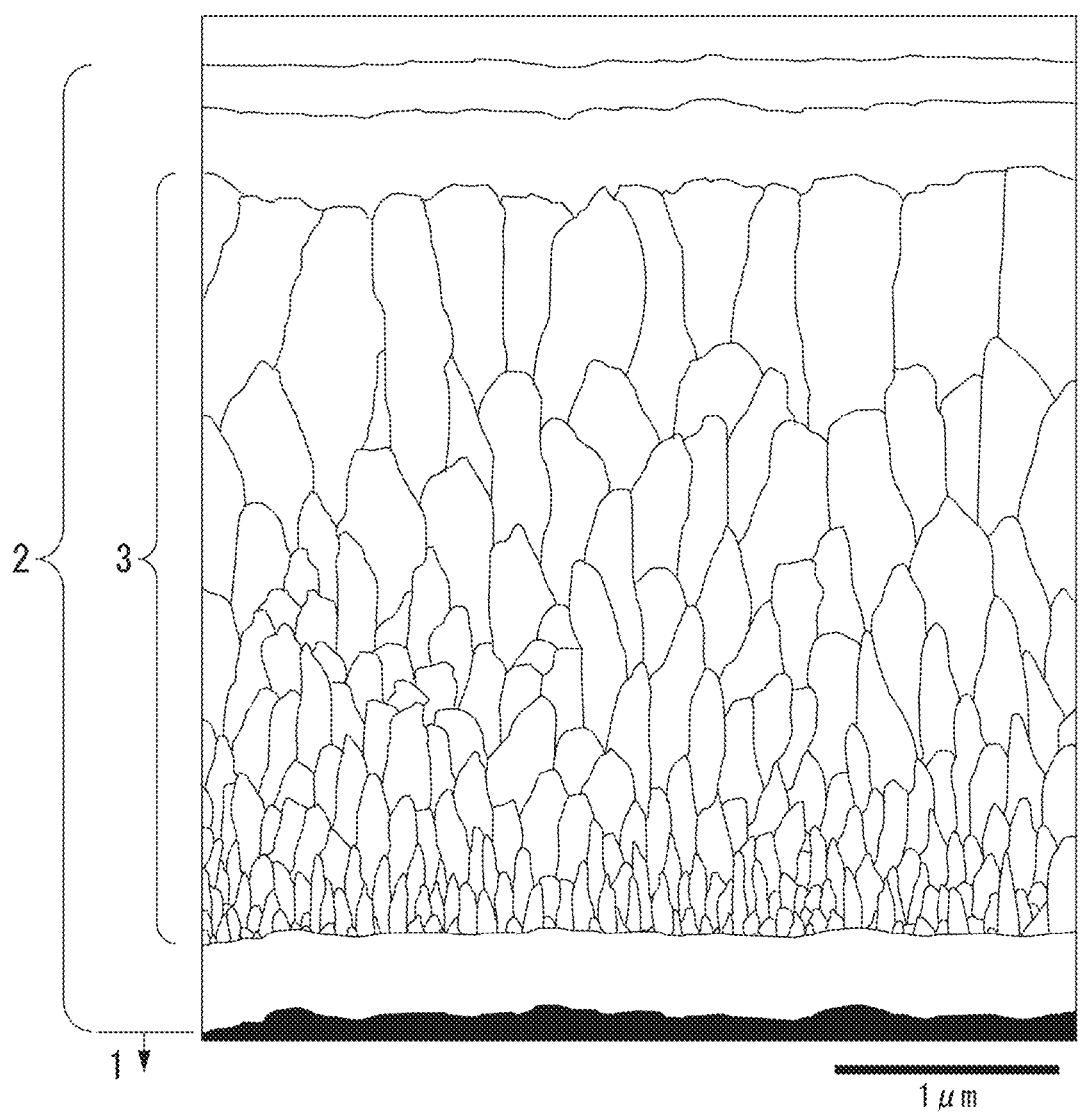
FIG. 2 is a film configuration diagram schematically showing a section of a layer of a complex nitride or a complex carbonitride of Ti and Al, Ti, Al and Me, or Cr and Al, which forms a hard coating layer in a surface-coated cutting tool according to the present invention.

Note that a diagram schematically showing a section of the layer of a complex nitride or a complex carbonitride of Ti and Al, Ti, Al and Me, or Cr and Al that forms the hard coating layer according to the present invention is shown in FIG. 2.

EXAMPLES

Next, the coated tool according to the present invention will be more specifically described in examples. Note that although a coated tool that contains WC-based cemented carbide or TiCN-based cermet in a tool body will be described in examples, the same is applied for a case in which a cubic boron-nitride-based ultra-high-pressure sintered body is used for a tool body.

Example 1

WC powder, TiC powder, TaC powder, NbC powder, $Cr_3C_2$ powder, and Co powder with average grain sizes of 1 to 3 μm were prepared as raw material powder, the raw material powder was mixed together in the mixing compositions shown in Table 1, wax was further added thereto, the mixture was mixed with acetone in a ball mill for 24 hours, was dried in a reduced pressure, and was press-molded into a green compact at a pressure of 98 MPa, the green compact is vacuum-sintered under conditions in which it was held in vacuum of 5 Pa at a predetermined temperature within a range of 1370 to 1470° C. for 1 hour, and after the sintering, tool bodies A to C made of WC-based cemented carbide with an insert shape of ISO standard SEEN1203AFSN were respectively manufactured.

In addition, TiCN (at a mass ratio TiC/TiN=50/50) powder, $Mo_2C$ powder, ZrC powder, NbC powder, WC powder, Co powder, and Ni powder with average grain sizes of 0.5 to 2 μm were prepared as raw material powder, the powder was mixed together in the mixing compositions shown in Table 2, the mixture was wet-mixed by ball mill for 24 hours, was dried, and was press-molded into a green compact at a pressure of 98 MPa, the green compact was sintered under conditions in which it was held in a nitrogen atmosphere of 1.3 kPa at a temperature of 1500° C. for 1 hour, and after the sintering, a tool body D made of TiCN-based cermet with an insert shape of ISO standard SEEN1203AFSN was manufactured.

Next, a chemical vapor deposition apparatus was used on the surfaces of these tool bodies A to D.

(a) to manufacture coated tools 1 to 15 according to the present invention under the forming conditions A to J shown in Tables 4 and 5, that is, by using a gas group A consisting of $NH_3$, $N_2$, and $H_2$ and a gas group B consisting of $TiCl_4$, $Al(CH_3)_3$, $AlCl_3$, $N_2$, and $H_2$ and performing a thermal CVD method for a predetermined period of time using a gas supply method in which a reaction gas composition was set to satisfy $NH_3$: 1.0 to 1.5%, $N_2$: 1.0 to 2.0%, and $H_2$: 55 to 60% as the gas group A and $AlCl_3$: 0.6 to 0.9%, $TiCl_4$: 0.2 to 0.3%, $Al(CH_3)_3$: 0 to 0.5%, $N_2$: 12.5 to 15.0%, and $H_2$ as the gas group B under conditions of a reaction atmosphere pressure: 4.5 to 5.0 kPa, a reaction atmosphere temperature: 700 to 900° C., a supply cycle: 1 to 5 seconds, a gas supply time per cycle: 0.15 to 0.25 seconds, and a supply phase difference between the gas group A and the gas group B: 0.10 to 0.20 seconds to form hard coating layers of $(Ti_{1-x}Al_x)(C_yN_{1-y})$ layers, in which crystal grains that had cubic structures with average crystal grain misorientations of 2 degrees or greater as shown in Table 7 were present at area ratios shown in Table 7, which had target layer thicknesses shown in Table 7.

Note that for coated tools 6 to 13 according to the present invention, lower layers shown in Table 6 and/or upper layers shown in Table 7 were formed under forming conditions shown in Table 3.

For the purpose of comparison, hard coating layers that contained at least layer of a complex nitride or a complex carbonitrides of Ti and Al were deposited on surfaces of tool bodies A to D under the conditions shown in Tables 4 and 5 with the target layer thicknesses (μm) shown in Table 8 in a manner similar to those of coated tools 1 to 15 according to the present invention. At this time, Comparative coated tools 1 to 13 were manufactured by forming the hard coating layers such that the reaction gas composition on the surface of the tool bodies did not change temporarily in a process of forming the $(Ti_{1-x}Al_x)(C_yN_{1-y})$ layer.

Note that the lower layers shown in Table 6 and/or the upper layers shown in Table 8 were formed under the forming conditions shown in Table 3 for Comparative coated tools 6 to 13 in a manner similar to those of coated tools 6 to 13 according to the present invention.

For reference, Reference coated tools 14 and 15 shown in Table 8 were manufactured by depositing $(Ti_{1-x}Al_x)(C_yN_{1-y})$ layers in reference examples with target layer thicknesses by arc ion plating using a physical vapor deposition apparatus in the related art on the surfaces of the tool body B and the tool body C.

Note that conditions of the arc ion plating used for the vapor deposition in the reference examples were as follows:

(a) Aforementioned tool bodies B and C were ultrasonically washed in acetone and were attached to a rotation table in an arc ion plating apparatus along an outer circumferential portion at a position away from the center axis by a predetermined distance in a radial direction in a dried state, and an Al—Ti alloy with a predetermined composition was deployed for a cathode electrode (evaporation source).

(b) First, the inside of the apparatus was evacuated and was heated to 500° C. with a heater while being maintained at a vacuum of $10^{-2}$ Pa or lower, a DC bias voltage of −1000V was then applied to the tool bodies that rotated while revolving on the aforementioned rotation table, a current of 200 A was caused to flow between the cathode electrode made of the Al—Ti alloy and an anode electrode to cause arc discharge and generate Al ions and Ti ions in the apparatus, and thereafter, the surfaces of the tool bodies were treated by bombard cleaning.

(c) Then, nitrogen gas was introduced as reaction gas into the apparatus to obtain a reaction atmosphere at 4 Pa, a DC bias voltage at −50 V was applied to the tool bodies that rotated while revolving on the rotation table, and a current of 120 A was caused to flow between the cathode electrode (evaporation source) made of the Al—Ti alloy and the anode electrode to cause arc discharge.

In addition, a scanning electron microscope (magnification: 5000 times) was used to measure sections of the respective constituent layers of coated tools 1 to 15 according to the present invention, Comparative coated tools 1 to 13 and Reference coated tools 14 and 15 in directions perpendicular to the tool bodies, and layer thicknesses at five points in an observation field of view were measured and averaged to obtain average layer thicknesses. All the layers had average layer thicknesses that were substantially the same as the target layer thicknesses shown in Tables 6 to 8.

In addition, for the average content ratio $x_{avg}$ of Al in the layer of a complex nitride or a complex carbonitride, the average content ratio $x_{avg}$ of Al was obtained from averages of obtained analysis results of characteristic X-rays at ten points by irradiating polished surface as a surfaces of the samples with electron beams from the side of the surfaces of the samples by using an electron microanalyzer (electron-probe-micro-analyzer: EPMA). The average content ratio $y_{avg}$ of C was obtained by secondary ion mass analysis (secondary-ion-mass-spectroscopy: SIMS). The ranges of 70 μm×70 μm from the side of the surfaces of the samples were irradiated with ion beams, and concentrations of the components discharged by a sputtering effect were measured in a depth direction. The average content ratio $y_{avg}$ of C represents an average value in the depth direction of the layer of a complex nitride or a complex carbonitride of Ti and Al. However, the content ratio of C excludes the content ratio of inevitable C contained even when gas containing C is intentionally not used as a gas raw material. Specifically, the content ratio (atomic ratio) of the C component contained in the layer of a complex nitride or a complex carbonitride in a case in which the supply amount of $Al(CH_3)_3$ is assumed to be 0 was obtained as the content ratio of inevitable C, and a value obtained by subtracting the content ratio of inevitable C from a content ratio (atomic ratio) of the C component contained in the layer of a complex nitride or a complex carbonitride obtained in a case in which $Al(CH_3)_3$ was intentionally supplied was obtained as $y_{avg}$.

Furthermore, crystal orientations of the individual crystal grains that formed the layer of a complex nitride or a complex carbonitride of Ti and Al and had cubic structures were analyzed in the vertical sectional direction by using an electron backscatter diffraction apparatus, and in a case in which there were misorientations of 5 degrees or greater between adjacent pixels, that parts were regarded as grain boundaries, a region surrounded by grain boundaries was regarded as one crystal grain, crystal grain misorientations were obtained between a certain pixel in a crystal grain and all the other pixels in the same crystal grain, and the crystal grain misorientations were mapped by dividing a range of 0 to 10 degrees into sections of each 1 degree, that is, a section of equal to or greater than 0 degrees and less than 1 degree, a section of equal to or greater than 1 degree and less than 2 degrees, a section of equal to or greater than 2 degrees and less than 3 degrees, a section of equal to or greater than 3 degrees and less than 4 degrees, and the like. The area ratio of the crystal grains with the average crystal grain misorientations of 2 degrees or greater with respect to the entire layer of a complex nitride or a complex carbonitride of Ti and Al was obtained from the mapping diagram. The results are shown in Tables 7 and 8.

Figure 3:
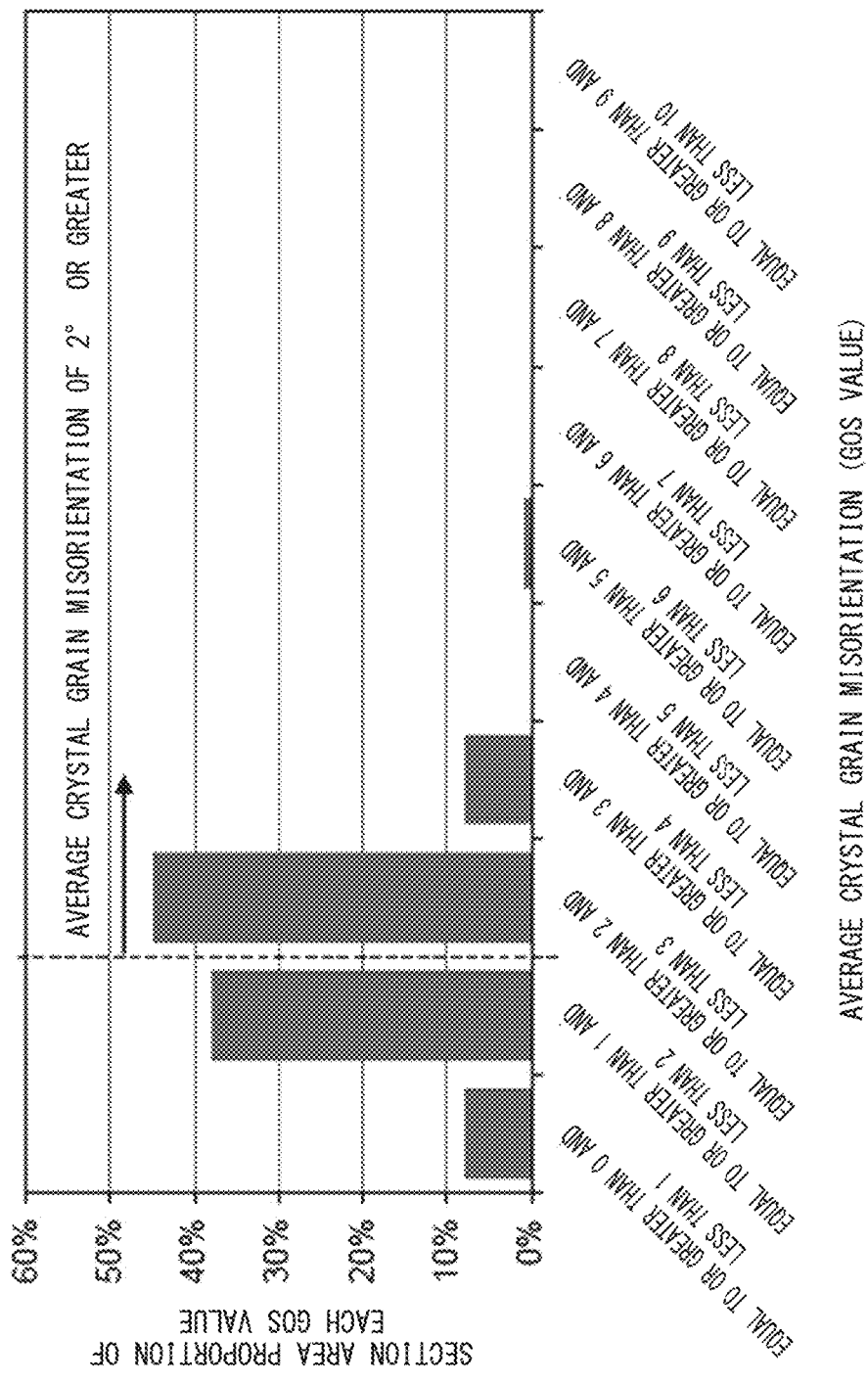
FIG. 3 shows an example of histogram regarding an area ratio of average crystal grain misorientations (GOS values) of the individual crystal grains that have cubic structures in a section of the layer of the complex nitride or the complex carbonitride of Ti and Al, which forms a hard coating layer in the coated tool according to the present invention. The dotted line in the vertical direction in the histogram represents a boundary at which the average crystal grain misorientation is 2°, and the bars on the right side of the dotted line in the vertical direction in FIG. 3 represent those with an average crystal grain misorientation of equal to or greater than 2°.
Figure 4:
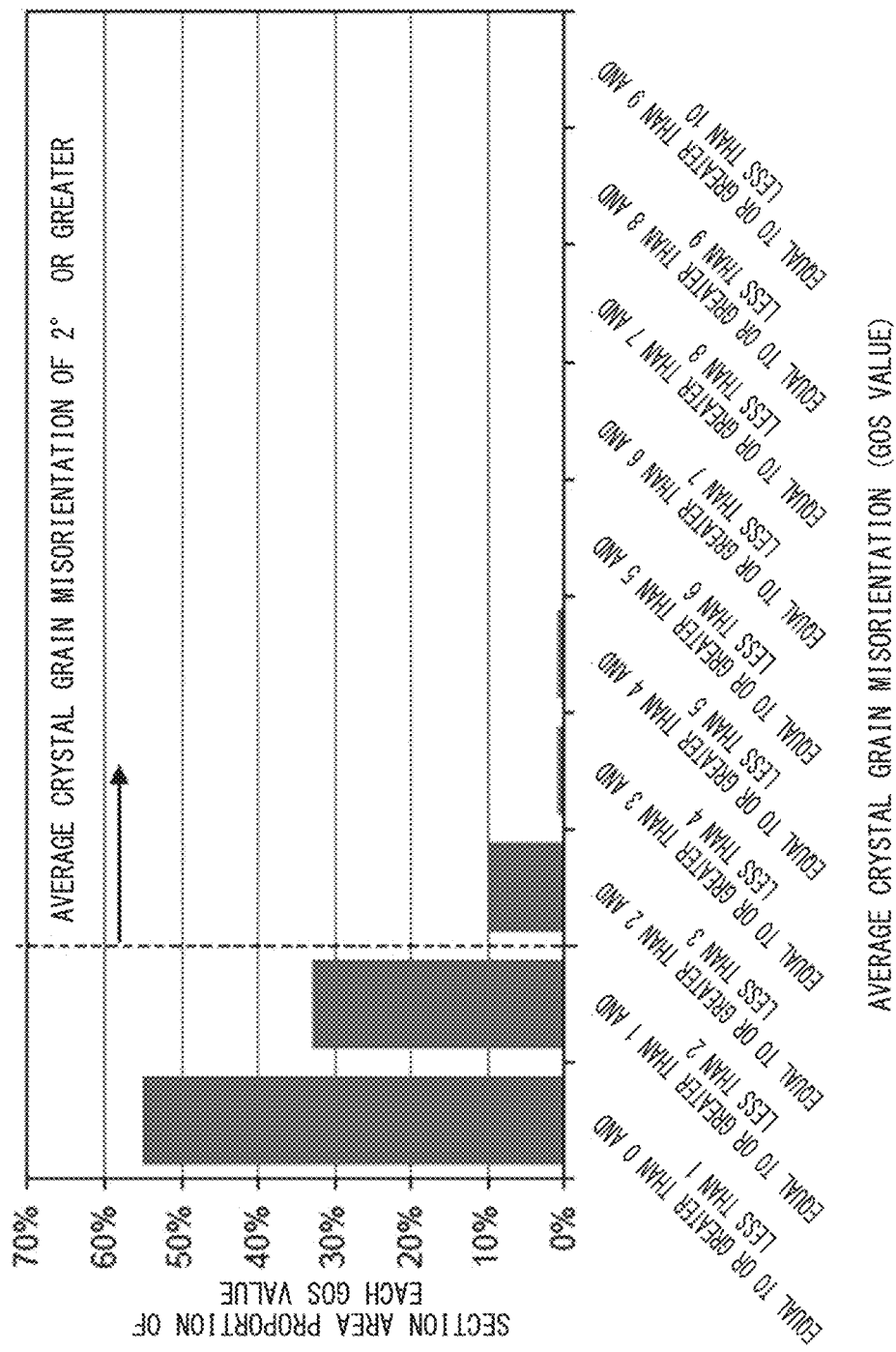
FIG. 4 shows an example of histogram regarding an area ratio of average crystal grain misorientations (GOS values) of the individual crystal grains that have cubic structures in a section of a layer of a complex nitride or a layer of a complex carbonitride of Ti and Al that forms a hard coating layer in a coated tool according to a comparative example. The dotted line in the vertical direction in the histogram represents a boundary at which the average crystal grain misorientation is 2°, and the bars on the right side of the dotted line in the vertical direction in FIG. 4 represent those with the average crystal grain misorientation of equal to or greater than 2°.

FIG. 3 shows an example of histogram of the average crystal grain misorientations (that is, GOS values) measured in the coated tool 8 according to the present invention, and FIG. 4 shows an example of histogram of the average crystal grain misorientations measured in the comparative coated tool 12.

In addition, for inclined angle frequency distribution of the hard coating layer, a section of the hard coating layer formed of the layer of complex carbonitride of Ti and Al that had cubic structures was placed in a body tube of a field emission-type scanning electron microscope in a state in which the section was polished, the polished surface as a surface was analyzed in a region on the side of the surface (boundary surface) of the tool body and a region on the side of the surface, which were obtained by equally dividing the polished surface as a surface into two regions in the layer thickness direction, the individual crystal grains that had cubic crystal grain lattice that was present within the measurement ranges were irradiated with electron beams at an acceleration voltage of 10 kV at an incident angle of 70 degrees with an irradiation current of 1 nA, within the measurement ranges of the region on the side of the tool body and the region on the side of the surface in the direction perpendicular to the tool body, and for the width of 10 μm for five fields of view at intervals of 0.1 μm/step in the horizontal direction of the tool body, inclined angles of normal lines of {111} planes, which were crystal planes of the crystal grains, with respect to a normal line of the surface of the tool body (a direction perpendicular to the surface of the tool body in the polished section) were measured by using an electron backscatter diffraction image apparatus, measured inclined angles within a range of 0 to 45 degrees from among the measured inclined angles were divided into sections at a pitch of 0.25 degrees on the basis of the measurement results, and frequencies at which the measured inclined angles were present in the respective sections were aggregated, thereby a ratio of frequencies at which the measured inclined angles were present within a range of 0 to 12 degrees being obtained. The results are shown in Tables 7 and 8.

Figure 5:
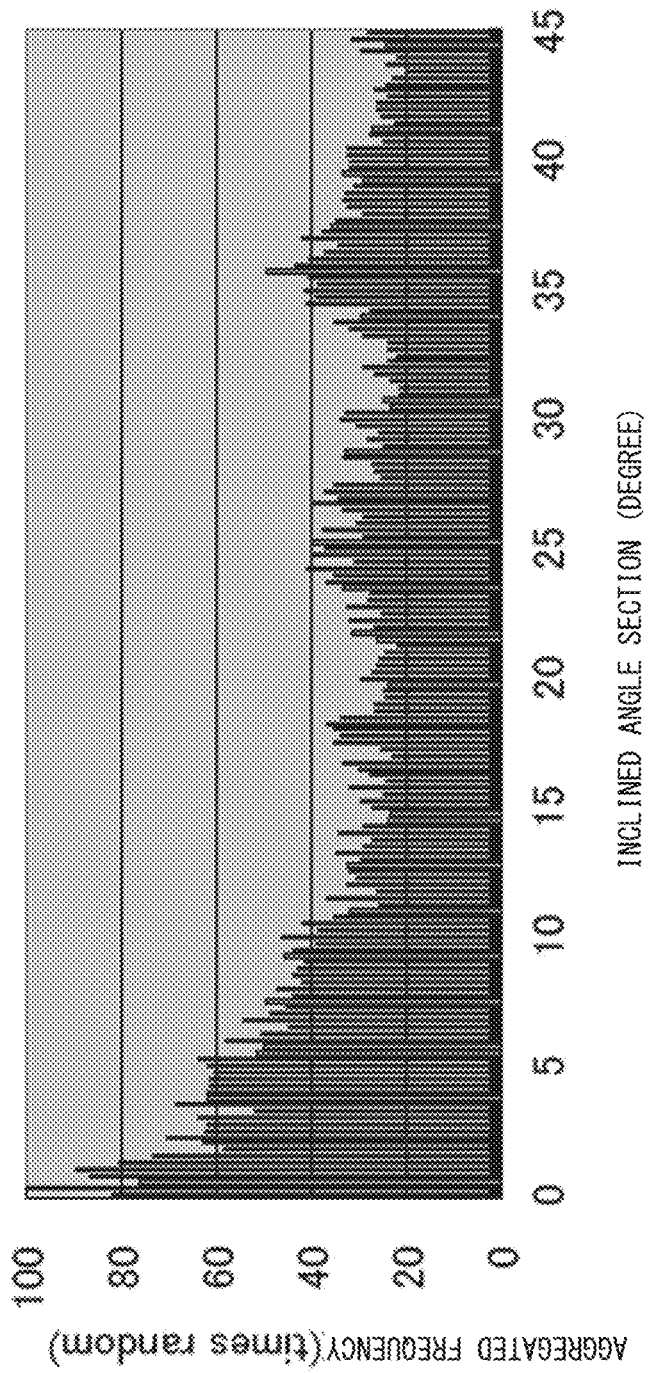
FIG. 5 shows an example of an inclined angle frequency distribution graph of a created {111} plane in a region on a side of a tool body of a layer of a complex nitride or a complex carbonitride of Ti and Al, which forms a hard coating layer in the coated tool according to the present invention. An aggregation frequency is represented by a relative value standardized on the assumption that the maximum aggregation frequency is 100.
Figure 6:
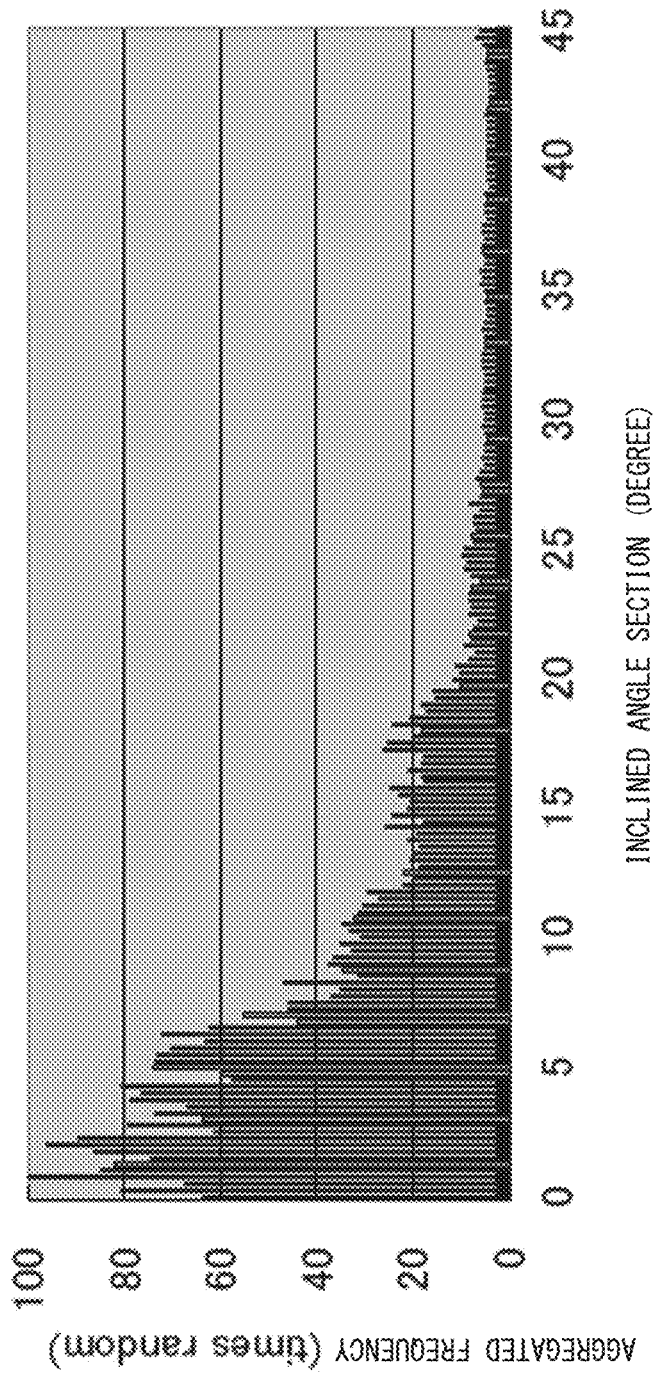
FIG. 6 shows an inclined angle frequency distribution graph of a created {111} plane in a region on a side of a surface of a layer of a complex nitride or a complex carbonitride of Ti and Al, which forms a hard coating layer in the coated tool according to the present invention. The aggregation frequency is represented by a relative value standardized on the assumption that the maximum aggregation frequency is 100.

FIG. 5 shows an example of the inclined angle frequency distribution measured in the region on the side of the tool body of the hard coating layer that is formed of the layer of complex carbonitride of Ti and Al of the coated tool according to the present invention, and FIG. 6 shows an example of the inclined angle frequency distribution measured in the region on the side of the surface of the hard coating layer that is formed of the layer of complex carbonitride of Ti and Al of the coated tool according to the present invention.

Further, analysis was performed at intervals of 0.1 μm in the vertical sectional direction by using an electron backscatter diffraction apparatus, measurement within a measurement range with a width of 10 μm and a vertical length of the film thickness in the vertical sectional direction was performed in five fields of view, the total number of pixels that belonged to the crystal grains that formed the layer of a complex nitride or a complex carbonitride and had cubic structures was obtained, and the area ratio of the crystal grains that had the layer of a complex nitride or a complex carbonitride and had the cubic structures was obtained from a ratio with respect to the total number of measured pixels in the measurement performed on the hard coating layer in the aforementioned five fields of view.

TABLE 1

| | | Mixing composition (% by mass) | | | | | |
|---|---|---|---|---|---|---|---|
| Type | | Co | TiC | TaC | NbC | $Cr_3C_2$ | WC |
| Tool body | A | 8.5 | 1.5 | — | 3.0 | 0.4 | Remainder |
| | B | 9.0 | — | 1.8 | 0.2 | — | Remainder |
| | C | 7.5 | — | — | — | — | Remainder |

TABLE 2

| | | Mixing composition (% by mass) | | | | | | |
|---|---|---|---|---|---|---|---|---|
| Type | | Co | Ni | ZrC | NbC | $Mo_2C$ | WC | TiCN |
| Tool body | D | 8 | 5 | 1 | 6 | 6 | 10 | Remainder |

TABLE 3

| Constituent layer of hard coating layer | | | Forming conditions (pressure of reaction atmosphere indicates kPa and temperature indicates ° C.)Forming conditions | | |
|---|---|---|---|---|---|
| Type | Formation symbol | Reaction gas composition (% by volume) | | Reaction atmosphere | |
| | | | | Pressure | Temperature |
| $(Ti_{1-X}Al_x)(C_YN_{1-Y})$ layer | TiAlCN | TiAlCN | See Table 4 | See Table 5 | See Table 5 |
| Ti component layer | TiC | TiC | $TiCl_4$: 4.2%, $CH_4$: 8.5%, $H_2$: remainder | 7 | 900 |
| | TiN | TiN-1 | $TiCl_4$: 4.2%, $N_2$: 30%, $H_2$: remainder | 30 | 850 |
| | | TiN-2 | $TiCl_4$: 4.2%, $N_g$: 35%, $H_2$: remainder | 50 | 900 |
| | l-TiCN | l-TiCN | $TiCl_4$: 2%, $CH_3CN$: 0.7%, $N_2$: 10%, $H_2$: remainder | 7 | 900 |
| | TiCN | TiCN | $TiCl_4$: 2%, $CH_4$: 1%, $N_2$: 15%, $H_2$: remainder | 13 | 900 |
| | TiCO | TiCO | $TiCl_4$: 4.2%, CO: 4%, $H_2$: remainder | 7 | 900 |
| | TiCNO | TiCNO | $TiCl_4$: 2%, CO: 1%, $CH_4$: 1%, $N_2$: 5%, $H_2$: remainder | 13 | 900 |
| $Al_2O_3$ layer | $Al_2O_3$ | $Al_2O_3$ | $AlCl_3$: 2.2%, $CO_2$: 5.5%, HCl: 2.2%, $H_2S$: 0.2%, $H_2$: remainder | 7 | 900 |

TABLE 4

| Formation of hard coating layer | | Forming conditions (Reaction gas composition is represented by ratios with respect to a total for the gas group A and the gas group B.) | | | | | | | |
|---|---|---|---|---|---|---|---|---|---|
| Process type | Formation symbol | Reaction gas group A composition (% by volume) | | | Reaction gas group B composition (% by volume) | | | | |
| Film forming process according to the present invention | A | $NH_3$: 1.5% | $N_2$: 2.0% | $H_2$: 55% | $AlCl_3$: 0.6% | $TiCl_4$: 0.2% | $N_2$: 12.5% | $Al(CH_3)_3$: 0% | $H_2$: remainder |
| | B | $NH_3$: 1.5% | $N_2$: 1.0% | $H_2$: 55% | $AlCl_3$: 0.7% | $TiCl_4$: 0.2% | $N_2$: 13% | $Al(CH_3)_3$: 0% | $H_2$: remainder |
| | C | $NH_3$: 1.0% | $N_2$: 1.0% | $H_2$: 60% | $AlCl_3$: 0.8% | $TiCl_4$: 0.3% | $N_2$: 14% | $Al(CH_3)_3$: 0% | $H_2$: remainder |
| | D | $NH_3$: 1.0% | $N_2$: 2.0% | $H_2$: 60% | $AlCl_3$: 0.6% | $TiCl_4$: 0.2% | $N_2$: 13.5% | $Al(CH_3)_3$: 0% | $H_2$: remainder |
| | E | $NH_3$: 1.0% | $N_2$: 1.0% | $H_2$: 60% | $AlCl_3$: 0.8% | $TiCl_4$: 0.3% | $N_2$: 13% | $Al(CH_3)_3$: 0% | $H_2$: remainder |
| | F | $NH_3$: 1.0% | $N_2$: 1.0% | $H_2$: 55% | $AlCl_3$: 0.6% | $TiCl_4$: 0.3% | $N_2$: 13.5% | $Al(CH_3)_3$: 0.4% | $H_2$: remainder |
| | G | $NH_3$: 1.5% | $N_2$: 1.0% | $H_2$: 55% | $AlCl_3$: 0.7% | $TiCl_4$: 0.3% | $N_2$: 14.5% | $Al(CH_3)_3$: 0.2% | $H_2$: remainder |
| | H | $NH_3$: 1.5% | $N_2$: 2.0% | $H_2$: 60% | $AlCl_3$: 0.7% | $TiCl_4$: 0.3% | $N_2$: 15% | $Al(CH_3)_3$: 0% | $H_2$: remainder |
| | I | $NH_3$: 1.0% | $N_2$: 1.0% | $H_2$: 55% | $AlCl_3$: 0.9% | $TiCl_4$: 0.3% | $N_2$: 14% | $Al(CH_3)_3$: 0.5% | $H_2$: remainder |
| | J | $NH_3$: 1.5% | $N_2$: 2.0% | $H_2$: 60% | $AlCl_3$: 0.9% | $TiCl_4$: 0.2% | $N_2$: 12.8% | $Al(CH_3)_3$: 0% | $H_2$: remainder |
| Comparative film forming process | A' | $NH_3$: 1.5% | $N_2$: 2.0% | $H_2$: 55% | $AlCl_3$: 0.6% | $TiCl_4$: 0.2% | $N_2$: 12.5% | $Al(CH_3)_3$: 0% | $H_2$: remainder |
| | B' | $NH_3$: 1.5% | $N_2$: 1.0% | $H_2$: 55% | $AlCl_3$: 0.7% | $TiCl_4$: 0.2% | $N_2$: 13% | $Al(CH_3)_3$: 0% | $H_2$: remainder |
| | C' | $NH_3$: 1.0% | $N_2$: 1.0% | $H_2$: 60% | $AlCl_3$: 0.8% | $TiCl_4$: 0.3% | $N_2$: 14% | $Al(CH_3)_3$: 0% | $H_2$: remainder |
| | D' | $NH_3$: 1.0% | $N_2$: 2.0% | $H_2$: 60% | $AlCl_3$: 0.8% | $TiCl_4$: 0.2% | $N_2$: 13.5% | $Al(CH_3)_3$: 0% | $H_2$: remainder |
| | E' | $NH_3$: 1.0% | $N_2$: 1.0% | $H_2$: 60% | $AlCl_3$: 0.8% | $TiCl_4$: 0.3% | $N_2$: 13% | $Al(CH_3)_3$: 0% | $H_2$: remainder |
| | F' | $NH_3$: 1.0% | $N_2$: 1.0% | $H_2$: 55% | $AlCl_3$: 0.6% | $TiCl_4$: 0.3% | $N_2$: 13.5% | $Al(CH_3)_3$: 0.4% | $H_2$: remainder |
| | G' | $NH_3$: 1.5% | $N_2$: 1.0% | $H_2$: 55% | $AlCl_3$: 0.7% | $TiCl_4$: 0.3% | $N_2$: 14.5% | $Al(CH_3)_3$: 0.2% | $H_2$: remainder |
| | H' | $NH_3$: 1.5% | $N_2$: 2.0% | $H_2$: 60% | $AlCl_3$: 0.7% | $TiCl_4$: 0.3% | $N_2$: 15% | $Al(CH_3)_3$: 0% | $H_2$: remainder |
| | I' | $NH_3$: 1.0% | $N_2$: 1.0% | $H_2$: 55% | $AlCl_3$: 0.9% | $TiCl_4$: 0.3% | $N_2$: 14% | $Al(CH_3)_3$: 0.5% | $H_2$: remainder |
| | J' | $NH_3$: 1.5% | $N_2$: 2.0% | $H_2$: 60% | $AlCl_3$: 0.9% | $TiCl_4$: 0.2% | $N_2$: 12.8% | $Al(CH_3)_3$: 0% | $H_2$: remainder |

TABLE 5

Forming conditions (pressure of reaction atmosphere indicates kPa and temperature indicates ° C.) Forming conditions

| Formation of hard coating layer | | Gas group A | | Gas group B | | Phase difference in supply between gas group A and gas group B | Reaction atmosphere | |
|---|---|---|---|---|---|---|---|---|
| Process type | Formation symbol | Supply cycle (seconds) | Supply time per cycle (seconds) | Supply cycle (seconds) | Supply time per cycle (seconds) | (seconds) | Pressure | Temperature |
| Film forming process according to the present invention | A | 5 | 0.2 | 5 | 0.2 | 0.15 | 4.7 | 800 |
| | B | 1 | 0.2 | 1 | 0.2 | 0.15 | 4.7 | 800 |
| | C | 2.5 | 0.2 | 2.5 | 0.2 | 0.1 | 4.7 | 750 |
| | D | 1.5 | 0.15 | 1.5 | 0.15 | 0.1 | 4.7 | 700 |
| | E | 4 | 0.2 | 4 | 0.2 | 0.1 | 5 | 850 |
| | F | 4.5 | 0.2 | 4.5 | 0.2 | 0.1 | 4.7 | 800 |
| | G | 2.5 | 0.2 | 2.5 | 0.2 | 0.15 | 4.5 | 800 |
| | H | 3 | 0.15 | 3 | 0.15 | 0.1 | 4.5 | 800 |
| | I | 2 | 0.25 | 2 | 0.25 | 0.15 | 5 | 700 |
| | J | 1.2 | 0.25 | 1.2 | 0.25 | 0.2 | 4.7 | 900 |
| Comparative film forming process | A' | — | — | — | — | — | 4.7 | 800 |
| | B' | — | — | — | — | — | 4.7 | 800 |
| | C' | — | — | — | — | — | 4.7 | 750 |
| | D' | — | — | — | — | — | 4.7 | 700 |
| | E' | — | — | — | — | — | 5 | 850 |
| | F' | — | — | — | — | — | 4.7 | 800 |
| | G' | — | — | — | — | — | 4.5 | 800 |
| | H' | — | — | — | — | — | 4.5 | 800 |
| | I' | — | — | — | — | — | 5 | 700 |
| | J' | — | — | — | — | — | 4.7 | 900 |

TABLE 6

| | | Hard coating layer (Numerical values in the lower sections represent target average layer thickness (μm) of the layer.) | | |
|---|---|---|---|---|
| | | Lower layer | | |
| Type | Tool body symbol | First layer | Second layer | Third layer |
| Coated tools of the present invention/ Comparative coated tools/ Reference coated tools | 1 | A | — | — | — |
| | 2 | B | — | — | — |
| | 3 | C | — | — | — |
| | 4 | D | — | — | — |
| | 5 | A | — | — | — |
| | 6 | B | TiC (0.5) | — | — |
| | 7 | C | TiN-1 (0.3) | — | — |
| | 8 | D | TiN-1 (0.5) | 1-TiCN (4) | — |
| | 9 | A | TiN-1 (0.3) | 1-TiCN (2) | TiCN (0.7) |
| | 10 | B | — | — | — |
| | 11 | C | TiN-1 (0.5) | — | — |
| | 12 | D | TiC (1) | — | — |
| | 13 | A | TiN-1 (0.1) | — | — |
| | 14 | B | — | — | — |
| | 15 | C | — | — | — |

TABLE 7

Hard coating layer
TiAl complex carbide, carbonitride layer $(Ti_{1-x}Al_x)(C_yN_{1-y})$

| Type | | Tool body symbol | Formation symbol of process of forming TiAlCN film (See Tables 4 and 5) | Content ratio $x_{avg}$ of Al | Content ratio of $y_{avg}$ of C | Area ratio of crystal grains having average crystal grain misorientation equal to or greater than 2 degrees (%) | Area ratio of cubic crystal (%) | Average crystal grain width w of crystal grains (μm) | Average aspect ratio A of crystal grains |
|---|---|---|---|---|---|---|---|---|---|
| Coated tools according to the present invention | 1 | A | A | 0.78 | 0.0001 or less | 51 | 100 | 0.7 | 2.0 |
| | 2 | B | B | 0.93 | 0.0001 or less | 46 | 100 | 0.8 | 5.0 |
| | 3 | C | C | 0.75 | 0.0001 or less | 41 | 94 | 0.8 | 2.2 |
| | 4 | D | D | 0.73 | 0.0001 or less | 30 | 100 | 0.4 | 10.0 |
| | 5 | A | E | 0.67 | 0.0001 or less | 41 | 100 | 1.1 | 1.5 |
| | 6 | B | F | 0.89 | 0.0038 | 20 | 100 | 0.2 | 3.2 |
| | 7 | C | G | 0.81 | 0.0041 | 63 | 100 | 0.3 | 2.3 |
| | 8 | D | H | 0.80 | 0.0001 or less | 54 | 100 | 0.1 | 2.3 |
| | 9 | A | I | 0.95 | 0.0022 | 37 | 65 | 0.1 | 3.1 |
| | 10 | B | J | 0.93 | 0.0001 or less | 35 | 70 | 0.60 | 2.6 |
| | 11 | C | A | 0.74 | 0.0001 or less | 53 | 98 | 1.1 | 3.5 |
| | 12 | D | B | 0.92 | 0.0001 or less | 47 | 100 | 0.9 | 4.7 |
| | 13 | A | C | 0.72 | 0.0001 or less | 36 | 93 | 0.7 | 1.8 |
| | 14 | B | D | 0.71 | 0.0001 or less | 30 | 98 | 0.4 | 9.5 |
| | 15 | C | E | 0.68 | 0.0001 or less | 42 | 100 | 0.8 | 1.4 |

Hard coating layer
TiAl complex carbide, carbonitride layer $(Ti_{1-x}Al_x)(C_yN_{1-y})$

| Type | | Distribution ratio of frequencies at which inclined angles of normal lines of {111} planes are present in a range of 0 to 12 degrees in the region on the side of the tool body $M_{deg}$ | Distribution ratio of frequencies at which inclined angles of normal lines of {111} planes are present in a range of 0 to 12 degrees in the region on the side of the surface $N_{deg}$ | Inclined angle section in which the highest peak is observed in the region on the side of the surface (degrees) | Target layer thickness (μm) | Upper layer (Numerical values in the lower sections represent target average layer thickness (μm) of the layers.) | |
|---|---|---|---|---|---|---|---|
| | | | | | | First layer | Second layer |
| Coated tools according to the present invention | 1 | 29 | 59 | 4.75 to 5.00 | 4 | — | — |
| | 2 | 15 | 30 | 5.25 to 5.50 | 5 | — | — |
| | 3 | 16 | 39 | 11.75 to 12.00 | 3.5 | — | — |
| | 4 | 10 | 38 | 8.00 to 8.25 | 7 | — | — |
| | 5 | 32 | 51 | 2.75 to 3.00 | 6 | — | — |
| | 6 | 21 | 40 | 4.00 to 4.25 | 2 | — | — |
| | 7 | 27 | 45 | 4.50 to 4.75 | 6 | — | — |
| | 8 | 40 | 70 | 3.75 to 4.00 | 4 | — | — |
| | 9 | 35 | 61 | 2.00 to 2.25 | 8 | — | — |
| | 10 | 26 | 48 | 3.00 to 3.25 | 4.5 | $Al_2O_3$ (2.5) | — |
| | 11 | 28 | 58 | 4.25 to 4.50 | 5 | TiCN (0.5) | $Al_2O_3$ (3) |
| | 12 | 17 | 35 | 4.25 to 4.50 | 6 | TiCO (1) | $Al_2O_3$ (2) |
| | 13 | 12 | 38 | 9.00 to 9.25 | 2.5 | TiCNO (0.3) | $Al_2O_3$ (1) |
| | 14 | 14 | 42 | 7.25 to 7.50 | 5 | — | — |
| | 15 | 34 | 56 | 4.50 to 4.75 | 3 | — | — |

TABLE 8

| | | | Hard coating layer TiAl complex carbide, carbonitride layer $(Ti_{1-x}Al_x)(C_yN_{1-y})$ | | | | | |
|---|---|---|---|---|---|---|---|---|
| Type | | Tool body symbol | Formation symbol of process of forming TiAlCN (See Tables 4 and 5) | Content ratio $x_{avg}$ of Al | Content ratio of $y_{avg}$ of C | Area ratio of crystal grains having average crystal grain misorientation equal to or greater than 2 degrees (%) | Area ratio of cubic crystal grains (%) | Average crystal grain width w of crystal grains (μm) | Average aspect ratio A of crystal grains |
| Comparative Coated tool | 1 | A | A' | 0.67 | 0.0001 or less | 5 | 93 | 0.6 | 1.5 |
| | 2 | B | B' | 0.91 | 0.0001 or less | 7 | 100 | 0.7 | 4.5 |
| | 3 | C | C' | 0.72 | 0.0001 or less | 6 | 94 | 0.5 | 1.5 |
| | 4 | D | D' | 0.69 | 0.0001 or less | 12 | 100 | 0.4 | 2.1 |
| | 5 | A | E' | 0.66 | 0.0001 or less | 4 | 100 | 0.9 | 2.5 |
| | 6 | B | F' | 0.84 | 0.0023 | 8 | 96 | 0.2 | 3.1 |
| | 7 | C | G' | 0.78 | 0.0033 | 4 | 100 | 1.0 | 1.8 |
| | 8 | D | H' | 0.62 | 0.0001 or less | 5 | 100 | 0.4 | 0.8 |
| | 9 | A | I' | 0.92 | 0.0041 | 6 | 71 | 0.2 | 1.2 |
| | 10 | B | J' | 0.94 | 0.0001 or less | 5 | 73 | 0.40 | 1.5 |
| | 11 | C | A' | 0.69 | 0.0001 or less | 4 | 95 | 0.8 | 3.2 |
| | 12 | D | B' | 0.90 | 0.0001 or less | 8 | 100 | 0.8 | 4.2 |
| | 13 | A | C' | 0.69 | 0.0001 or less | 4 | 95 | 0.8 | 1.3 |
| Reference coated tool | 14 | B | AIP | 0.50 | 0.0001 or less | 15 | 100 | 1.5 | 3.3 |
| | 15 | C | AIP | 0.59 | 0.0001 or less | 14 | 100 | 0.6 | 2.2 |

| | | Hard coating layer TiAl complex carbide, carbonitride layer $(Ti_{1-x}Al_x)(C_yN_{1-y})$ | | | | Upper layer (Numerical values in the lower sections represent target average layer thickness (μm) of the layers.) | |
|---|---|---|---|---|---|---|---|
| Type | | Distribution ratio of frequencies at which inclined angles of normal lines of {111} planes are present in a range of 0 to 12 degrees in the region on the side of the tool body $M_{deg}$ | Distribution ratio of frequencies at which inclined angles of normal lines of {111} planes are present in a range of 0 to 12 degrees in the region on the side of the surface $N_{deg}$ | Inclined angle section in which the highest peak is observed in the region on the side of the surface (degrees) | Target layer thickness (μm) | First layer | Second layer |
| Comparative Coated tool | 1 | 33 | 37 | 14.25 to 14.50 | 4 | — | — |
| | 2 | 25 | 31 | 32.00 to 32.25 | 5 | — | — |
| | 3 | 19 | 23 | 28.25 to 28.50 | 3.5 | — | — |
| | 4 | 24 | 19 | 26.75 to 27.00 | 7 | — | — |
| | 5 | 34 | 43 | 14.50 to 14.75 | 6 | — | — |
| | 6 | 27 | 22 | 32.75 to 33.00 | 2 | — | — |
| | 7 | 21 | 24 | 24.25 to 24.50 | 6 | — | — |
| | 8 | 24 | 28 | 23.25 to 24.50 | 4 | — | — |
| | 9 | 34 | 28 | 16.25 to 16.50 | 8 | — | — |
| | 10 | 22 | 17 | 41.50 to 41.75 | 4.5 | Al$_2$O$_3$ (2.5) | — |
| | 11 | 31 | 41 | 31.25 to 31.50 | 5 | TiCN (0.5) | Al$_2$O$_3$ (3) |
| | 12 | 26 | 32 | 31.25 to 31.50 | 6 | TiCO (1) | Al$_2$O$_3$ (2) |
| | 13 | 21 | 23 | 32.25 to 32.50 | 2.5 | TiCNO (0.3) | Al$_2$O$_3$ (1) |
| Reference coated tool | 14 | 25 | 31 | 31.25 to 31.50 | 5 | — | — |
| | 15 | 19 | 24 | 32.25 to 32.50 | 3 | — | — |

(Note)
"AIP" indicates a film formed through arc ion plating.

Next, all the aforementioned variety of coated tools, namely coated tools 1 to 15 according to the present invention, Comparative coated tools 1 to 13, and Reference coated tools 14 and 15 were subjected to the following dry high-speed intermittent cutting test and a center cutting machining test, which are types of high-speed intermittent cutting of alloy steel, in a state in which the coated tools were clamped with fixing jigs at tip ends of cutters made of tool steel with a cutter diameter of 125 mm, and wear width of a flank faces at all the cutting edges were measured. The results are shown in Table 9.

Tool body: tungsten-carbide-based cemented carbide, titanium-carbonitride-based cermet Cutting test: dry high-speed face milling, center cutting machining Work material: block material of JIS-SCM440 with a width of 100 mm and a length of 400 mm Rotation speed: 892 min$^{-1}$
Cutting speed: 350 m/min
Depth of cut: 2.5 mm
Feed rate per tooth: 0.25 mm/tooth
Cutting time: 8 minutes

TABLE 9

| Type | | Wear width of a flank face (mm) | Type | | Results of cutting test (minutes) |
|---|---|---|---|---|---|
| Coated tools according to the present invention | 1 | 0.07 | Comparative coated tools | 1 | 2.2* |
| | 2 | 0.08 | | 2 | 3.5* |
| | 3 | 0.09 | | 3 | 2.1* |
| | 4 | 0.11 | | 4 | 4.0* |
| | 5 | 0.12 | | 5 | 4.6* |
| | 6 | 0.09 | | 6 | 3.9* |
| | 7 | 0.07 | | 7 | 3.4* |
| | 8 | 0.10 | | 8 | 2.3* |
| | 9 | 0.14 | | 9 | 1.8* |
| | 10 | 0.10 | | 10 | 1.9* |
| | 11 | 0.09 | | 11 | 4.6* |
| | 12 | 0.08 | | 12 | 4.2* |
| | 13 | 0.13 | | 13 | 2.3* |
| | 14 | 0.11 | Reference coated tools | 14 | 4.4* |
| | 15 | 0.12 | | 15 | 4.2* |

The * marks in the sections of the comparative coated tools and the reference coated tools denote cutting times (minutes) at which the life end was reached due to the occurrence of chipping.

Example 2

WC powder, TiC powder, TaC powder, NbC powder, $Cr_3C_2$ powder, TiN powder, and Co powder with average grain sizes of 1 to 3 μm were prepared as raw material powder, the raw material powder was mixed together in the mixing compositions shown in Table 10, wax was further added thereto, the mixture was mixed with acetone in a ball mill for 24 hours, was dried in a reduced pressure, and was press-molded into a green compact with a predetermined shape under a pressure of 98 MPa, the green compact is vacuum-sintered under conditions in which it was held in vacuum of 5 Pa at a predetermined temperature within a range of 1370 to 1470° C. for 1 hour, and after the sintering, tool bodies α to γ made of WC-based cemented carbide with an insert shape of ISO standard CNMG120412 were respectively manufactured by performing honing machining at R: 0.07 mm on cutting edge portions.

TiCN (mass ratio TiC/TiN=50/50) powder, NbC powder, WC powder, Co powder, and Ni powder with average grain sizes of 0.5 to 2 μm were prepared as raw material powder, the raw material powder was mixed together in the mixing compositions shown in Table 11, the mixture was wet mixed in a ball mill for 24 hours, was dried, and was press-molded into a green compact under a pressure of 98 MPa, the green compact is sintered under conditions in which it was held in nitrogen atmosphere at 1.3 kPa at a temperature of 1500° C. for 1 hour, and after the sintering, a tool body δ made of TiCN-based cermet with an insert shape of ISO standard CNMG120412 was manufactured by performing honing machining at R: 0.09 mm on a cutting edge portion.

Next, coated tools 16 to 30 according to the present invention shown in Table 13 were manufactured by using a chemical vapor deposition apparatus on the surfaces of these tool bodies α to γ and the tool body δ to deposit hard coating layers with target layer thicknesses, which included at least $(Ti_{1-x}Al_x)(C_yN_{1-y})$, under the conditions shown in Tables 4 and 5 by a method similar to that in Example 1.

Note that the lower layers shown in Table 12 and/or the upper layers shown in Table 13 were formed for coated tools 19 to 28 according to the present invention under the forming conditions shown in Table 3.

In addition, for the purpose of comparison, Comparative coated tools 16 to 28 shown in Table 14 were manufactured by using a chemical vapor deposition apparatus on the surfaces of these tool bodies α to γ and the tool body δ to deposit hard coating layers with target layer thicknesses shown in Table 14 under the conditions shown in Tables 4 and 5 by a method similar to that for the coated tools according to the present invention.

Note that the lower layers shown in Table 12 and/or the upper layers shown in Table 14 were formed for Comparative coated tools 19 to 28 under the forming conditions shown in Table 3 in a manner similar to that for coated tools 19 to 28 according to the present invention.

For reference, Reference coated tools 29 and 30 shown in Table 14 were manufactured by depositing $(Ti_{1-x}Al_x)$ $(C_yN_{1-y})$ layers in the reference examples with target layer thicknesses on the surfaces of the tool body β and the tool body γ by arc ion plating using a physical vapor deposition apparatus in the related art.

Note that conditions similar to the conditions shown in Example 1 were used as conditions for the arc ion plating.

In addition, a scanning electron microscope (magnification: 5000 times) was used to measure sections of the respective constituent layers of coated tools 16 to 30 according to the present invention, Comparative coated tools 16 to 28, and Reference coated tools 29 and 30, and layer thicknesses at five points in an observation field of view were measured and averaged to obtain average layer thicknesses. All the layers had average layer thicknesses that were substantially the same as the target layer thicknesses shown in Tables 12 to 14.

Furthermore, crystal orientations of the individual crystal grains that formed the layer of a complex nitride or a complex carbonitride of Ti and Al and had cubic structures were analyzed in the vertical sectional direction by using an electron backscatter diffraction apparatus, and crystal grain misorientations were mapped by dividing a range of 0 to 10 degrees into sections of each 1 degree, that is, a section of equal to or greater than 0 degrees and less than 1 degree, a section of equal to or greater than 1 degree and less than 2 degrees, a section of equal to or greater than 2 degrees and less than 3 degrees, a section of equal to or greater than 3 degrees and less than 4 degrees, and the like. Average crystal grain misorientations and an area ratio of the crystal grains with the average crystal grain misorientations of 2 degrees or greater with respect to the entire layer of a complex nitride or a complex carbonitride of Ti and Al were obtained from the mapping diagram. The results are shown in Tables 13 and 14.

In addition, for inclined angle frequency distribution of the hard coating layer, a section of the hard coating layer formed of the layer of complex carbonitride of Ti and Al that had cubic structures was placed in a body tube of a field emission-type scanning electron microscope in a state in which the section was polished, the polished surface as a surface was analyzed in a region on the side of the surface (boundary surface) of the tool body and a region on the side of the surface, which were obtained by equally dividing the polished surface as a surface into two regions in the layer thickness direction, the individual crystal grains that had cubic crystal grain lattice that was present within measurement ranges in the region on the side of the tool body and in the region on the side of the surface were irradiated with electron beams at an acceleration voltage of 10 kV at an incident angle of 70 degrees with an irradiation current of 1 nA, inclined angles of normal lines of {111} planes, which were crystal planes of the crystal grains, with respect to a normal line of the surface of the tool body (a direction perpendicular to the surface of the tool body in the polished section) were measured for the width of 10 μm for five fields of view at intervals of 0.1 μm/step in the horizontal direction of the tool body by using an electron backscatter diffraction image apparatus, measured inclined angles within a range of 0 to 45 degrees from among the measured inclined angles were divided into sections at a pitch of 0.25 degrees on the basis of the measurement results, and frequencies at which the measured inclined angles were present in the respective sections were aggregated, thereby a ratio of frequencies at which the measured inclined angles were present within a range of 0 to 12 degrees being obtained. The results are shown in Tables 13 and 14.

TABLE 10

| Type | | Co | TiC | ZrC | TaC | NbC | $Cr_3C_2$ | TiN | WC |
|---|---|---|---|---|---|---|---|---|---|
| Tool body | α | 7.0 | — | 1.5 | — | 2.9 | 0.1 | 1.5 | Remainder |
| | β | 8.1 | 2.6 | — | 4.0 | 0.5 | — | 1.1 | Remainder |
| | γ | 6.5 | — | — | — | — | — | — | Remainder |

TABLE 11

| Type | | Co | Ni | NbC | WC | TiCN |
|---|---|---|---|---|---|---|
| Tool body | δ | 11 | 4 | 6 | 15 | Remainder |

TABLE 12

| Type | Tool body symbol | First layer | Second layer | Third layer | Fourth layer |
|---|---|---|---|---|---|
| Coated tools according to the present invention/Comparative coated tools/Reference coated tools | 16 α | — | — | — | — |
| | 17 β | — | — | — | — |
| | 18 γ | — | — | — | — |
| | 19 δ | TiC (0.5) | — | — | — |
| | 20 α | TiN-1 (0.1) | — | — | — |
| | 21 β | TiN-1 (0.5) | 1-TiCN (7) | — | — |
| | 22 γ | TiN-1 (0.3) | 1-TiCN (10) | TiN-2 (0.7) | — |
| | 23 δ | TiN-1 (0.3) | 1-TiCN (4) | TiCN (0.4) | TiN-2 (0.3) |
| | 24 α | — | — | — | — |
| | 25 β | TiN-1 (0.5) | — | — | — |
| | 26 γ | TiC (1) | — | — | — |
| | 27 δ | TiN-1 (0.1) | — | — | — |
| | 28 α | TiN-1 (0.1) | — | — | — |
| | 29 β | — | — | — | — |
| | 30 γ | — | — | — | — |

Hard coating layer (The numerical values in the lower sections represent target average layer thicknesses (μm) of the layers.) Lower layer

TABLE 13

Hard coating layer TiAl complex carbide, carbonitride layer $(Ti_{1-x}Al_x)(C_yN_{1-y})$

| Type | | Tool body symbol | Formation symbol of process of forming TiAlCN (See Tables 4 and 5) | Content ratio $x_{avg}$ of Al | Content ratio of $y_{avg}$ of C | Area ratio of crystal grains having average crystal grain misorientation equal to or greater than 2 degrees (%) | Area ratio of cubic crystal grains (%) | Average crystal grain width W of crystal grains (μm) | Average aspect ratio A of crystal grains |
|---|---|---|---|---|---|---|---|---|---|
| Coated tools according to the present invention | 16 | α | A | 0.71 | 0.0001 or less | 56 | 90 | 1.3 | 5.0 |
| | 17 | β | B | 0.94 | 0.0001 or less | 45 | 100 | 0.4 | 3.0 |
| | 18 | γ | C | 0.69 | 0.0001 or less | 39 | 93 | 0.9 | 3.2 |
| | 19 | δ | D | 0.78 | 0.0001 or less | 48 | 98 | 0.5 | 2.2 |
| | 20 | α | E | 0.69 | 0.0001 or less | 45 | 100 | 0.8 | 4.5 |
| | 21 | β | F | 0.83 | 0.0038 | 55 | 95 | 0.7 | 2.1 |
| | 22 | γ | G | 0.76 | 0.0023 | 33 | 100 | 2.0 | 3.1 |
| | 23 | δ | H | 0.63 | 0.0001 or less | 32 | 100 | 1.1 | 2.0 |
| | 24 | α | I | 0.93 | 0.0031 | 22 | 63 | 0.4 | 5.1 |
| | 25 | β | J | 0.92 | 0.0001 or less | 39 | 68 | 0.8 | 2.2 |
| | 26 | γ | A | 0.72 | 0.0001 or less | 58 | 93 | 0.8 | 7.0 |
| | 27 | δ | B | 0.93 | 0.0001 or less | 43 | 100 | 0.2 | 2.5 |
| | 28 | α | C | 0.69 | 0.0001 or less | 39 | 92 | 1.1 | 3.5 |

TABLE 13-continued

| | | | | | | | | |
|---|---|---|---|---|---|---|---|---|
| 29 | β | D | 0.81 | 0.0001 or less | 48 | 100 | 0.6 | 2.5 |
| 30 | γ | E | 0.68 | 0.0001 or less | 51 | 100 | 0.6 | 2.0 |

| | | Hard coating layer | | | | | | | |
|---|---|---|---|---|---|---|---|---|---|
| | | TiAl complex carbide, carbonitride layer $(Ti_{1-x}Al_x)(C_yN_{1-y})$ | | | | | | | |
| | | Distribution ratio of frequencies at which inclined angles of normal lines of {111} planes are present in a range of 0 to 12 degrees in the region on the side of the tool body $M_{deg}$ | Distribution ratio of frequencies at which inclined angles of normal lines of {111} planes are present in a range of 0 to 12 degrees in the region on the side of the surface $N_{deg}$ | Inclined angle section in which the highest peak is observed in the region on the side of the surface (degrees) | Target layer thickness (μm) | Upper layer (Numerical values in the lower sections represent target average layer thickness (μm) of the layer.) | | | |
| | Type | | | | | First layer | Second layer | Third layer | Fourth layer |
| Coated tools according to the present invention | 16 | 15 | 30 | 5.25 to 5.50 | 12 | — | — | — | — |
| | 17 | 21 | 40 | 3.00 to 3.25 | 6 | — | — | — | — |
| | 18 | 24 | 44 | 2.50 to 2.75 | 7 | — | — | — | — |
| | 19 | 34 | 53 | 4.25 to 4.50 | 20 | — | — | — | — |
| | 20 | 1 | 41 | 3.50 to 3.75 | 16 | — | — | — | — |
| | 21 | 29 | 56 | 2.75 to 3.00 | 3 | — | — | — | — |
| | 22 | 17 | 29 | 4.50 to 4.75 | 8 | TiN-2 (0.7) | — | — | — |
| | 23 | 35 | 59 | 4.75 to 5.00 | 4 | TiCN (0.4) | TiN-2 (0.3) | — | — |
| | 24 | 37 | 52 | 6.00 to 6.55 | 7 | $Al_2O_3$ (2) | — | — | — |
| | 25 | 16 | 39 | 10.00 to 10.25 | 15 | TiCN (0.5) | $Al_2O_3$ (2.5) | — | — |
| | 26 | 15 | 30 | 4.75 to 5.00 | 16 | TiCO (1) | $Al_2O_3$ (2) | — | — |
| | 27 | 21 | 42 | 3.25 to 3.50 | 4 | TiCNO (0.3) | $Al_2O_3$ (1) | — | — |
| | 28 | 25 | 47 | 3.50 to 3.75 | 9 | TiN-2 (0.3) | TiCN (0.8) | TiCNO (0.3) | $Al_2O_3$ (3) |
| | 29 | 32 | 49 | 4.75 to 5.00 | 11 | — | — | — | — |
| | 30 | 26 | 47 | 2.75 to 3.00 | 5 | — | — | — | — |

TABLE 14

| | | | Hard coating layer TiAl complex carbide, carbonitride layer $(Ti_{1-x}Al_x)(C_yN_{1-y})$ | | | | | |
|---|---|---|---|---|---|---|---|---|
| Type | | Tool body symbol | Formation symbol of process of forming TiAlCN (See Tables 4 and 5) | Content ratio $x_{avg}$ of Al | Content ratio of $y_{avg}$ of C | Area ratio of crystal grains having average crystal grain misorientation equal to or greater than 2 degrees (%) | Area ratio of cubic crystal (%) | Average crystal grain width w of crystal grains (μm) |
| Comparative coated tools | 16 | α | A' | 0.68 | 0.0001 or less | 6 | 97 | 0.8 |
| | 17 | β | B' | 0.93 | 0.0001 or less | 9 | 100 | 1.1 |
| | 18 | γ | C' | 0.70 | 0.0001 or less | 5 | 98 | 0.4 |
| | 19 | δ | D' | 0.75 | 0.0001 or less | 6 | 95 | 0.4 |
| | 20 | α | E' | 0.67 | 0.0001 or less | 7 | 100 | 0.8 |
| | 21 | β | F' | 0.84 | 0.0045 | 10 | 94 | 0.4 |
| | 22 | γ | G' | 0.79 | 0.0028 | 5 | 100 | 1.0 |
| | 23 | δ | H' | 0.60 | 0.0001 or less | 6 | 100 | 0.7 |
| | 24 | α | I' | 0.91 | 0.0029 | 1 | 75 | 1.0 |
| | 25 | β | J' | 0.91 | 0.0001 or less | 4 | 66 | 0.2 |
| | 26 | γ | A' | 0.66 | 0.0001 or less | 5 | 95 | 0.2 |

TABLE 14-continued

|  |  |  |  |  |  |  |  |  |
|---|---|---|---|---|---|---|---|---|
|  | 27 | δ | B' | 0.92 | 0.0001 or less | 6 | 100 | 0.9 |
|  | 28 | α | C' | 0.70 | 0.0001 or less | 8 | 96 | 0.7 |
| Reference coated tool | 29 | β | AIP | 0.49 | 0.0001 or less | 13 | 100 | 1.4 |
|  | 30 | γ | AIP | 0.60 | 0.0001 or less | 16 | 100 | 0.6 |

| | | | Hard coating layer | | | | | | |
|---|---|---|---|---|---|---|---|---|---|
| | | | TiAl complex carbide, carbonitride layer $(Ti_{1-x}Al_x)(C_yN_{1-y})$ | | | | | | |
| Type | | Average aspect ratio A of crystal grains | Distribution ratio of frequencies at which inclined angles of normal lines of {111} planes are present in a range of 0 to 12 degrees in the region on the side of the tool body $M_{deg}$ | Distribution ratio of frequencies at which inclined angles of normal lines of {111} planes are present in a range of 0 to 12 degrees in the region on the side of the surface $N_{deg}$ | Inclined angle section in which the highest peak is observed in the region on the side of the surface (degrees) | Target layer thickness (μm) | TiAl complex carbide, carbonitride layer $(Ti_{1-x}Al_x)(C_yN_{1-y})$ | | | |
| | | | | | | | First layer | Second layer | Third layer | Fourth layer |
| Comparative coated tools | 16 | 5.2 | 27 | 29 | 33.75 to 34.00 | 12 | — | — | — | — |
| | 17 | 2.7 | 34 | 43 | 14.50 to 14.75 | 6 | — | — | — | — |
| | 18 | 0.8 | 15 | 18 | 33.25 to 33.50 | 7 | — | — | — | — |
| | 19 | 1.5 | 22 | 17 | 41.50 to 41.75 | 20 | — | — | — | — |
| | 20 | 5.2 | 19 | 23 | 28.25 to 28.50 | 16 | — | — | — | — |
| | 21 | 2.1 | 24 | 19 | 26.75 to 27.00 | 3 | — | — | — | — |
| | 22 | 3.0 | 21 | 24 | 34.25 to 34.50 | 8 | TiN-2 (0.7) | — | — | — |
| | 23 | 5.0 | 25 | 1 | 32.00 to 32.25 | 4 | TiCN (0.4) | TiN-2 (0.5) | — | — |
| | 24 | 1.6 | 26 | 22 | 15.25 to 15.50 | 7 | $Al_2O_3$ (2) | — | — | — |
| | 25 | 1.2 | 34 | 28 | 36.25 to 36.50 | 15 | TiCN (0.5) | $Al_2O_3$ (2.5) | — | — |
| | 26 | 5.5 | 1 | 34 | 32.75 to 33.00 | 16 | TiCO (1) | $Al_2O_3$ (2) | — | — |
| | 27 | 2.5 | 33 | 41 | 16.50 to 16.75 | 4 | TiCNO (0.3) | $Al_2O_3$ (1) | — | — |
| | 28 | 1.2 | 19 | 18 | 31.50 to 31.75 | 9 | TiN-2 (0.3) | TiCN (0.8) | TiCNO (0.3) | $Al_2O_3$ (3) |
| Reference coated tool | 29 | 1 | 24 | 32 | 29.25 to 29.50 | 11 | — | — | — | — |
| | 30 | 2.1 | 18 | 26 | 31.25 to 31.50 | 5 | — | — | — | — |

(Note)
"AIP" indicates a film formed through arc ion plating.

Next, all the aforementioned variety of coated tools, namely coated tools 16 to 30 according to the present invention, Comparative coated tools 16 to 28, and Reference coated tools 29 and 30 were subjected to the following dry high-speed intermittent cutting test of carbon steel and a wet high-speed intermittent cutting test of ductile cast iron in a state in which the coated tools were screw-fixed with fixing jigs at tip ends of cutting tools made of tool steel, and wear width of a flank faces at all the cutting edges were measured.
Cutting condition 1:
Work material: round bar of JIS•S45C with four longitudinal grooves at an equal interval in a length direction
Cutting speed: 330 m/min
Depth of cut: 2.0 mm
Feed: 0.3 mm/rev
Cutting time: 5 minutes
(The ordinary cutting speed is 220 m/min)
Cutting condition 2:
Work material: round bar of JIS•FCD700 with four longitudinal grooves at an equal interval in a length direction
Cutting speed: 280 m/min
Depth of cut: 2.0 mm
Feed: 0.3 mm/rev
Cutting time: 5 minutes
(The ordinary cutting speed is 200 m/min)
Table 15 shows results of the cutting test.

TABLE 15

| Type | | Wear width of a flank face (mm) | | Type | | Result of cutting test (minutes) | |
|---|---|---|---|---|---|---|---|
| | | Cutting condition 1 | Cutting condition 2 | | | Cutting condition 1 | Cutting condition 2 |
| Coated tools according to the present invention | 16 | 0.21 | 0.21 | Comparative coated tools | 16 | 4.3* | 2.5* |
| | 17 | 0.21 | 0.22 | | 17 | 4.7* | 4.3* |
| | 18 | 0.16 | 0.10 | | 18 | 2.2* | 2.4* |
| | 19 | 0.14 | 0.14 | | 19 | 2.3* | 2.3* |
| | 20 | 0.22 | 0.22 | | 20 | 3.8* | 3.9* |
| | 21 | 0.10 | 0.11 | | 21 | 4.3* | 2.8* |
| | 22 | 0.22 | 0.23 | | 22 | 4.8* | 4.2* |
| | 23 | 0.18 | 0.13 | | 23 | 4.3* | 4.2* |
| | 24 | 0.23 | 0.24 | | 24 | 2.9* | 1.9* |
| | 25 | 0.22 | 0.23 | | 25 | 2.2* | 1.7* |
| | 26 | 0.20 | 0.19 | | 26 | 3.6* | 4.4* |
| | 27 | 0.19 | 0.17 | | 27 | 4.8* | 3.8* |
| | 28 | 0.19 | 0.16 | | 28 | 3.1* | 2.3* |
| | 29 | 0.13 | 0.14 | Reference coated tools | 29 | 4.3* | 2.5* |
| | 30 | 0.20 | 0.20 | | 30 | 3.4* | 3.6* |

The * marks in the sections of the comparative coated tools and the reference coated tools denote cutting times (minutes) at which the life end was reached due to the occurrence of chipping.

From the results shown in Tables 9 and 15, hardness is improved due to strain of the crystal grains, and toughness is improved while high wear resistance is maintained in the coated tools according to the present invention, by the predetermined average crystal grain misorientations being present in the crystal grains which have cubic structures which form the layer of a complex nitride or a complex carbonitride of Al and Ti that forms the hard coating layer, and by the inclined angles of the normal lines of the {111} planes having the predetermined inclined angle frequency distribution in the region on the side of the tool body and in the region on the side of the surface of the crystal grains. Further, it is obvious that excellent chipping resistance and fracture resistance are achieved even in a case in which the coated tools are used in a high-speed intermittent cutting in which an intermittent and impact, high load exerts on cutting edges, and as a result, excellent wear resistance is exhibited in use over a long period of time.

In contrast, it is obvious that Comparative coated tools 1 to 13 and 16 to 28 and Reference coated tools 14, 15, 29, and 30 in which the predetermined average crystal grain misorientations are not present in the crystal grains which have cubic structures which form the layer of a complex nitride or a complex carbonitrides of Al and Ti that forms the hard coating layers or in which the inclined angles of the normal lines of the {111} planes do not have the predetermined inclined angle frequency distribution in the region on the side of the tool body and in the region on the side of the surface of the crystal grains end the lifes thereof in short periods of time due to the occurrence of chipping, fracture, and the like in a case in which the coated tools are used in the high-speed intermittent cutting, which is accompanied with high heat generation, in which an intermittent and impact, high load exerts on the cutting edges.

Example 3

WC powder, TiC powder, TaC powder, NbC powder, $Cr_3C_2$ powder, and Co powder with average grain sizes of 1 to 3 μm were prepared as raw material powder, the raw material powder was mixed together in the mixing compositions shown in Table 16, wax was further added thereto, the mixture was mixed with acetone in a ball mill for 24 hours, was dried in a reduced pressure, and was press-molded into a green compact with a predetermined shape under a pressure of 98 MPa, the green compact is vacuum-sintered under conditions in which it was held in vacuum of 5 Pa at a predetermined temperature within a range of 1370 to 1470° C. for 1 hour, and after the sintering, tool bodies E to G made of WC-based cemented carbide with an insert shape of ISO standard SEEN1203AFSN were respectively manufactured.

TiCN (mass ratio TiC/TiN=50/50) powder, $Mo_2C$ powder, ZrC powder, NbC powder, WC powder, Co powder, and Ni powder with average grain sizes of 0.5 to 2 μm were prepared as raw material powder, the raw material powder was mixed together in the mixing compositions shown in Table 17, the mixture was wet mixed in a ball mill for 24 hours, was dried, and was press-molded into a green compact under a pressure of 98 MPa, the green compact is sintered under conditions in which it was held in nitrogen atmosphere at 1.3 kPa at a temperature of 1500° C. for 1 hour, and after the sintering, a tool body H made of TiCN-based cermet with an insert shape of ISO standard SEEN1203AFSN was manufactured.

Next, a thermal CVD method was performed for on the surfaces of the tool bodies E to H for a predetermined time by using a chemical vapor deposition apparatus under the forming conditions shown in Tables 19 and 20, that is, by using the gas group A consisting of $NH_3$, $N_2$, and $H_2$, the gas group B consisting of $TiCl_4$, $Al(CH_3)_3$, $AlCl_3$, $MeCl_n$ (where any of $SiCl_4$, $ZrCl_4$, $BCl_3$, $VCl_4$, and $CrCl_2$), $N_2$, and $H_2$, and the gas supply method of setting the reaction gas composition (% by volume with respect to the total of the gas group A and the gas group B) to $NH_3$: 1.0 to 1.5%, $N_2$: 1.0 to 2.0%, and $H_2$: 55 to 60% as the gas group A, $AlCl_3$: 0.6 to 0.9%, $TiCl_4$: 0.2 to 0.3%, $Al(CH_3)_3$: 0 to 0.5%, $MeCl_n$ (where any of $SiCl_4$, $ZrCl_4$, $BCl_3$, $VCl_4$, and $CrCl_2$): 0.1 to 0.2%, $N_2$: 12.5 to 15.0%, and $H_2$: the remaining amount as the gas group B, for example, under conditions of a reaction atmosphere pressure: 4.5 to 5.0 kPa, a reaction atmosphere temperature: 700 to 900° C., a supply cycle: 1 to 5 seconds, a gas supply time per cycle: 0.15 to 0.25 seconds, and a supply phase difference between the gas group A and the gas group B: 0.10 to 0.20 seconds, and the hard coating layers, in which the crystal grains which have cubic structures with the average crystal grain misorientations of 2 degrees or greater as shown in Table 22 were present at the area ratios shown in Table 22, which were made of $(Ti_{1-x-y}Al_xMe_y)$ $(C_zN_{1-z})$ layers with the target layer thicknesses shown in Table 22, thereby coated tools 31 to 45 according to the present invention were manufactured.

Note that the lower layers shown in Table 21 and/or the upper layers shown in Table 22 were formed for coated tools 36 to 43 according to the present invention under the forming conditions shown in Table 18.

In addition, for the purpose of comparison, hard coating layers that contained at least layer of a complex nitride or a complex carbonitrides of Ti and Al with the target layer thicknesses (μm) shown in Table 23 were deposited on the surfaces of the tool bodies E to H under the conditions shown in Tables 19 and 20 in a manner similar to that for coated tools 31 to 45 according to the present invention. At this time, Comparative coated tools 31 to 45 were manufactured by forming the hard coating layers such that the reaction gas composition on the surface of the tool bodies did not temporarily change in a process of forming the $(Ti_{1-\alpha-\beta}Al_\alpha Me_\beta)(C_\gamma N_{1-\gamma})$ layers.

Note that the lower layers shown in Table 21 and/or the upper layers shown in Table 23 were formed for Comparative coated tools 36 to 43 under the forming conditions shown in Table 18 in a manner similar to that for coated tools 36 to 43 according to the present invention.

In addition, a scanning electron microscope (magnification: 5000 times) was used to measure sections in a direction perpendicular to the tool bodies of the respective constituent layers of coated tools 31 to 45 according to the present invention and Comparative coated tools 31 to 45, and layer thicknesses at five points in an observation field of view were measured and averaged to obtain average layer thicknesses. All the layers had average layer thicknesses that were substantially the same as the target layer thicknesses shown in Tables 21 to 23.

In addition, for the average content ratio of Al and an average content ratio of Me in the layer of a complex nitride or a complex carbonitride, the average content ratio $\alpha_{avg}$ of Al and the average content ratio $\beta_{avg}$ of Me were obtained from averages of obtained analysis results of characteristic X-rays at ten points by irradiating polished surface as a surfaces of the samples with electron beams from the side of the surfaces of the samples by using an electron microanalyzer (EPMA). The average content ratio $\gamma_{avg}$ of C was obtained by secondary ion mass analysis (SIMS). The ranges of 70 μm×70 μm from the side of the surfaces of the samples were irradiated with ion beams, and concentrations of the components discharged by a sputtering effect were measured in a depth direction. The average content ratio $\gamma_{avg}$ of C represents an average value in the depth direction of the layer of a complex nitride or a complex carbonitride of Ti, Al, and Me. However, the content ratio of C excludes the content ratio of inevitable C contained even when gas containing C is intentionally not used as a gas raw material. Specifically, the content ratio (atomic ratio) of the C component contained in the layer of a complex nitride or a complex carbonitride in a case in which the supply amount of $Al(CH_3)_3$ is assumed to be 0 was obtained as the content ratio of inevitable C, and a value obtained by subtracting the content ratio of inevitable C from a content ratio (atomic ratio) of the C component contained in the layer of a complex nitride or a complex carbonitride obtained in a case in which $Al(CH_3)_3$ was intentionally supplied was obtained as $\gamma_{avg}$. The results thereof are shown in Tables 22 and 23.

Furthermore, crystal orientations of the individual crystal grains that formed the layer of a complex nitride or a complex carbonitride of Ti, Al, and Me and had cubic structures were analyzed in the vertical sectional direction by using an electron backscatter diffraction apparatus, and in a case in which there were misorientations of 5 degrees or greater between adjacent pixels, the parts were regarded as grain boundaries, a region surrounded by grain boundaries was regarded as one crystal grain, crystal grain misorientations were obtained between a certain pixel in a crystal grain and all the other pixels in the same crystal grain, and the crystal grain misorientations were mapped by dividing a range of 0 to 10 degrees into sections of each 1 degree, that is, a section of equal to or greater than 0 degrees and less than 1 degree, a section of equal to or greater than 1 degree and less than 2 degrees, a section of equal to or greater than 2 degrees and less than 3 degrees, a section of equal to or greater than 3 degrees and less than 4 degrees, and the like. The area ratio of the crystal grains with the average crystal grain misorientations of 2 degrees or greater with respect to the entire layer of a complex nitride or a complex carbonitride of Ti, Al, and Me was obtained from the mapping diagram. The results are shown in Tables 22 and 23.

Figure 7:
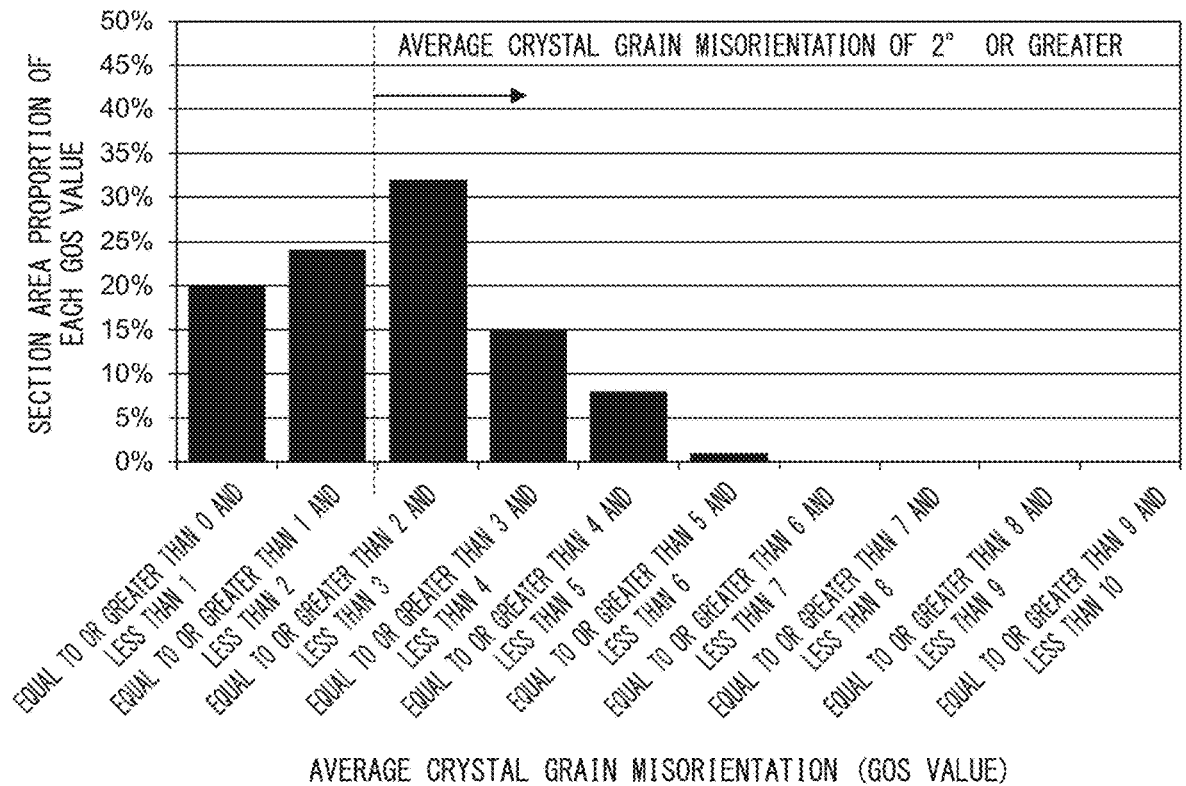
FIG. 7 shows an example of histogram regarding an area ratio of average crystal grain misorientations (GOS values) of the individual crystal grains that have cubic structures in a section of a layer of a complex nitride or a layer of a complex carbonitride of Ti, Al, and Me, which forms a hard coating layer in the coated tool according to the present invention. The dotted line in the vertical direction in the histogram represents a boundary at which the average crystal grain misorientation is 2°, and the bars on the right side of the dotted line in the vertical direction in FIG. 7 represent those with the average crystal grain misorientation of equal to or greater than 2°.
Figure 8:
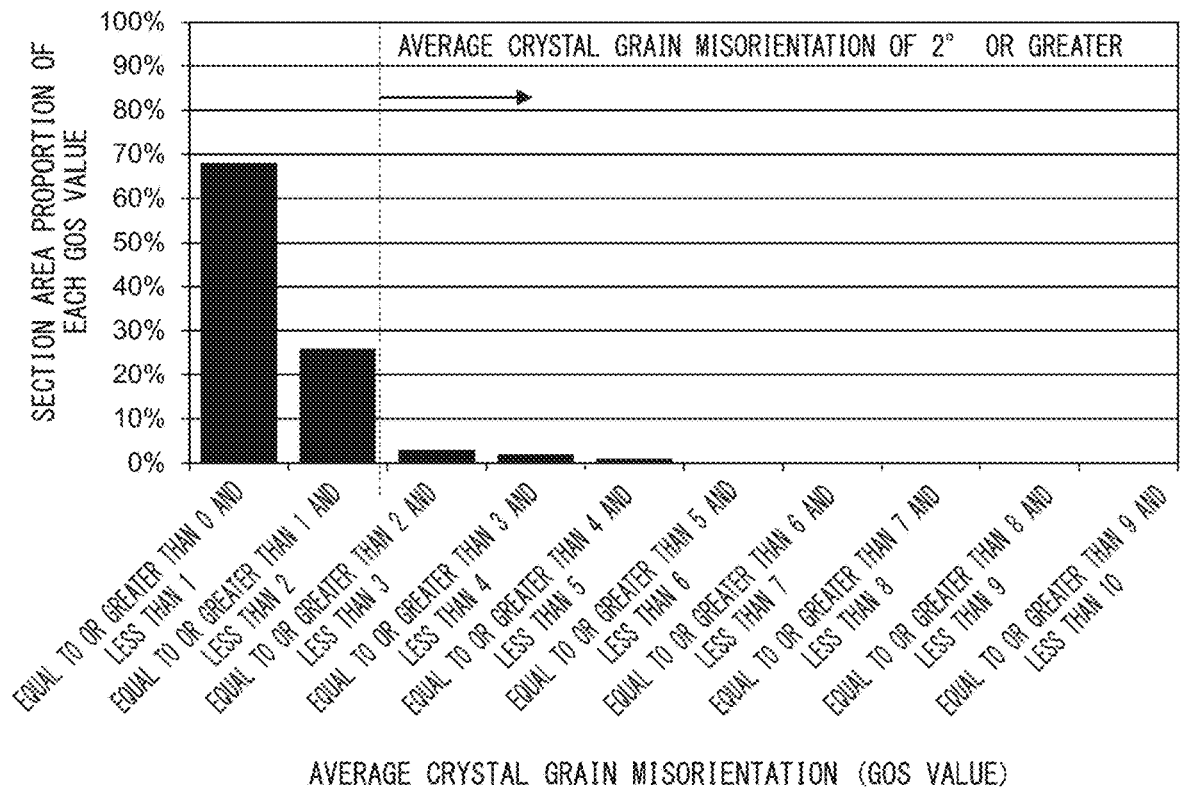
FIG. 8 shows an example of histogram regarding an area ratio of average crystal grain misorientations (GOS values) of the individual crystal grains that have cubic structures in a section of a layer of a complex nitride or a layer of a complex carbonitride of Ti, Al and Me, which forms a hard coating layer in a coated tool according to a comparative example. The dotted line in the vertical direction in the histogram represents a boundary at which the average crystal grain misorientation is 2°, and the bars on the right side of the dotted line in the vertical direction in FIG. 8 represent those with the average crystal grain misorientation of equal to or greater than 2°.

FIG. 7 shows an example of histogram of the average crystal grain misorientations measured in the coated tool according to the present invention, and FIG. 8 shows an example of histogram of the average crystal grain misorientations measured in the comparative coated tool.

In addition, for inclined angle frequency distribution of the hard coating layer, a section of the hard coating layer formed of the layer of complex carbonitride of Ti, Al, and Me that had cubic structures was placed in a body tube of a field emission-type scanning electron microscope in a state in which the section was polished, the polished surface as a surface was analyzed in a region on the side of the surface of the tool body (tool body) and a region on the side of the surface, which were obtained by equally dividing the polished surface as a surface into two regions in the layer thickness direction, the individual crystal grains that had cubic crystal grain lattice that was present within the measurement ranges were irradiated with electron beams at an acceleration voltage of 10 kV at an incident angle of 70 degrees with an irradiation current of 1 nA, within the measurement ranges of the region on the side of the boundary surface and the region on the side of the surface in the direction perpendicular to the tool body, and for the width of 10 μm for five fields of view at intervals of 0.1 μm/step in the horizontal direction of the tool body, inclined angles of normal lines of {111} planes, which were crystal planes of the crystal grains, with respect to a normal line of the surface of the tool body (a direction perpendicular to the surface of the tool body in the polished section) were measured by using an electron backscatter diffraction image apparatus, measured inclined angles within a range of 0 to 45 degrees from among the measured inclined angles were divided into sections at a pitch of 0.25 degrees on the basis of the measurement results, and frequencies at which the measured inclined angles were present in the respective sections were aggregated, thereby ratio $M_{deg}$ and $N_{deg}$ of frequencies at which the measured inclined angles were present within an angular range in which the highest peak was present in inclined angle sections in the region on the side of the surface and within a range of 0 to 12 degrees were obtained. The results are shown in Tables 22 and 23.

Figure 9:
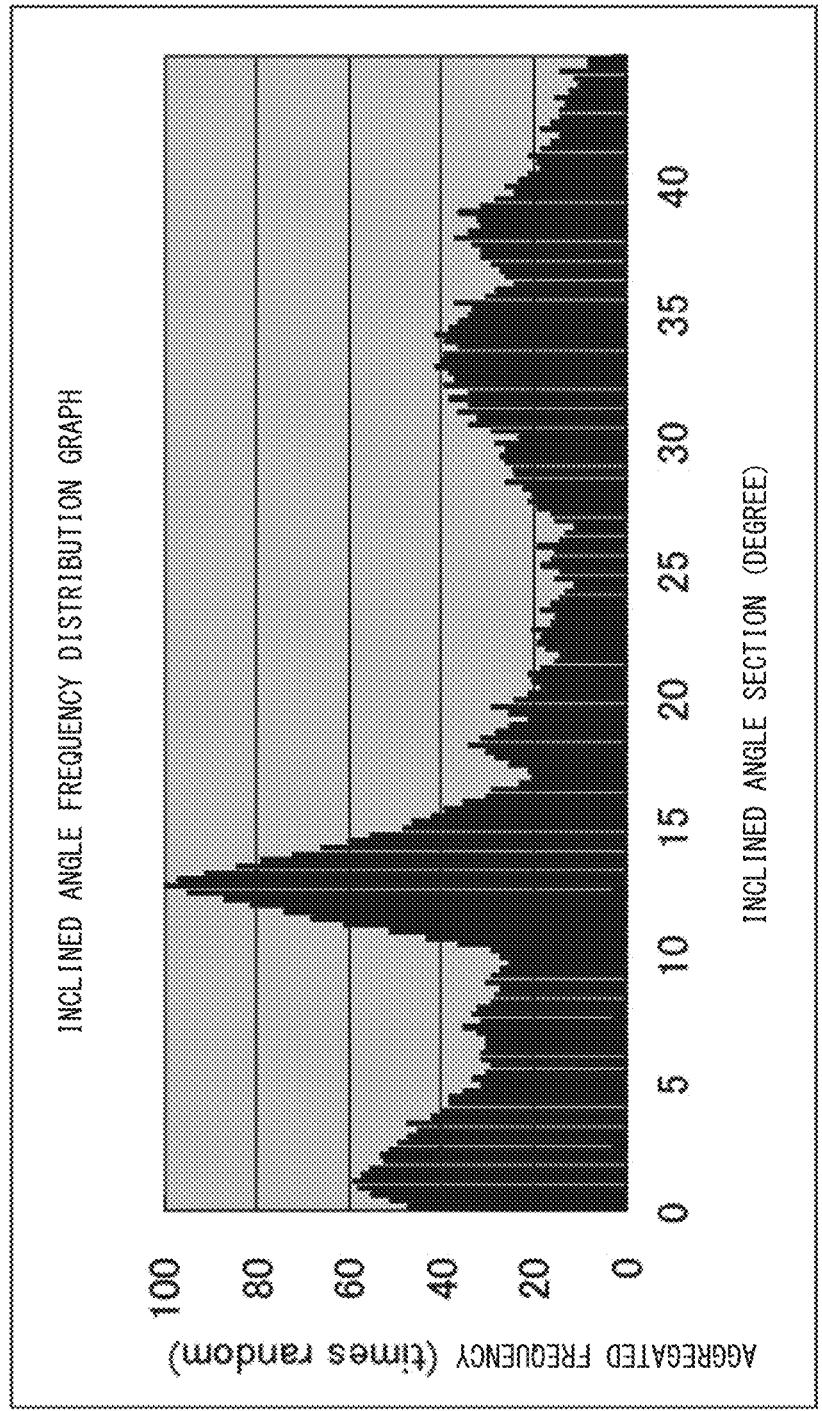
FIG. 9 shows an example of an inclined angle frequency distribution graph of a created {111} plane in a region on a side of a tool body of a layer of a complex nitride or a complex carbonitride of Ti and Al, which forms a hard coating layer in the coated tool according to the present invention. The aggregation frequency is represented by a relative value standardized on the assumption that the maximum aggregation frequency is 100.
Figure 10:
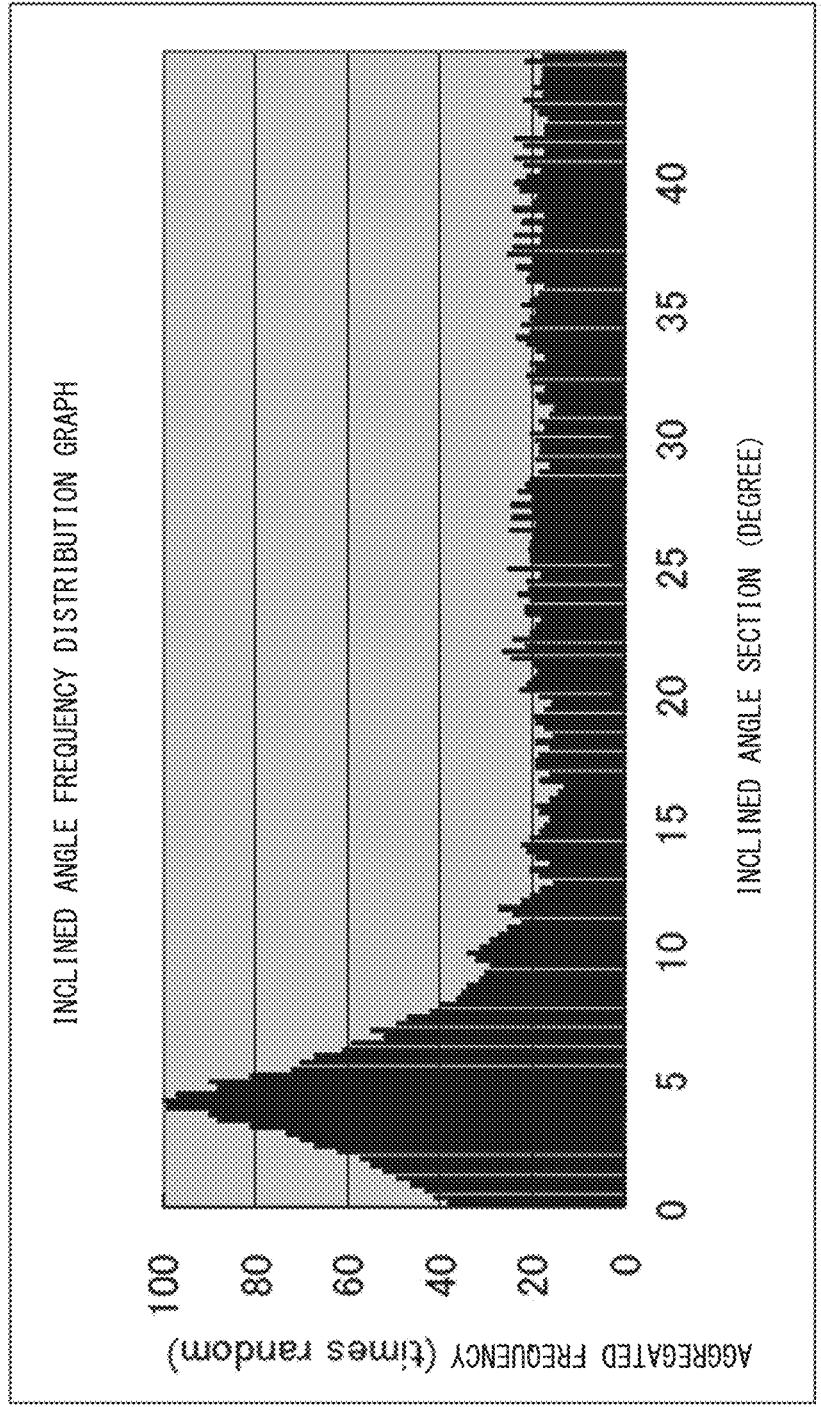
FIG. 10 shows an example of an inclined angle frequency distribution graph of a created {111} plane in a region on a side of a surface of a layer of a complex nitride or a complex carbonitride of Ti, Al, and Me, which forms a hard coating layer in the coated tool according to the present invention. The aggregation frequency is represented by a relative value standardized on the assumption that the maximum aggregation frequency is 100.

FIG. 9 shows an example of the inclined angle frequency distribution measured in the region on the side of the tool body of the hard coating layer that is formed of the layer of a complex nitride or a complex carbonitride of Ti, Al, and Me of the coated tool according to the present invention, and FIG. 10 shows an example of the inclined angle frequency distribution measured in the region on the side of the surface of the hard coating layer that is formed of the layer of a complex nitride or a complex carbonitride of Ti, Al, and Me of the coated tool according to the present invention.

Further, analysis was performed at intervals of 0.1 μm in the vertical sectional direction by using an electron back-scatter diffraction apparatus, measurement within a measurement range with a width of 10 μm and a vertical length of the film thickness in the vertical sectional direction was performed in five fields of view, the total number of pixels that belonged to the crystal grains which had cubic structures that formed the layer of a complex nitride or a complex carbonitride was obtained, and the area ratio of the crystal grains which had cubic structures that had the layer of a complex nitride or a complex carbonitride was obtained from a ratio with respect to the total number of measured pixels in the measurement performed on the hard coating layer in the aforementioned five fields of view. The results are shown in Tables 22 and 23.

Further, the individual crystal grains in the $(Ti_{1-x-y}Al_xMe_y)(C_zN_{1-z})$ layers that were present within a range at the length of 10 μm in the horizontal direction of the surface of the tool bodies and that formed the layer of a complex nitride or a complex carbonitrides of Ti, Al, and Me in coated tools 31 to 45 according to the present invention and Comparative coated tools 31 to 45 were observed from the side of the film sections perpendicular to the surfaces of the tool bodies by using a scanning electron microscope (magnitude of 5000 times or 20000 times) in the section direction perpendicular to the tool bodies, the crystal grain widths w in the direction parallel to the surfaces of the bodies and the crystal grain lengths l in the direction perpendicular to the surfaces of the bodies were measured, aspect ratios a (=l/w) of the respective crystal grains were calculated, an average value of the aspect ratios a obtained for the individual crystal grains was calculated as an average aspect ratio A, and an average value of the crystal grain widths w obtained for the individual crystal grains was calculated as an average crystal grain width W. The results are shown in Tables 22 and 23.

TABLE 16

| Type | | Mixing composition (% by mass) | | | | |
|---|---|---|---|---|---|---|
| | | Co | TiC | TaC | NbC | $Cr_3C_2$ | WC |
| Tool body | E | 8.0 | 1.5 | — | 3.0 | 0.4 | Remainder |
| | F | 8.5 | — | 1.8 | 0.2 | — | Remainder |
| | G | 7.0 | — | — | — | — | Remainder |

TABLE 17

| Type | | Mixing composition (% by mass) | | | | | | |
|---|---|---|---|---|---|---|---|---|
| | | Co | Ni | ZrC | NbC | $Mo_2C$ | WC | TiCN |
| Tool body | H | 8 | 5 | 1 | 6 | 6 | 10 | Remainder |

TABLE 18

| Constituent layer of hard coating layer | | | Forming conditions (pressure of reaction atmosphere indicates kPa and temperature indicates ° C.)Forming conditions | | |
|---|---|---|---|---|---|
| | Formation | | | Reaction atmosphere | |
| Type | symbol | | Reaction gas composition (% by volume) | Pressure | Temperature |
| $(Ti_{1-\alpha-\beta}Al_\alpha Me_\beta)(C_\gamma N_{1-\gamma})$ layer | | | See Tables 19 and 20 | | |
| Ti compound layer | TiC | TiC | $TiCl_4$: 2%, $CH_4$: 10%, $H_2$: remainder | 7 | 850 |
| | TiN | TiN | $TiCl_4$: 4.2%, $N_2$: 30%, $H_2$: remainder | 30 | 780 |
| | TiCN | TiCN | $TiCl_4$: 2%, $CH_3CN$: 0.7%, $N_2$: 10%, $H_2$: remainder | 7 | 780 |
| | TiCO | TiCO | $TiCl_4$: 4.2%, CO: 4%, $H_2$: remainder | 7 | 850 |
| | TiCNO | TiCNO | $TiCl_4$: 2%, $CH_3CN$: 0.7%, $N_2$: 10%, $CO_2$: 0.3%, $H_2$: remainder | 13 | 780 |
| $Al_2O_3$ layer | $Al_2O_3$ | $Al_2O_3$ | $AlCl_3$: 2.2%, $CO_2$: 5.5%, HCl: 2.2%, $H_2S$: 0.8%, $H_2$: remainder | 7 | 800 |

TABLE 19

| Formation of hard coating layer | | Forming conditions (reaction gas composition is represented as ratio with respect to a total for the gas group A and the gas group B.) | | | | | | | |
|---|---|---|---|---|---|---|---|---|---|
| Process type | Formation symbol | Reaction gas group A composition (% by volume) | | | Reaction gas group B composition (% by volume) | | | | |
| Film forming process according to the present invention | Si-A | $NH_3$: 1.4% | $N_2$: 1.3% | $H_2$: 58% | $AlCl_3$: 0.7% | $TiCl_4$: 0.3% | $SiCl_4$: 0.1% | $N_2$: 13.0% | $Al(CH_3)_3$: 0.5% | $H_2$: remainder |
| | Si-B | $NH_3$: 1.0% | $N_2$: 1.7% | $H_2$: 55% | $AlCl_3$: 0.8% | $TiCl_4$: 0.2% | $SiCl_4$: 0.1% | $N_2$: 14.5% | $Al(CH_3)_3$: 0% | $H_2$: remainder |
| | Si-C | $NH_3$: 1.3% | $N_2$: 1.5% | $H_2$: 60% | $AlCl_3$: 0.9% | $TiCl_4$: 0.3% | $SiCl_4$: 0.2% | $N_2$: 12.5% | $Al(CH_3)_3$: 0% | $H_2$: remainder |
| | Zr-A | $NH_3$: 1.2% | $N_2$: 1.8% | $H_2$: 56% | $AlCl_3$: 0.8% | $TiCl_4$: 0.2% | $ZrCl_4$: 0.2% | $N_2$: 14.0% | $Al(CH_3)_3$: 0% | $H_2$: remainder |
| | Zr-B | $NH_3$: 1.5% | $N_2$: 1.0% | $H_2$: 57% | $AlCl_3$: 0.9% | $TiCl_4$: 0.2% | $ZrCl_4$: 0.1% | $N_2$: 13.0% | $Al(CH_3)_3$: 0% | $H_2$: remainder |
| | Zr-C | $NH_3$: 1.3% | $N_2$: 1.9% | $H_2$: 55% | $AlCl_3$: 0.6% | $TiCl_4$: 0.3% | $ZrCl_4$: 0.1% | $N_2$: 15.0% | $Al(CH_3)_3$: 0.2% | $H_2$: remainder |
| | B-A | $NH_3$: 1.1% | $N_2$: 1.6% | $H_2$: 59% | $AlCl_3$: 0.7% | $TiCl_4$: 0.2% | $BCl_3$: 0.1% | $N_2$: 13.5% | $Al(CH_3)_3$: 0% | $H_2$: remainder |
| | B-B | $NH_3$: 1.3% | $N_2$: 2.0% | $H_2$: 57% | $AlCl_3$: 0.8% | $TiCl_4$: 0.2% | $BCl_3$: 0.2% | $N_2$: 14.0% | $Al(CH_3)_3$: 0.2% | $H_2$: remainder |
| | B-C | $NH_3$: 1.4% | $N_2$: 1.5% | $H_2$: 58% | $AlCl_3$: 0.7% | $TiCl_4$: 0.3% | $BCl_3$: 0.1% | $N_2$: 12.5% | $Al(CH_3)_3$: 0% | $H_2$: remainder |
| | V-A | $NH_3$: 1.5% | $N_2$: 1.2% | $H_2$: 56% | $AlCl_3$: 0.8% | $TiCl_4$: 0.2% | $VCl_4$: 0.1% | $N_2$: 13.5% | $Al(CH_3)_3$: 0% | $H_2$: remainder |
| | V-B | $NH_3$: 1.2% | $N_2$: 1.7% | $H_2$: 60% | $AlCl_3$: 0.9% | $TiCl_4$: 0.3% | $VCl_4$: 0.1% | $N_2$: 13.0% | $Al(CH_3)_3$: 0.5% | $H_2$: remainder |
| | V-C | $NH_3$: 1.0% | $N_2$: 1.1% | $H_2$: 58% | $AlCl_3$: 0.7% | $TiCl_4$: 0.3% | $VCl_4$: 0.2% | $N_2$: 15.0% | $Al(CH_3)_3$: 0% | $H_2$: remainder |
| | Cr-A | $NH_3$: 1.4% | $N_2$: 1.4% | $H_2$: 59% | $AlCl_3$: 0.6% | $TiCl_4$: 0.3% | $CrCl_2$: 0.2% | $N_2$: 14.0% | $Al(CH_3)_3$: 0% | $H_2$: remainder |

TABLE 19-continued

| Process type | Formation symbol | Reaction gas group A composition (% by volume) | | | Reaction gas group B composition (% by volume) | | | | | |
|---|---|---|---|---|---|---|---|---|---|---|
| | Cr-B | NH$_3$: 1.3% | N$_2$: 1.0% | H$_2$: 56% | AlCl$_3$: 0.8% | TiCl$_4$: 0.3% | CrCl$_2$: 0.1% | N$_2$: 14.5% | Al(CH$_3$)$_3$: 0% | H$_2$: remainder |
| | Cr-C | NH$_3$: 1.3% | N$_2$: 1.8% | H$_2$: 57% | AlCl$_3$: 0.7% | TiCl$_4$: 0.2% | CrCl$_2$: 0.1% | N$_2$: 13.5% | Al(CH$_3$)$_3$: 0% | H$_2$: remainder |
| Comparative film forming process | Si-a | NH$_3$: 1.2% | N$_2$: 3.0% | H$_2$: 58% | AlCl$_3$: 0.8% | TiCl$_4$: 0.3% | SiCl$_4$: 0.4% | N$_2$: 13.0% | Al(CH$_3$)$_3$: 0% | H$_2$: remainder |
| | Si-b | NH$_3$: 1.5% | N$_2$: 1.5% | H$_2$: 65% | AlCl$_3$: 0.4% | TiCl$_4$: 0.3% | SiCl$_4$: 0.1% | N$_2$: 15.0% | Al(CH$_3$)$_3$: 0.2% | H$_2$: remainder |
| | Si-c | NH$_3$: 0.6% | N$_2$: 2.0% | H$_2$: 55% | AlCl$_3$: 0.7% | TiCl$_4$: 0.2% | SiCl$_4$: 0.2% | N$_2$: 11.0% | Al(CH$_3$)$_3$: 0% | H$_2$: remainder |
| | Zr-a | NH$_3$: 1.4% | N$_2$: 1.2% | H$_2$: 59% | AlCl$_3$: 0.9% | TiCl$_4$: 0.1% | ZrCl$_4$: 0.05% | N$_2$: 14.5% | Al(CH$_3$)$_3$: 0% | H$_2$: remainder |
| | Zr-b | NH$_3$: 1.0% | N$_2$: 0.7% | H$_2$: 57% | AlCl$_3$: 0.5% | TiCl$_4$: 0.4% | ZrCl$_4$: 0.2% | N$_2$: 12.5% | Al(CH$_3$)$_3$: 0% | H$_2$: remainder |
| | Zr-c | NH$_3$: 1.3% | N$_2$: 1.7% | H$_2$: 47% | AlCl$_3$: 0.6% | TiCl$_4$: 0.3% | ZrCl$_4$: 0.2% | N$_2$: 14.0% | Al(CH$_3$)$_3$: 0.7% | H$_2$: remainder |
| | B-a | NH$_3$: 1.3% | N$_2$: 1.8% | H$_2$: 58% | AlCl$_3$: 0.7% | TiCl$_4$: 0.2% | BCl$_3$: 0.3% | N$_2$: 17.5% | Al(CH$_3$)$_3$: 0% | H$_2$: remainder |
| | B-b | NH$_3$: 2.0% | N$_2$: 1.3% | H$_2$: 60% | AlCl$_3$: 0.8% | TiCl$_4$: 0.1% | BCl$_3$: 0.1% | N$_2$: 13.0% | Al(CH$_3$)$_3$: 0% | H$_2$: remainder |
| | B-c | NH$_3$: 1.1% | N$_2$: 1.1% | H$_2$: 56% | AlCl$_3$: 1.2% | TiCl$_4$: 0.2% | BCl$_3$: 0.2% | N$_2$: 14.0% | Al(CH$_3$)$_3$: 0.5% | H$_2$: remainder |
| | V-a | NH$_3$: 1.8% | N$_2$: 2.5% | H$_2$: 50% | AlCl$_3$: 0.9% | TiCl$_4$: 0.3% | VCl$_4$: 0.1% | N$_2$: 13.5% | Al(CH$_3$)$_3$: 0% | H$_2$: remainder |
| | V-b | NH$_3$: 1.4% | N$_2$: 1.4% | H$_2$: 59% | AlCl$_3$: 0.8% | TiCl$_4$: 0.2% | VCl$_4$: 0.03% | N$_2$: 20.0% | Al(CH$_3$)$_3$: 0% | H$_2$: remainder |
| | V-c | NH$_3$: 1.2% | N$_2$: 1.0% | H$_2$: 60% | AlCl$_3$: 0.6% | TiCl$_4$: 0.5% | VCl$_4$: 0.1% | N$_2$: 15.0% | Al(CH$_3$)$_3$: 1.0% | H$_2$: remainder |
| | Cr-a | NH$_3$: 1.5% | N$_2$: 2.0% | H$_2$: 70% | AlCl$_3$: 0.7% | TiCl$_4$: 0.3% | CrCl$_2$: 0.2% | N$_2$: 10.0% | Al(CH$_3$)$_3$: 0% | H$_2$: remainder |
| | Cr-b | NH$_3$: 0.8% | N$_2$: 1.6% | H$_2$: 55% | AlCl$_3$: 1.4% | TiCl$_4$: 0.2% | CrCl$_2$: 0.1% | N$_2$: 13.5% | Al(CH$_3$)$_3$: 0% | H$_2$: remainder |
| | Cr-c | NH$_3$: 1.0% | N$_2$: 0.3% | H$_2$: 57% | AlCl$_3$: 0.7% | TiCl$_4$: 0.2% | CrCl$_2$: 0.3% | N$_2$: 14.5% | Al(CH$_3$)$_3$: 0% | H$_2$: remainder |

Forming conditions (reaction gas composition is represented as ratio with respect to a total for the gas group A and the gas group B.)

TABLE 20

Forming conditions (pressure of reaction atmosphere indicates kPa and temperature indicates °C.)

| Formation of hard coating layer | | Gas group A | | Gas group B | | Phase difference in supply between gas group A and gas group B | Reaction Atmosphere | |
|---|---|---|---|---|---|---|---|---|
| Process type | Formation symbol | Supply cycle (seconds) | Supply time per cycle (seconds) | Supply cycle (seconds) | Supply time per cycle (seconds) | | Pressure | Temperature |
| Film forming process according to the present invention | Si-A | 3 | 0.20 | 3 | 0.20 | 0.15 | 4.7 | 800 |
| | Si-B | 4 | 0.25 | 4 | 0.25 | 0.20 | 5.0 | 900 |
| | Si-C | 5 | 0.25 | 5 | 0.25 | 0.20 | 4.7 | 750 |
| | Zr-A | 2 | 0.15 | 2 | 0.15 | 0.10 | 4.5 | 800 |
| | Zr-B | 4 | 0.20 | 4 | 0.20 | 0.15 | 4.5 | 850 |
| | Zr-C | 1 | 0.15 | 1 | 0.15 | 0.10 | 5.0 | 700 |
| | B-A | 3 | 0.20 | 3 | 0.20 | 0.15 | 4.5 | 900 |
| | B-B | 1 | 0.15 | 1 | 0.15 | 0.10 | 4.7 | 750 |
| | B-C | 5 | 0.25 | 5 | 0.25 | 0.20 | 5.0 | 800 |
| | V-A | 3 | 0.20 | 3 | 0.20 | 0.15 | 4.7 | 800 |
| | V-B | 4 | 0.20 | 4 | 0.20 | 0.15 | 4.7 | 750 |
| | V-C | 5 | 0.25 | 5 | 0.25 | 0.20 | 4.5 | 700 |
| | Cr-A | 2 | 0.15 | 2 | 0.15 | 0.10 | 5.0 | 850 |
| | Cr-B | 4 | 0.20 | 4 | 0.20 | 0.15 | 4.7 | 800 |
| | Cr-C | 3 | 0.20 | 3 | 0.20 | 0.15 | 4.5 | 800 |
| Comparative film forming process | Si-a | — | — | — | — | — | 6.0 | 600 |
| | Si-b | — | — | — | — | — | 5.0 | 900 |
| | Si-c | — | — | — | — | — | 4.5 | 850 |
| | Zr-a | — | — | — | — | — | 4.7 | 750 |
| | Zr-b | — | — | — | — | — | 4.7 | 650 |
| | Zr-c | — | — | — | — | — | 4.0 | 800 |
| | B-a | — | — | — | — | — | 4.5 | 700 |
| | B-b | — | — | — | — | — | 5.0 | 800 |
| | B-c | — | — | — | — | — | 4.7 | 950 |
| | V-a | — | — | — | — | — | 3.5 | 800 |
| | V-b | — | — | — | — | — | 4.7 | 850 |
| | V-c | — | — | — | — | — | 4.5 | 750 |
| | Cr-a | — | — | — | — | — | 5.5 | 700 |
| | Cr-b | — | — | — | — | — | 4.7 | 800 |
| | Cr-c | — | — | — | — | — | 5.0 | 950 |

TABLE 21

| Type | | Hard coating layer (Numerical values in the lower sections represent target average layer thicknesses (μm) of the layer.) Lower layer | | |
|---|---|---|---|---|
| | | First layer | Second layer | Third layer |
| Coated tools according to the present invention/Comparative coated tools | 31 | — | — | — |
| | 32 | — | — | — |
| | 33 | — | — | — |
| | 34 | — | — | — |
| | 35 | — | — | — |
| | 35 | TiC (0.3) | — | — |
| | 37 | TiN (0.5) | — | — |
| | 38 | TiN (0.1) | TiCN (1) | — |
| | 39 | TiN (0.1) | TiCN (3) | — |
| | 40 | TiN (0.3) | — | — |
| | 41 | TiN (0.5) | TiCN (2) | — |
| | 42 | TiN (0.3) | TiCN (1) | — |
| | 43 | TiN (0.5) | — | — |
| | 44 | — | — | — |
| | 45 | — | — | — |

TABLE 22

Hard coating layer
TiAlMe complex carbonitride layer $(Ti_{1-\alpha-\beta}Al_\alpha Me_\beta)(C_\gamma N_{1-\gamma})$

| Type | | Tool body symbol | Formation symbol of process of forming TiAlMeCN (See Tables 4 and 5) | Content ratio $X_{avg}$ of Al | Content ratio of $Y_{avg}$ of Me | Sum of average content ratios of Al and Me $X_{avg} + Y_{avg}$ | Average content ratio $Z_{avg}$ of C | Area ratio of crystal grains having average crystal grain misorientation equal to or greater than 2 degrees (%) |
|---|---|---|---|---|---|---|---|---|
| Coated tool according to the present invention | 31 | E | Si-A | 0.67 | 0.031 | 0.701 | 0.0048 | 48 |
| | 32 | F | Si-B | 0.77 | 0.054 | 0.824 | 0.0001 or less | 69 |
| | 33 | G | Si-C | 0.79 | 0.076 | 0.866 | 0.0001 or less | 42 |
| | 34 | H | Zr-A | 0.86 | 0.089 | 0.949 | 0.0001 or less | 45 |
| | 35 | E | Zr-B | 0.92 | 0.018 | 0.938 | 0.0001 or less | 62 |
| | 38 | F | Zr-C | 0.61 | 0.046 | 0.656 | 0.0019 | 22 |
| | 37 | G | B-A | 0.84 | 0.049 | 0.889 | 0.0001 or less | 58 |
| | 38 | H | B-B | 0.75 | 0.082 | 0.832 | 0.0011 | 26 |
| | 39 | E | B-C | 0.69 | 0.020 | 0.710 | 0.0001 or less | 64 |
| | 40 | F | V-A | 0.89 | 0.023 | 0.913 | 0.0001 or less | 49 |
| | 41 | G | V-B | 0.80 | 0.008 | 0.808 | 0.0036 | 38 |
| | 42 | H | V-C | 0.65 | 0.085 | 0.735 | 0.0001 or less | 36 |
| | 43 | E | Cr-A | 0.63 | 0.097 | 0.727 | 0.0001 or less | 43 |
| | 44 | F | Cr-B | 0.74 | 0.013 | 0.753 | 0.0001 or less | 47 |
| | 45 | G | Cr-C | 0.86 | 0.045 | 0.905 | 0.0001 or less | 40 |

Hard coating layer
TiAlMe complex carbonitride layer $(Ti_{1-\alpha-\beta}Al_\alpha Me_\beta)(C_\gamma N_{1-\gamma})$ Distribution ratio of frequencies at which inclined angles of normal lines of {111} planes are present in a range of 0 to Distribution ratio of frequencies at which inclined angles of normal lines of {111} planes are present in a Inclined angle section in which the highest peak is observed Area Average crystal grain Average Upper layer (Numerical values in the lower sections represent target TABLE 22-continued

| Type | | 12 degrees in the region on the side of the tool body $M_{deg}$ | range of 0 to 12 degrees in the region on the side of the surface $N_{deg}$ | in the region on the side of the surface (degrees) | ratio of cubic crystal (%) | width W of cubic crystal grains (μm) | aspect ratio A of cubic crystal grains | Target layer thickness (μm) | average layer thickness (μm) of the layer.) First layer | Second layer |
|---|---|---|---|---|---|---|---|---|---|---|
| Coated tool according to the present invention | 31 | 24 | 41 | 9.75 to 10.0 | 91 | 0.8 | 4.8 | 4 | — | — |
| | 32 | 19 | 48 | 7.5 to 7.75 | 94 | 1.1 | 4.3 | 5 | — | — |
| | 33 | 39 | 53 | 4.5 to 4.75 | 83 | 1.6 | 3.0 | 5 | — | — |
| | 34 | 34 | 50 | 4.0 to 4.25 | 62 | 0.3 | 5.7 | 3 | — | — |
| | 35 | 11 | 36 | 10.0 to 10.25 | 59 | 0.08 | 15.8 | 4 | — | — |
| | 36 | 39 | 56 | 3.25 to 3.5 | 96 | 2.3 | 2.6 | 6 | — | — |
| | 37 | 23 | 46 | 8.0 to 8.25 | 96 | 0.4 | 9.3 | 4 | — | — |
| | 38 | 39 | 51 | 3.75 to 4.0 | 92 | 1.7 | 1.5 | 3 | — | — |
| | 39 | 21 | 47 | 6.25 to 6.5 | 100 | 0.7 | 5.3 | 4 | — | — |
| | 40 | 27 | 44 | 8.5 to 8.75 | 80 | 0.05 | 12.9 | 2 | TiCN (0.5) | $Al_2O_3$ (2) |
| | 41 | 38 | 62 | 0.75 to 1.0 | 78 | 2.1 | 1.3 | 3 | TiCNO (0.2) | $Al_2O_3$ (1) |
| | 42 | 35 | 58 | 2.75 to 3.0 | 88 | 1.4 | 1.2 | 2 | TiCO (0.3) | $Al_2O_3$ (2) |
| | 43 | 16 | 34 | 11.5 to 11.75 | 77 | 0.5 | 1.9 | 2 | TiCNO (0.3) | $Al_2O_3$ (3) |
| | 44 | 25 | 45 | 7.0 to 7.25 | 100 | 1.2 | 2.3 | 3 | — | — |
| | 45 | 33 | 48 | 5.0 to 5.25 | 85 | 0.9 | 5.0 | 5 | — | — |

TABLE 23

| | | | | Hard coating layer TiAlMe complex carbonitride layer (T1 − α − βAlαMeβ)(CγN1 − γ) | | | | | |
|---|---|---|---|---|---|---|---|---|---|
| Type | | Tool body symbol | Formation symbol of process of forming TiAlMeCN (See Tables 4 and 5) | Content ratio $X_{avg}$ of Al | Content ratio $Y_{avg}$ of Me | Sum of average content ratios of Al and Me $X_{avg} + Y_{avg}$ | Average content ratio $Z_{avg}$ of C | Area ratio of crystal grains having average crystal grain misorientation equal to or greater than 2 degrees (%) | Distribution ratio of frequencies at which inclined angles of normal lines of {111} planes are present in a range of 0 to 12 degrees in the region on the side of the tool body $M_{deg}$ |
| Comparative coated tools | 31 | E | Si-a | 0.73 | 0.137 | 0.867 | 0.0001 or less | 9 | 54 |
| | 32 | F | Si-b | 0.56 | 0.056 | 0.616 | 0.0017 | 2 | 37 |
| | 33 | G | Si-c | 0.86 | 0.097 | 0.957 | 0.0001 or less | 0 | 24 |
| | 34 | H | Zr-a | 0.99 | 0.003 | 0.993 | 0.0001 or less | — | — |
| | 35 | E | Zr-b | 0.52 | 0.089 | 0.609 | 0.0001 or less | 1 | 67 |
| | 36 | F | Zr-c | 0.61 | 0.047 | 0.657 | 0.0077 | 3 | 47 |
| | 37 | G | B-a | 0.84 | 0.113 | 0.953 | 0.0001 or less | 0 | 29 |
| | 38 | H | B-b | 0.98 | 0.019 | 0.999 | 0.0001 or less | — | — |
| | 39 | E | B-c | 0.96 | 0.038 | 0.998 | 0.0045 | — | — |
| | 40 | F | V-a | 0.79 | 0.007 | 0.797 | 0.0001 or less | 0 | 31 |
| | 41 | G | V-b | 0.89 | 0.002 | 0.892 | 0.0001 or less | 3 | 39 |
| | 42 | H | V-c | 0.53 | 0.013 | 0.543 | 0.0111 | 4 | 59 |
| | 43 | E | Cr-a | 0.66 | 0.086 | 0.746 | 0.0001 or less | 1 | 49 |
| | 44 | F | Cr-b | 0.98 | 0.004 | 0.984 | 0.0001 or less | 0 | 25 |
| | 45 | G | Cr-c | 0.83 | 0.106 | 0.936 | 0.0001 or less | 0 | 7 |

TABLE 23-continued

Hard coating layer

TiAlMe complex carbonitride layer (T1 − α − βAlαMeβ)(CγN1 − γ)

| Type | | Distribution ratio of frequencies at which inclined angles of normal lines of {111} planes are present in a range of 0 to 12 degrees in the region on the side of the surface $N_{deg}$ | Inclined angle section in which the highest peak is observed in the region on the side of the surface (degrees) | Area ratio of cubic crystal (%) | Average crystal grain width W of cubic crystal grains (μm) | Average aspect ratio A of cubic crystal grains | Target layer thickness (μm) | Upper layer (Numerical values in the lower sections represent target average layer thickness (μm) of the layer.) | |
|---|---|---|---|---|---|---|---|---|---|
| | | | | | | | | First layer | Second layer |
| Comparative coated tools | 31 | 62 | 2.5 to 2.75 | 89 | 1.7 | 2.3 | 4 | — | — |
| | 32 | 37 | 11.0 to 11.25 | 97 | 0.2 | 19.6 | 5 | — | — |
| | 33 | 24 | 16.75 to 17.0 | 68 | 0.07 | 1.8 | 5 | — | — |
| | 34 | — | — | 0 | — | — | 3 | — | — |
| | 35 | 68 | 1.5 to 1.75 | 100 | 1.5 | 2.5 | 4 | — | — |
| | 36 | 50 | 5.0 to 5.25 | 81 | 1.0 | 3.3 | 6 | — | — |
| | 37 | 28 | 27.25 to 27.5 | 43 | 0.8 | 2.3 | 4 | — | — |
| | 38 | — | — | 0 | — | — | 3 | — | — |
| | 39 | — | — | 0 | — | — | 4 | — | — |
| | 40 | 30 | 19.75 to 20.0 | 100 | 0.05 | 9.8 | 0.5 | TiCN (0.5) | Al$_2$O$_3$ (2) |
| | 41 | 44 | 8.5 to 8.75 | 96 | 0.3 | 6.1 | 3 | TiCNO (0.2) | Al$_2$O$_3$ (1) |
| | 42 | 65 | 2.75 to 3.0 | 73 | 2.4 | 0.7 | 2 | TiCO (0.3) | Al$_2$O$_3$ (2) |
| | 43 | 51 | 6.0 to 6.25 | 99 | 1.2 | 0.8 | 2 | TiCNO (0.3) | Al$_2$O$_3$ (3) |
| | 44 | 21 | 22.5 to 22.75 | 17 | 0.1 | 1.5 | 3 | — | — |
| | 45 | 13 | 31.5 to 31.75 | 40 | 0.06 | 22.4 | 5 | — | — |

(Note)
Only hexagonal crystals were observed and no cubic crystals were observed in Comparative coated tools 34, 38, and 39.

Next, all the aforementioned variety of coated tools, namely coated tools 31 to 45 according to the present invention and Comparative coated tools 31 to 45 were subjected to the following dry high-speed face milling and a center cutting machining test, which are types of high-speed intermittent cutting of alloy steel, in a state in which the coated tools were clamped with fixing jigs at tip ends of cutters made of tool steel with a cutter diameter of 125 mm, and wear width of a flank faces at all the cutting edges were measured. The results are shown in Table 24.
Tool body: tungsten-carbide-based cemented carbide, titanium-carbonitride-based cermet Cutting test: dry-type high-speed face milling, center cutting machining
Work material: block material of JIS•S55C with a width of 100 mm and a length of 400 mm
Rotation speed: 713 min$^{-1}$
Cutting speed: 280 m/min
Depth of cut: 2.5 mm
Feed rate per tooth: 0.30 mm/tooth
Cutting time: 8 minutes

TABLE 24

| Type | | Wear width of a flank face (mm) | Type | | Cutting test result (minutes) |
|---|---|---|---|---|---|
| Coated tools according to the present invention | 31 | 0.17 | Comparative coated tools | 31 | 3.8* |
| | 32 | 0.13 | | 32 | 5.9* |
| | 33 | 0.14 | | 33 | 4.1* |
| | 34 | 0.15 | | 34 | 1.7* |
| | 35 | 0.16 | | 35 | 3.3* |
| | 36 | 0.12 | | 36 | 4.4* |
| | 37 | 0.13 | | 37 | 1.9* |
| | 38 | 0.08 | | 38 | 2.0* |
| | 39 | 0.11 | | 39 | 1.6* |
| | 40 | 0.10 | | 40 | 7.2* |
| | 41 | 0.07 | | 41 | 6.8* |
| | 42 | 0.10 | | 42 | 5.2* |
| | 43 | 0.12 | | 43 | 6.4* |
| | 44 | 0.14 | | 44 | 4.8* |
| | 45 | 0.15 | | 45 | 3.7* |

The * marks in the sections of the comparative coated tools denote cutting times (minutes) at which life end was reached due to the occurrence of chipping.

Example 4

WC powder, TiC powder, ZrC powder, TaC powder, NbC powder, Cr$_3$C$_2$ powder, TiN powder, and Co powder with average grain sizes of 1 to 3 μm were prepared as raw material powder, the raw material powder was mixed together in the mixing compositions shown in Table 25, wax was further added thereto, the mixture was mixed with acetone in a ball mill for 24 hours, was dried in a reduced pressure, and was press-molded into a green compact with a predetermined shape under a pressure of 98 MPa, the green compact is vacuum-sintered under conditions in which it was held in vacuum of 5 Pa at a predetermined temperature within a range of 1370 to 1470° C. for 1 hour, and after the sintering, tool bodies ε to η made of WC-based cemented carbide with an insert shape of ISO standard CNMG120412 were respectively manufactured by performing honing machining at R: 0.07 mm on cutting edge portions.

TiCN (mass ratio TiC/TiN=50/50) powder, NbC powder, WC powder, Co powder, and Ni powder with average grain sizes of 0.5 to 2 μm were prepared as raw material powder, the raw material powder was mixed together in the mixing compositions shown in Table 26, the mixture was wet mixed in a ball mill for 24 hours, was dried, and was press-molded into a green compact under a pressure of 98 MPa, the green compact is sintered under conditions in which it was held in nitrogen atmosphere at 1.3 kPa at a temperature of 1500° C. for 1 hour, and after the sintering, a tool body θ made of TiCN-based cermet with an insert shape of ISO standard CNMG120412 was manufactured by performing honing machining at R: 0.09 mm on a cutting edge portion.

Next, coated tools 46 to 60 according to the present invention shown in Table 28 were manufactured by using a chemical vapor deposition apparatus on the surfaces of these tool bodies ε to η and the tool body θ to deposit hard coating layers with target layer thicknesses, which included at least $(Ti_{1-x-y}Al_xMe_y)(C_zN_{1-z})$, under the conditions shown in Tables 19 and 20 by a method similar to that in Example 1.

Note that the lower layers shown in Table 27 and/or the upper layers shown in Table 28 were formed for coated tools 49 to 58 according to the present invention under the forming conditions shown in Table 18.

In addition, for the purpose of comparison, Comparative coated tools 46 to 60 shown in Table 29 were manufactured by using a chemical vapor deposition apparatus on the surfaces of these tool bodies E to and the tool body θ to deposit hard coating layers with target layer thicknesses shown in Table 29 under the conditions shown in Tables 19 and 20 by a method similar to that for the coated tools according to the present invention.

Note that the lower layers shown in Table 27 and/or the upper layers shown in Table 29 were formed for Comparative coated tools 49 to 58 under the forming conditions shown in Table 18 in a manner similar to that for coated tools 49 to 58 according to the present invention.

In addition, a scanning electron microscope (magnification: 5000 times) was used to measure sections of the respective constituent layers of coated tools 46 to 60 according to the present invention and Comparative coated tools 46 to 60, and layer thicknesses at five points in an observation field of view were measured and averaged to obtain average layer thicknesses. All the layers had average layer thicknesses that were substantially the same as the target layer thicknesses shown in Tables 27 to 29.

In addition, average content ratios $α_{avg}$ of Al, average content ratios $β_{avg}$ of Me, average content ratios $γ_{avg}$ of C, inclined angle frequency distributions $M_{deg}$ on the side of the tool bodies, inclined angle frequency distributions $N_{deg}$ on the side of the front, angular ranges in which the highest peaks were present in inclined angle sections in the regions on the side of the front, average crystal grain widths W and average aspect ratios A of the crystal grains, and area ratios of cubic crystal phases in the crystal grains in the hard coating layers of coated tools 46 to 60 according to the present invention and Comparative coated tools 46 to 60 were obtained by a method similar to that shown in Example 3. The results are shown in Tables 28 and 29.

Furthermore, crystal orientations of the individual crystal grains which had cubic structures that formed the layer of a complex nitride or a complex carbonitride of Ti and Al were analyzed in the vertical sectional direction by using an electron backscatter diffraction apparatus, and crystal grain misorientations were mapped by dividing a range of 0 to 10 degrees into sections of each 1 degree, that is, a section of equal to or greater than 0 degrees and less than 1 degree, a section of equal to or greater than 1 degree and less than 2 degrees, a section of equal to or greater than 2 degrees and less than 3 degrees, a section of equal to or greater than 3 degrees and less than 4 degrees, and the like. Average crystal grain misorientations and an area ratio of the crystal grains with the average crystal grain misorientations of 2 degrees or greater with respect to the entire layer of a complex nitride or a complex carbonitride of Ti, Al, and Me was obtained from the mapping diagram. The results are shown in Tables 28 and 29.

TABLE 25

| | | Mixing composition (% by mass) | | | | | | |
|---|---|---|---|---|---|---|---|---|
| Type | | Co | TiC | ZrC | TaC | NbC | $Cr_3C_2$ | TiN | WC |
| Tool body | ε | 6.5 | — | 1.5 | — | 2.9 | 0.1 | 1.5 | Remainder |
| | ξ | 7.6 | 2.6 | — | 4.0 | 0.5 | — | 1.1 | Remainder |
| | η | 6.0 | — | — | — | — | — | — | Remainder |

TABLE 26

| | | Mixing composition (% by mass) | | | | |
|---|---|---|---|---|---|---|
| Type | | Co | Ni | NbC | WC | TiCN |
| Tool body | θ | 11 | 4 | 6 | 15 | Remainder |

TABLE 27

| | | Lower layer (Numerical values in the lower sections represent target average layer thickness (μm) of the layer.) | | | |
|---|---|---|---|---|---|
| Type | | First layer | Second layer | Third layer | Fourth layer |
| Coated tools according to the present invention/ Comparative coated tools | 46 | — | — | — | — |
| | 47 | — | — | — | — |
| | 48 | — | — | — | — |
| | 49 | TiC (0.5) | — | — | — |
| | 50 | TiN (0.3) | — | — | — |
| | 51 | TiN (0.5) | TiCN (7) | — | — |
| | 52 | TiN (0.1) | TiCN (8) | TiN (0.7) | — |
| | 53 | TiN (0.3) | TiCN (10) | — | — |
| | 54 | — | — | — | — |
| | 55 | TiN (0.5) | TiCN (6) | — | — |
| | 56 | TiC (0.5) | TiN (0.5) | — | — |
| | 57 | TiN (0.3) | TiCN (8) | — | — |
| | 58 | TiN (0.1) | TiCN (4) | — | — |
| | 59 | — | — | — | — |
| | 60 | — | — | — | — |

TABLE 28

Hard coating layer
TiAlMe complex carbonitride layer $(Ti_{1-\alpha-\beta}Al_\alpha Me_\beta)(C_\gamma N_{1-\gamma})$

| Type | | Tool body symbol | Formation symbol of process of forming TiAlMeCN (See Tables 4 and 5) | Content ratio $X_{avg}$ of Al | Content ratio of $Y_{avg}$ of Me | Sum of average content ratios of Al and Me $X_{avg} + Y_{avg}$ | Average content ratio $Z_{avg}$ of C | Area ratio of crystal grains having average crystal grain misorientation equal to or greater than 2 degrees (%) | Distribution ratio of frequencies at which inclined angles of normal lines of {111} planes are present in a range of 0 to 12 degrees in the region on the side of the tool body $M_{deg}$ | Distribution ratio of frequencies at which inclined angles of normal lines of {111} planes are present in a range of 0 to 12 degrees in the region on the side of the surface $N_{deg}$ |
|---|---|---|---|---|---|---|---|---|---|---|
| Coated tools according to the present invention | 46 | ε | Si-A | 0.68 | 0.027 | 0.707 | 0.0046 | 52 | 22 | 42 |
| | 47 | ξ | Si-B | 0.79 | 0.051 | 0.841 | 0.0001 or less | 66 | 17 | 45 |
| | 48 | η | Si-C | 0.77 | 0.072 | 0.842 | 0.0001 or less | 45 | 36 | 50 |
| | 49 | θ | Zr-A | 0.85 | 0.085 | 0.935 | 0.0001 or less | 41 | 37 | 50 |
| | 50 | ε | Zr-B | 0.93 | 0.013 | 0.943 | 0.0001 or less | 58 | 10 | 34 |
| | 51 | ξ | Zr-C | 0.62 | 0.044 | 0.664 | 0.0023 | 21 | 38 | 54 |
| | 52 | η | B-A | 0.86 | 0.047 | 0.907 | 0.0001 or less | 55 | 20 | 42 |
| | 53 | θ | B-B | 0.77 | 0.080 | 0.850 | 0.0017 | 29 | 37 | 52 |
| | 54 | ε | B-C | 0.67 | 0.017 | 0.687 | 0.0001 or less | 61 | 22 | 49 |
| | 55 | ξ | V-A | 0.91 | 0.026 | 0.936 | 0.0001 or less | 52 | 24 | 43 |
| | 56 | η | V-B | 0.79 | 0.006 | 0.796 | 0.0039 | 36 | 35 | 64 |
| | 57 | θ | V-C | 0.67 | 0.082 | 0.752 | 0.0001 or less | 41 | 33 | 56 |
| | 58 | ε | Cr-A | 0.60 | 0.094 | 0.694 | 0.0001 or less | 47 | 14 | 36 |
| | 59 | ξ | Cr-B | 0.77 | 0.011 | 0.781 | 0.0001 or less | 46 | 27 | 43 |
| | 60 | η | Cr-C | 0.87 | 0.042 | 0.912 | 0.0001 or less | 37 | 35 | 46 |

Hard coating layer
TiAlMe complex carbonitride layer $(Ti_{1-\alpha-\beta}Al_\alpha Me_\beta)(C_\gamma N_{1-\gamma})$

| Type | | Inclined angle section in which the highest peak is observed in the region on the side of the surface (degrees) | Area ratio of cubic crystal (%) | Average crystal grain width W of cubic crystal grains (μm) | Average aspect ratio A of cubic crystal grains | Target layer thickness (μm) | Upper layer (Numerical values in the lower sections represent target average layer thicknesses (μm) of the layer.) | | | |
|---|---|---|---|---|---|---|---|---|---|---|
| | | | | | | | First layer | Second layer | Third layer | Fourth layer |
| Coated tools according to the present invention | 46 | 9.25 to 9.5 | 93 | 0.7 | 13.5 | 19 | — | — | — | — |
| | 47 | 8.0 to 8.25 | 95 | 1.3 | 6.6 | 14 | — | — | — | — |
| | 48 | 4.25 to 4.5 | 80 | 1.4 | 8.6 | 16 | — | — | — | — |
| | 49 | 3.75 to 4.0 | 64 | 0.2 | 6.3 | 12 | — | — | — | — |
| | 50 | 10.5 to 10.75 | 61 | 0.09 | 14.9 | 10 | — | — | — | — |
| | 51 | 3.5 to 3.75 | 98 | 2.5 | 1 | 8 | — | — | — | — |
| | 52 | 8.75 to 9.0 | 94 | 0.3 | 17.4 | 9 | TiN (0.5) | — | — | — |
| | 53 | 3.75 to 4.0 | 91 | 1.5 | 6.0 | 10 | TiN (0.3) | TiCN (0.4) | TiN (0.3) | — |

TABLE 28-continued

| | | | | | | | | | | |
|---|---|---|---|---|---|---|---|---|---|---|
| 54 | 5.5 to 5.75 | 100 | 0.8 | 7.4 | 7 | TiCNO (0.3) | Al$_2$O$_3$ (3) | — | — |
| 55 | 8.0 to 8.25 | 82 | 0.06 | 11.7 | 6 | TiCN (0.5) | Al$_2$O$_3$ (3) | — | — |
| 56 | 1.0 to 1.25 | 75 | 2.0 | 1.8 | 7 | TiCO (0.5) | Al$_2$O$_3$ (4) | — | — |
| 57 | 2.25 to 2.5 | 86 | 1.6 | 4.3 | 9 | TiCNO (0.3) | Al$_2$O$_3$ (5) | — | — |
| 58 | 11.0 to 11.25 | 79 | 0.6 | 9.6 | 10 | TiN (0.3) | TiCN (0.5) | TiCNO (0.3) | Al$_2$O$_3$ (3) |
| 59 | 7.5 to 7.75 | 100 | 1.1 | 5.2 | 13 | — | — | — | — |
| 60 | 5.5 to 5.75 | 84 | 0.7 | 16.8 | 17 | — | — | — | — |

TABLE 29

Hard coating layer
TiAlMe complex carbonitride layer (Ti$_{1-\alpha-\beta}$Al$_\alpha$Me$_\beta$)(C$_\gamma$N$_{1-\gamma}$)

| Type | | Tool body symbol | Formation symbol of process of forming TiAlMeCN (See Tables 4 and 5) | Content ratio X$_{avg}$ of Al | Content ratio of Y$_{avg}$ of Me | Sum of average content ratios of Al and Me X$_{avg}$ + Y$_{avg}$ | Average content ratio Z$_{avg}$ of C | Area ratio of crystal grains having average crystal grain misorientation equal to or greater than 2 degrees (%) | Distribution ratio of frequencies at which inclined angles of normal lines of {111} planes are present in a range of 0 to 12 degrees in the region on the side of the tool body M$_{deg}$ | Distribution ratio of frequencies at which inclined angles of normal lines of {111} planes are present in a range of 0 to 12 degrees in the region on the side of the surface N$_{deg}$ |
|---|---|---|---|---|---|---|---|---|---|---|
| Comparative coated tools | 46 | ε | Si-a | 0.76 | 0.129 | 0.889 | 0.0001 or less | 8 | 55 | 60 |
| | 47 | ξ | Si-b | 0.54 | 0.062 | 0.602 | 0.0023 | 4 | 35 | 36 |
| | 48 | η | Si-c | 0.87 | 0.093 | 0.963 | 0.0001 or less | 0 | 22 | 22 |
| | 49 | θ | Zr-a | 0.99 | 0.005 | 0.995 | 0.0001 or less | — | — | — |
| | 50 | ε | Zr-b | 0.53 | 0.092 | 0.622 | 0.0001 or less | 2 | 65 | 66 |
| | 51 | ξ | Zr-c | 0.63 | 0.041 | 0.671 | 0 | 2 | 48 | 48 |
| | 52 | η | B-a | 0.85 | 0.118 | 0.968 | 0.0001 or less | 0 | 24 | 21 |
| | 53 | θ | B-b | 0.99 | 0.008 | 0.998 | 0.0001 or less | — | — | — |
| | 54 | ε | B-c | 0.97 | 0.027 | 0.997 | 0.0041 | — | — | — |
| | 55 | ξ | V-a | 0.78 | 0.006 | 0.786 | 0.0001 or less | 0 | 28 | 28 |
| | 56 | η | V-b | 0.91 | 0.001 | 0.911 | 0.0001 or less | 5 | 41 | 43 |
| | 57 | θ | V-c | 0.54 | 0.019 | 0.559 | 0 | 6 | 55 | 57 |
| | 58 | ε | Cr-a | 0.67 | 0.080 | 0.750 | 0.0001 or less | 2 | 50 | 51 |
| | 59 | ξ | Cr-b | 0.97 | 0.003 | 0.973 | 0.0001 or less | 0 | 20 | 27 |
| | 60 | η | Cr-c | 0.85 | 0.109 | 0.959 | 0.0001 or less | 0 | 5 | 8 |

TABLE 29-continued

| | | Hard coating layer | | | | | | | |
|---|---|---|---|---|---|---|---|---|---|
| | | TiAlMe complex carbonitride layer $(Ti_{1-\alpha-\beta}Al_\alpha Me_\beta)(C_\gamma N_{1-\gamma})$ | | | | | | | |
| | | Inclined angle section in which the highest peak is observed in the region on the side of the surface (degrees) | Area ratio of cubic crystal (%) | Average crystal grain width W of cubic crystal grains (μm) | Average aspect ratio A of cubic crystal grains | Target layer thickness (μm) | Upper layer (Numerical values in the lower sections represent target average layer thicknesses (μm) of the layer.) | | | |
| Type | | | | | | | First layer | Second layer | Third layer | Fourth layer |
| Comparative coated tools | 46 | 2.0 to 2.25 | 85 | 1.5 | 7.7 | 22 | — | — | — | — |
| | 47 | 11.5 to 11.75 | 94 | 0.3 | 17.4 | 14 | — | — | — | — |
| | 48 | 17.25 to 17.5 | 58 | 0.05 | 1.5 | 16 | — | — | — | — |
| | 49 | — | 0 | — | — | 12 | — | — | — | — |
| | 50 | 0.75 to 1.0 | 100 | 1.8 | 5.4 | 10 | — | — | — | — |
| | 51 | 5.5 to 5.75 | 84 | 1.4 | 2.7 | 8 | — | — | — | — |
| | 52 | 21.25 to 21.5 | 37 | 0.9 | 1.9 | 9 | TiN (0.5) | — | — | — |
| | 53 | — | 0 | — | — | 10 | TiN (0.3) | TiCN (0.4) | TiN (0.3) | — |
| | 54 | — | 0 | — | — | 7 | TiCNO (0.3) | $Al_2O_3$ (3) | — | — |
| | 55 | 23.0 to 23.25 | 100 | 0.08 | 21.1 | 6 | TiCN (0.5) | $Al_2O_3$ (3) | — | — |
| | 56 | 8.75 to 9.0 | 88 | 0.5 | 5.2 | 7 | TiCO (0.5) | $Al_2O_3$ (4) | — | — |
| | 57 | 2.5 to 2.75 | 69 | 2.2 | 1.7 | 9 | TiCNO (0.3) | $Al_2O_3$ (5) | — | — |
| | 58 | 4.75 to 5.0 | 97 | 1.1 | 6.8 | 10 | TiN (0.3) | TiCN (0.5) | TiCNO (0.3) | $Al_2O_3$ (3) |
| | 59 | 25.25 to 25.5 | 26 | 0.1 | 1.3 | 13 | — | — | — | — |
| | 60 | 28.5 to 28.75 | 37 | 0.05 | 25.0 | 17 | — | — | — | — |

(Note)
Only hexagonal crystals were observed and no cubic crystals were observed in Comparative coated tools 49, 53, and 54.

Next, all the aforementioned variety of coated tools, namely coated tools 46 to 60 according to the present invention and Comparative coated tools 46 to 60 were subjected to the following dry high-speed intermittent cutting test of carbon steel and a wet high-speed intermittent cutting test of ductile cast iron in a state in which the coated tools were screw-fixed with fixing jigs at tip ends of cutting tools made of tool steel, and wear width of a flank faces at all the cutting edges were measured.
Cutting condition 1:
Work material: round bar of JIS•S15C with four longitudinal grooves at an equal interval in a length direction
Cutting speed: 300 m/min
Depth of cut: 2.5 mm
Feed: 0.30 mm/rev
Cutting time: 5 minutes
(The ordinary cutting speed is 220 m/min)
Cutting condition 2:
Work material: round bar of JIS•FCD450 with four longitudinal grooves at an equal interval in a length direction
Cutting speed: 280 m/min
Depth of cut: 2.0 mm
Feed: 0.30 mm/rev
Cutting time: 5 minutes
(The ordinary cutting speed is 250 m/min)
Table 30 shows results of the cutting test.

TABLE 30

| | | Wear width of a flank face (mm) | | | | Cutting test result (minutes) | |
|---|---|---|---|---|---|---|---|
| Type | | Cutting condition 1 | Cutting condition 2 | Type | | Cutting condition 1 | Cutting condition 2 |
| Coated tools according to the present invention | 46 | 0.18 | 0.15 | Comparative coated tools | 46 | 2.3* | 2.5* |
| | 47 | 0.14 | 0.11 | | 47 | 3.7* | 3.9* |
| | 48 | 0.16 | 0.12 | | 48 | 3.0* | 3.2* |
| | 49 | 0.17 | 0.13 | | 49 | 1.2* | 1.4* |
| | 50 | 0.17 | 0.15 | | 50 | 2.7* | 2.5* |
| | 51 | 0.13 | 0.10 | | 51 | 3.2* | 3.3* |
| | 52 | 0.15 | 0.12 | | 52 | 1.4* | 1.5* |
| | 53 | 0.08 | 0.07 | | 53 | 1.5* | 1.3* |

TABLE 30-continued

| | Wear width of a flank face (mm) | | | Cutting test result (minutes) | |
|---|---|---|---|---|---|
| Type | Cutting condition 1 | Cutting condition 2 | Type | Cutting condition 1 | Cutting condition 2 |
| 54 | 0.10 | 0.08 | 54 | 1.3* | 1.5* |
| 55 | 0.11 | 0.09 | 55 | 4.5* | 4.7* |
| 56 | 0.07 | 0.05 | 56 | 4.1* | 4.2* |
| 57 | 0.09 | 0.09 | 57 | 3.3* | 3.5* |
| 58 | 0.13 | 0.11 | 58 | 3.9* | 4.0* |
| 59 | 0.16 | 0.12 | 59 | 2.9* | 2.8* |
| 60 | 0.17 | 0.14 | 60 | 2.4* | 2.6* |

The * marks in the sections of the comparative coated tools and the reference coated tools denote cutting times (minutes) at which the life end was reached due to the occurrence of chipping.

From the results shown in Tables 24 and 30, toughness is improved due to strain of the crystal grains and suppression of grain boundary slipping of the crystal grains in the coated tools according to the present invention, by the predetermined average crystal grain misorientations being present in the crystal grains which have cubic structures which form the layer of a complex nitride or a complex carbonitride of Al and Ti that forms the hard coating layer, and by the inclined angles of the normal lines of the {111} planes having the predetermined inclined angle frequency distribution in the region on the side of the tool body and in the region on the side of the surface of the crystal grains. Further, it is obvious that excellent chipping resistance and fracture resistance are achieved even in a case in which the coated tools are used in a high-speed intermittent cutting in which an intermittent and impact, high load exerts on cutting edges, and as a result, excellent wear resistance is exhibited in use over a long period of time.

In contrast, it is obvious that Comparative coated tools 31 to 45 and 46 to 60 in which the predetermined average crystal grain misorientations are not present in the crystal grains which have cubic structures which formed the layer of a complex nitride or a complex carbonitrides of Al, Ti, and Me that form the hard coating layers end the life thereof in short periods of time due to the occurrence of chipping, fracture, and the like in a case in which the coated tools are used in the high-speed intermittent cutting, which is accompanied with high heat generation, in which an intermittent and impact, high load exerts on the cutting edges.

Example 5

Tool bodies A to C made of WC-based cemented carbide and a tool body D made of TiCN-based cermet with insert shapes of ISO standard SEEN1203AFSN, which was similar to that in Example 1, were respectively manufactured.

Next, a chemical vapor deposition apparatus is used on the surfaces of these tool bodies A to D (a) to manufacture coated tools 61 to 75 according to the present invention under the forming conditions A to J shown in Tables 32 and 33, that is, by using a gas group A consisting of $NH_3$, $N_2$, and $H_2$ a gas group B consisting of $CrCl_3$, $AlCl_3$, $Al(CH_3)_3$, $N_2$, and $H_2$ and the respective gas supply methods of performing a thermal CVD method for a predetermined period of time using a gas supply method in which in which a reaction gas composition (% by volume with respect to the total for the gas group A and the gas group B) was set to satisfy $NH_3$: 1.0 to 1.5%, $N_2$: 1.0 to 2.0%, and $H_2$: 55 to 60% as the gas group A and $AlCl_3$: 0.6 to 0.9%, $CrCl_3$: 0.2 to 0.3%, $Al(CH_3)_3$: 0 to 0.5%, $N_2$: 12.5 to 15.0%, and $H_2$: remainder under conditions of a reaction atmosphere pressure: 4.5 to 5.0 kPa, a reaction atmosphere temperature: 750 to 900° C., a supply cycle: 1 to 5 seconds, a gas supply time per cycle: 0.15 to 0.25 seconds, and a supply phase difference between the gas group A and the gas group B of 0.10 to 0.20 seconds to form hard coating layers of $(Cr_{1-p}Al_p)$ $(C_qN_{1-q})$ layers, in which crystal grains that had cubic structures with average crystal grain misorientations of 2 degrees or greater as shown in Table 35 were present at area ratios shown in Table 35, which had target layer thicknesses shown in Table 35.

Note that for coated tools 66 to 73 according to the present invention, lower layers shown in Table 34 and/or upper layers shown in Table 35 were formed under forming conditions shown in Table 31.

In addition, for the purpose of comparison, hard coating layers that contained at least layer of a complex nitride or a complex carbonitrides of Cr and Al with the target layer thicknesses (μm) shown in Table 36 were deposited on the surfaces of tool bodies A to D under the conditions shown in Tables 32 and 33 in a manner similar to that for coated tools 61 to 75 according to the present invention. At this time, Comparative coated tools 61 to 73 were manufactured by forming the hard coating layers such that the reaction gas composition on the surface of the tool bodies did not temporarily change in a process of forming the $(Cr_{1-p}Al_p)$ $(C_qN_{1-q})$ layers.

Note that the lower layers shown in Table 34 and/or the upper layers shown in Table 36 were formed for Comparative coated tools 66 to 73 in a manner similar to those for coated tools 66 to 73 according to the present invention under the forming conditions shown in Table 31.

For reference, Reference coated tools 74 and 75 shown in Table 36 were manufactured by depositing $(Cr_{1-p}Al_p)(C_q N_{1-q})$ layers in the reference examples with target layer thicknesses on the surfaces of the tool body B and the tool body C by arc ion plating using a physical vapor deposition apparatus in the related art.

Note that conditions for the arc ion plating used in the vapor deposition in the reference examples were as follows.

(a) Aforementioned tool bodies B and C were ultrasonically washed in acetone and were attached to a rotation table in an arc ion plating apparatus along an outer circumferential portion at a position away from the center axis by a predetermined distance in a radial direction in a dried state, and an Al—Cr alloy with a predetermined composition was deployed for a cathode electrode (evaporation source).

(b) First, the inside of the apparatus was evacuated and was heated to 500° C. with a heater while being maintained at a vacuum of $10^{-2}$ Pa or lower, a DC bias voltage of −1000V was then applied to the tool bodies that rotated while revolving on the aforementioned rotation table, a current of 200 A was caused to flow between the cathode electrode made of the Al—Cr alloy and an anode electrode to cause arc discharge and generate Al ions and Cr ions in the apparatus, and thereafter, the surfaces of the tool bodies were treated by bombard cleaning.

(c) Then, nitrogen gas was introduced as reaction gas into the apparatus to obtain a reaction atmosphere at 4 Pa, a DC bias voltage at −50 V was applied to the tool bodies that rotated while revolving on the rotation table, and a current of 120 A was caused to flow between the cathode electrode (evaporation source) made of the Al—Cr alloy and the anode electrode to cause arc discharge.

In addition, a scanning electron microscope (magnification: 5000 times) was used to measure sections in a direction perpendicular to the tool bodies of the respective constituent layers of coated tools 61 to 75 according to the present invention, Comparative coated tools 61 to 73, and Reference coated tools 74 and 75, and layer thicknesses at five points in an observation field of view were measured and averaged to obtain average layer thicknesses. All the layers had average layer thicknesses that were substantially the same as the target layer thicknesses shown in Tables 34 to 36.

In addition, for the average content ratio $p_{avg}$ of Al in the layer of a complex nitride or a complex carbonitride, the average content ratio $p_{avg}$ of Al was obtained from averages of obtained analysis results of characteristic X-rays at ten points by irradiating polished surface as a surfaces of the samples with electron beams from the side of the surfaces of the samples by using an electron microanalyzer (EPMA). The average content ratio $q_{avg}$ of C was obtained by secondary ion mass analysis (SIMS). The ranges of 70 μm×70 μm from the side of the surfaces of the samples were irradiated with ion beams, and concentrations of the components discharged by a sputtering effect were measured in a depth direction. The average content ratio $q_{avg}$ of C represents an average value in the depth direction of the layer of a complex nitride or a complex carbonitride of Cr and Al. However, the content ratio of C excludes a content ratio of inevitable C contained even when gas containing C is intentionally not used as a gas raw material. Specifically, the content ratio (atomic ratio) of the C component contained in the layer of a complex nitride or a complex carbonitride in a case in which the supply amount of $Al(CH_3)_3$ is assumed to be 0 was obtained as the content ratio of inevitable C, and a value obtained by subtracting the content ratio of inevitable C from a content ratio (atomic ratio) of the C component contained in the layer of a complex nitride or a complex carbonitride obtained in a case in which $Al(CH_3)_3$ was intentionally supplied was obtained as $q_{avg}$.

Furthermore, crystal orientations of the individual crystal grains which had cubic structures that formed the layer of a complex nitride or a complex carbonitride of Cr and Al were analyzed in the vertical sectional direction by using an electron backscatter diffraction apparatus, and in a case in which there were misorientations of 5 degrees or greater between adjacent pixels, the parts were regarded as grain boundaries, a region surrounded by grain boundaries was regarded as one crystal grain, crystal grain misorientations were obtained between a certain pixel in a crystal grain and all the other pixels in the same crystal grain, and the crystal grain misorientations were mapped by dividing a range of 0 to 10 degrees into sections of each 1 degree, that is, a section of equal to or greater than 0 degrees and less than 1 degree, a section of equal to or greater than 1 degree and less than 2 degrees, a section of equal to or greater than 2 degrees and less than 3 degrees, a section of equal to or greater than 3 degrees and less than 4 degrees, and the like. The area ratio of the crystal grains with the average crystal grain misorientations of 2 degrees or greater with respect to the entire layer of a complex nitride or a complex carbonitride of Cr and Al was obtained from the mapping diagram. The results are shown in Tables 35 and 36.

Figure 11:
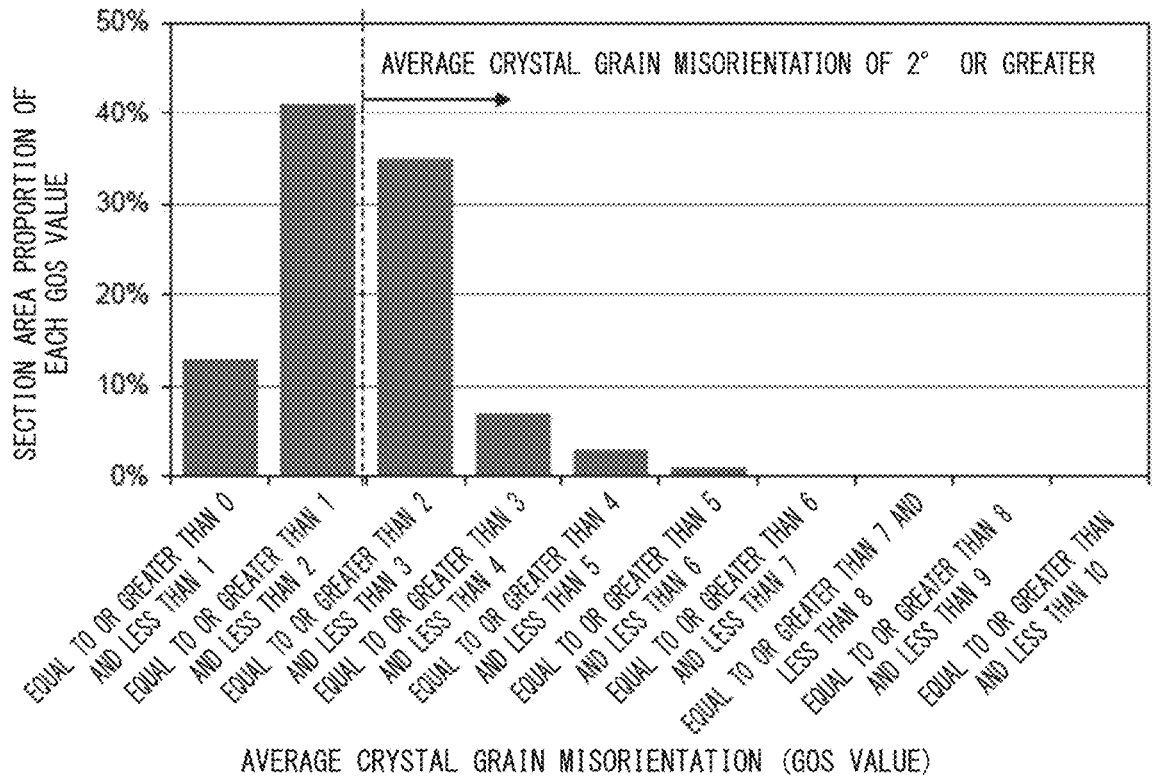
FIG. 11 shows an example of histogram regarding an area ratio of average crystal grain misorientations (GOS values) of the individual crystal grains that have cubic structures in a section of a layer of a complex nitride or a layer of a complex carbonitride of Cr and Al, which forms a hard coating layer in the coated tool according to the present invention. The dotted line in the vertical direction in the histogram represents a boundary at which the average crystal grain misorientation is 2°, and the bars on the right side of the dotted line in the vertical direction in FIG. 11 represent those with the average crystal grain misorientation of equal to or greater than 2°.
Figure 12:
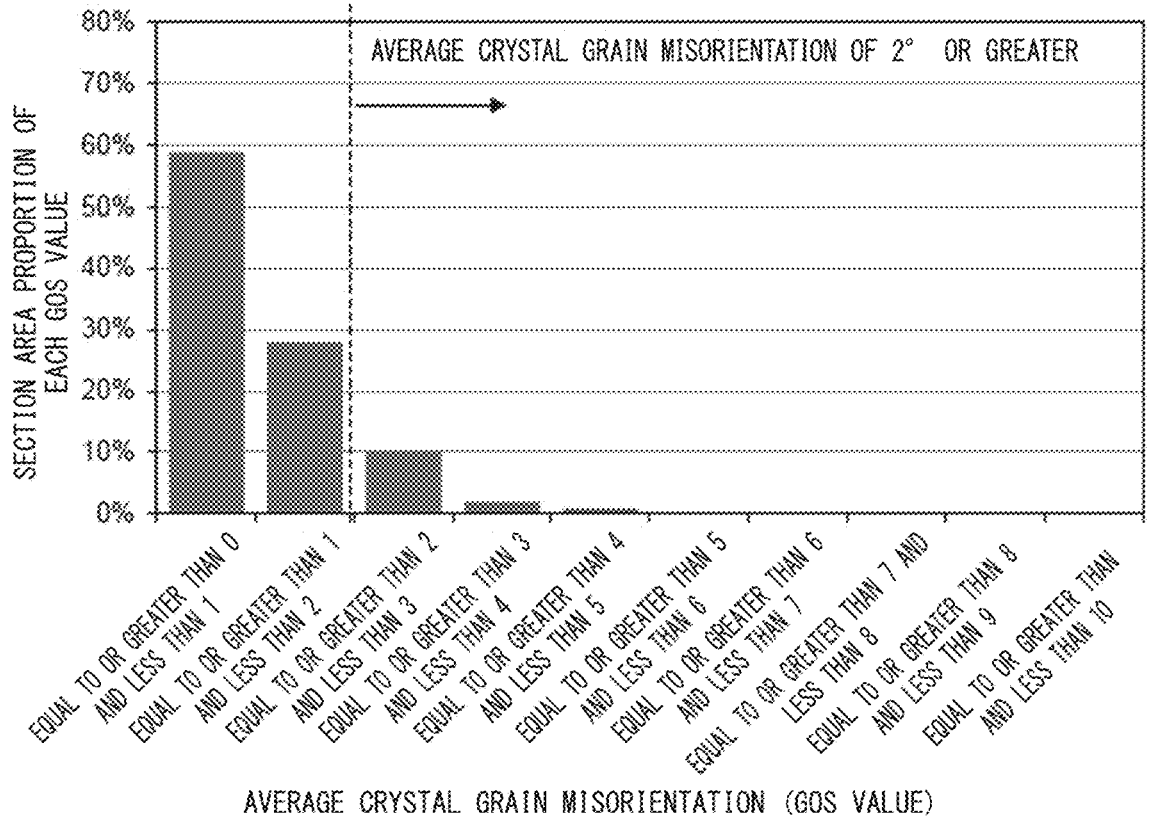
FIG. 12 shows an example of histogram regarding an area ratio of average crystal grain misorientations (GOS values) of the individual crystal grains that have cubic structures in a section of a layer of a complex nitride or a layer of a complex carbonitride of Cr and Al, which forms a hard coating layer in a coated tool according to a comparative example. The dotted line in the vertical direction in the histogram represents a boundary at which the average crystal grain misorientation is 2°, and the bars on the right side of the dotted line in the vertical direction in FIG. 12 represent those with the average crystal grain misorientation of equal to or greater than 2°.

FIG. 11 shows an example of histogram of the average crystal grain misorientations (that is, GOS values) measured in the coated tool 18 according to the present invention, and FIG. 12 shows an example of histogram of the average crystal grain misorientations measured in the comparative coated tool 9.

In addition, for inclined angle frequency distribution of the hard coating layer, a section of the hard coating layer formed of the layer of the complex carbonitride of Cr and Al that had cubic structures was placed in a body tube of a field emission-type scanning electron microscope in a state in which the section was polished, the polished surface as a surface was analyzed in a region on the side of the surface (boundary surface) of the tool body and a region on the side of the surface, which were obtained by equally dividing the polished surface as a surface into two regions in the layer thickness direction, the individual crystal grains that had cubic crystal grain lattice that was present within the measurement ranges were irradiated with electron beams at an acceleration voltage of 10 kV at an incident angle of 70 degrees with an irradiation current of 1 nA, within the measurement ranges of the region on the side of the tool body and the region on the side of the surface in the direction perpendicular to the tool body, and for the width of 10 μm for five fields of view at intervals of 0.1 μm/step in the horizontal direction of the tool body, inclined angles of normal lines of {111} planes, which were crystal planes of the crystal grains, with respect to a normal line of the surface of the tool body (a direction perpendicular to the surface of the tool body in the polished section) were measured by using an electron backscatter diffraction image apparatus, measured inclined angles within a range of 0 to 45 degrees from among the measured inclined angles were divided into sections at a pitch of 0.25 degrees on the basis of the measurement results, and a ratio of the frequencies at which the measured inclined angles were present within a range of 0 to 12 degrees being obtained by aggregating the frequencies at which the measured inclined angles were present. The results are shown in Tables 35 and 36.

Figure 13:
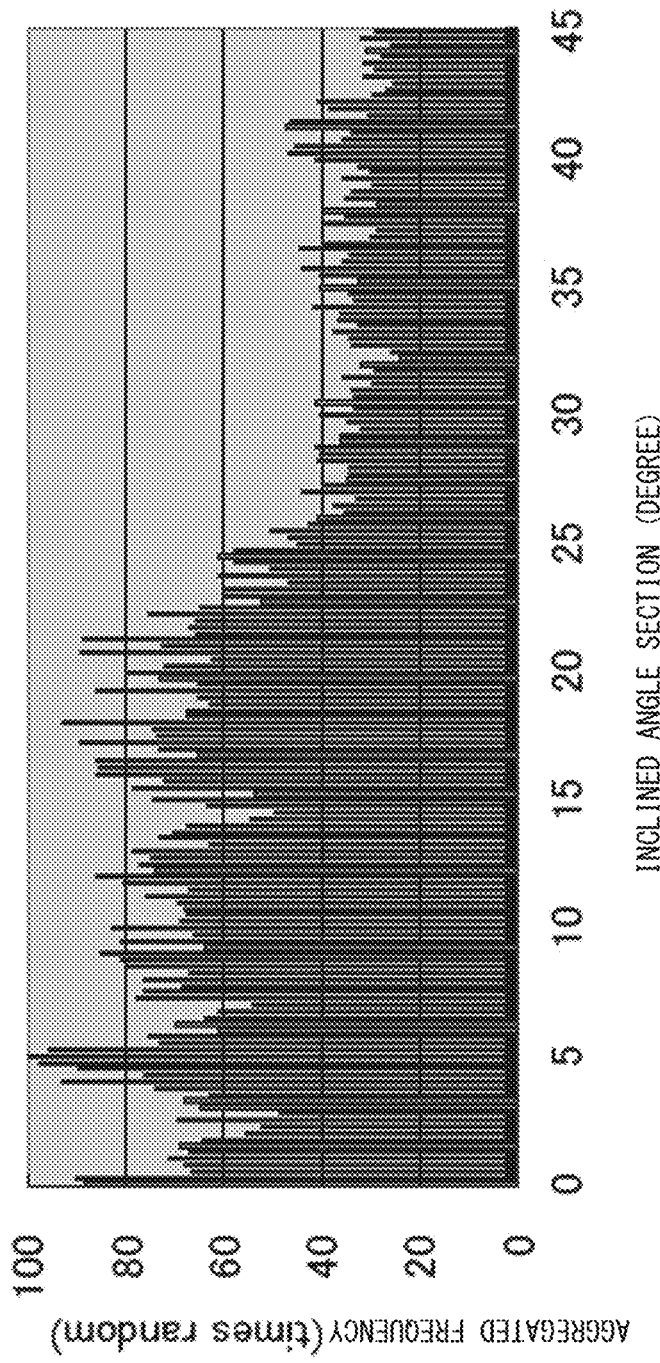
FIG. 13 shows an example of an inclined angle frequency distribution graph of a created {111} plane in a region on a side of a tool body of a layer of a complex nitride or a complex carbonitride of Cr and Al, which forms a hard coating layer in the coated tool according to the present invention. The aggregation frequency is represented by a relative value standardized on the assumption that the maximum aggregation frequency is 100.
Figure 14:
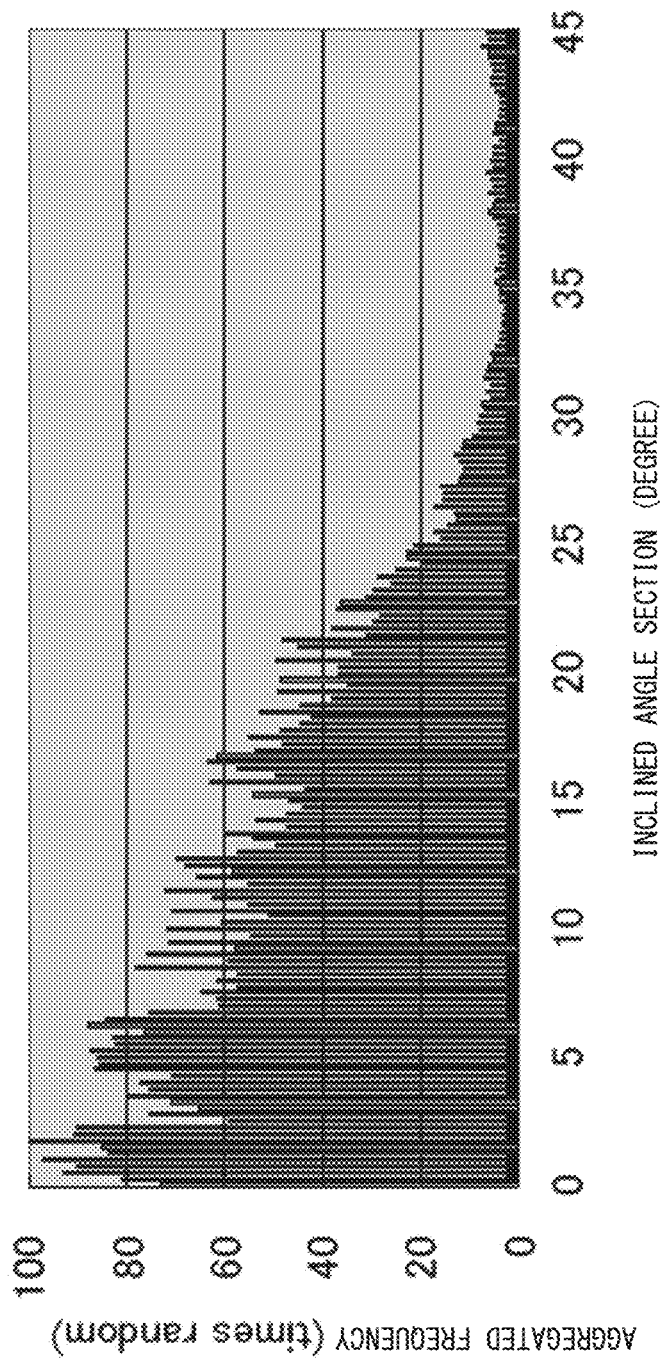
FIG. 14 shows an example of an inclined angle frequency distribution graph of a created {111} plane in a region on a side of a surface of a layer of a complex nitride or a complex carbonitride of Cr and Al, which forms a hard coating layer in the coated tool according to the present invention. The aggregation frequency is represented by a relative value standardized on the assumption that the maximum aggregation frequency is 100.

FIG. 13 shows an example of the inclined angle frequency distribution measured in the region on the side of the tool body of the hard coating layer that is formed of the layer of the complex carbonitride of Cr and Al of the coated tool according to the present invention, and FIG. 14 shows an example of the inclined angle frequency distribution measured in the region on the side of the surface of the hard coating layer that is formed of the layer of complex carbonitride of Cr and Al of the coated tool according to the present invention.

Further, analysis was performed at intervals of 0.1 μm in the vertical sectional direction by using an electron backscatter diffraction apparatus, measurement within a measurement range with a width of 10 μm and a vertical length of the film thickness in the vertical sectional direction was performed in five fields of view, the total number of pixels that belonged to the crystal grains that formed the layer of a complex nitride or a complex carbonitride was obtained, and the area ratio of the crystal grains which had cubic structures that had the layer of a complex nitride or a complex carbonitride and had the cubic structures was obtained from a ratio with respect to the total number of measured pixels in the measurement performed on the hard coating layer in the aforementioned five fields of view.

TABLE 31

| Constituent layer of hard coating layer | | | Forming conditions (pressure of reaction atmosphere indicates kPa and temperature indicates ° C.)Forming conditions | | |
|---|---|---|---|---|---|
| | | Formation | | Reaction atmosphere | |
| Type | | symbol | Reaction gas composition (% by volume) | Pressure | Temperature |
| $(Cr_{1-p}Al_p)(C_qN_{1-q})$ layer | CrAlCN | CrAlCN | See Table 32. | See Table 33. | See Table 33. |
| Ti compound layer | TiC | TiC | $TiCl_4$: 4.2%, $CH_4$: 8.5%, $H_2$: remainder | 7 | 900 |
| | TiN | TiN-1 | $TiCl_4$: 4.2%, $N_2$: 30%, $H_2$: remainder | 30 | 850 |
| | | TiN-2 | $TiCl_4$: 4.2%, $N_2$: 35%, $H_2$: remainder | 50 | 900 |
| | 1-TiCN | 1-TiCN | $TiCl_4$: 2%, $CH_3CN$: 0.7%, $N_2$: 10%, $H_2$: remainder | 7 | 900 |
| | TiCN | TiCN | $TiCl_4$: 2%, $CH_4$: 1%, $N_2$: 15%, $H_2$: remainder | 13 | 900 |
| | TiCO | TiCO | $TiCl_4$: 4.2%, CO: 4%, $H_2$: remainder | 7 | 900 |
| | TiCNO | TiCNO | $TiCl_4$: 2%, CO: 1%, $CH_4$: 1%, $N_2$: 5%, $H_2$: remainder | 13 | 900 |
| $Al_2O_3$ layer | $Al_2O_3$ | $Al_2O_3$ | $AlCl_3$: 2.2%, $CO_2$: 5.5%, HCl: 2.2%, $H_2S$: 0.2%, $H_2$: remainder | 7 | 900 |

TABLE 32

| Formation of hard coating layer | | Forming conditions (reaction gas composition is represented as ratio with respect to a total for the gas group A and the gas group B.) | | | | | | | |
|---|---|---|---|---|---|---|---|---|---|
| Process type | Formation symbol | Reaction gas group A composition (% by volume) | | | | Reaction gas group B composition (% by volume) | | | |
| Film forming process according to the present invention | A | $NH_3$: 1.0% | $N_2$: 1.0% | $H_2$: 60% | $AlCl_3$: 0.8% | $CrCl_3$: 0.3% | $N_2$: 13% | $Al(CH_3)_3$: 0% | $H_2$: remainder |
| | B | $NH_3$: 1.5% | $N_2$: 2.0% | $H_2$: 55% | $AlCl_3$: 0.6% | $CrCl_3$: 0.2% | $N_2$: 12.5% | $Al(CH_3)_3$: 0% | $H_2$: remainder |
| | C | $NH_3$: 1.5% | $N_2$: 2.0% | $H_2$: 60% | $AlCl_3$: 0.9% | $CrCl_3$: 0.2% | $N_2$: 12.8% | $Al(CH_3)_3$: 0% | $H_2$: remainder |
| | D | $NH_3$: 1.0% | $N_2$: 1.0% | $H_2$: 55% | $AlCl_3$: 0.9% | $CrCl_3$: 0.3% | $N_2$: 14% | $Al(CH_3)_3$: 0.5% | $H_2$: remainder |
| | E | $NH_3$: 1.5% | $N_2$: 1.0% | $H_2$: 55% | $AlCl_3$: 0.7% | $CrCl_3$: 0.2% | $N_2$: 13% | $Al(CH_3)_3$: 0% | $H_2$: remainder |
| | F | $NH_3$: 1.0% | $N_2$: 1.0% | $H_2$: 60% | $AlCl_3$: 0.8% | $CrCl_3$: 0.3% | $N_2$: 14% | $Al(CH_3)_3$: 0% | $H_2$: remainder |
| | G | $NH_3$: 1.0% | $N_2$: 2.0% | $H_2$: 55% | $AlCl_3$: 0.6% | $CrCl_3$: 0.3% | $N_2$: 13.5% | $Al(CH_3)_3$: 0.4% | $H_2$: remainder |
| | H | $NH_3$: 1.5% | $N_2$: 1.0% | $H_2$: 55% | $AlCl_3$: 0.7% | $CrCl_3$: 0.3% | $N_2$: 14.5% | $Al(CH_3)_3$: 0.2% | $H_2$: remainder |
| | I | $NH_3$: 1.0% | $N_2$: 2.0% | $H_2$: 60% | $AlCl_3$: 0.6% | $CrCl_3$: 0.2% | $N_2$: 13.5% | $Al(CH_3)_3$: 0% | $H_2$: remainder |
| | J | $NH_3$: 1.5% | $N_2$: 2.0% | $H_2$: 60% | $AlCl_3$: 0.7% | $CrCl_3$: 0.3% | $N_2$: 15% | $Al(CH_3)_3$: 0% | $H_2$: remainder |
| Comparative film forming process | A' | $NH_3$: 1.0% | $N_2$: 1.0% | $H_2$: 60% | $AlCl_3$: 0.8% | $CrCl_3$: 0.3% | $N_2$: 13% | $Al(CH_3)_3$: 0% | $H_2$: remainder |
| | B' | $NH_3$: 1.5% | $N_2$: 2.0% | $H_2$: 55% | $AlCl_3$: 0.6% | $CrCl_3$: 0.2% | $N_2$: 12.5% | $Al(CH_3)_3$: 0% | $H_2$: remainder |
| | C' | $NH_3$: 1.5% | $N_2$: 2.0% | $H_2$: 60% | $AlCl_3$: 0.9% | $CrCl_3$: 0.2% | $N_2$: 12.8% | $Al(CH_3)_3$: 0% | $H_2$: remainder |
| | D' | $NH_3$: 1.0% | $N_2$: 1.0% | $H_2$: 55% | $AlCl_3$: 0.9% | $CrCl_3$: 0.3% | $N_2$: 14% | $Al(CH_3)_3$: 0.5% | $H_2$: remainder |
| | E' | $NH_3$: 1.5% | $N_2$: 1.0% | $H_2$: 55% | $AlCl_3$: 0.7% | $CrCl_3$: 0.2% | $N_2$: 13% | $Al(CH_3)_3$: 0% | $H_2$: remainder |
| | F' | $NH_3$: 1.0% | $N_2$: 1.0% | $H_2$: 60% | $AlCl_3$: 0.8% | $CrCl_3$: 0.3% | $N_2$: 14% | $Al(CH_3)_3$: 0% | $H_2$: remainder |
| | G' | $NH_3$: 1.0% | $N_2$: 2.0% | $H_2$: 55% | $AlCl_3$: 0.6% | $CrCl_3$: 0.3% | $N_2$: 13.5% | $Al(CH_3)_3$: 0.4% | $H_2$: remainder |
| | H' | $NH_3$: 1.5% | $N_2$: 1.0% | $H_2$: 55% | $AlCl_3$: 0.7% | $CrCl_3$: 0.3% | $N_2$: 14.5% | $Al(CH_3)_3$: 0.2% | $H_2$: remainder |
| | I' | $NH_3$: 1.0% | $N_2$: 1.0% | $H_2$: 60% | $AlCl_3$: 0.6% | $CrCl_3$: 0.2% | $N_2$: 13.5% | $Al(CH_3)_3$: 0% | $H_2$: remainder |
| | J' | $NH_3$: 1.5% | $N_2$: 2.0% | $H_2$: 60% | $AlCl_3$: 0.7% | $CrCl_3$: 0.3% | $N_2$: 15% | $Al(CH_3)_3$: 0% | $H_2$: remainder |

TABLE 33

| Formation of hard coating layer | | Forming conditions (pressure of reaction atmosphere indicates kPa and temperature indicates ° C.) Forming conditions | | | | | | |
|---|---|---|---|---|---|---|---|---|
| | | Gas group A | | Gas group B | | Phase difference in supply between gas group A and gas group B | | |
| | | | | | | | Reaction atmosphere | |
| Process type | Formation symbol | Supply cycle (seconds) | Supply time per cycle (seconds) | Supply cycle (seconds) | Supply time per cycle (seconds) | (seconds) | Pressure | Temperature |
| Film forming process according to the present invention | A | 4 | 0.2 | 4 | 0.2 | 0.1 | 5 | 850 |
| | B | 5 | 0.2 | 5 | 0.2 | 0.15 | 4.7 | 800 |
| | C | 1.2 | 0.25 | 1.2 | 0.25 | 0.2 | 4.7 | 900 |
| | D | 2 | 0.25 | 2 | 0.25 | 0.15 | 5 | 750 |
| | E | 1 | 0.2 | 1 | 0.2 | 0.15 | 4.7 | 800 |
| | F | 2.5 | 0.2 | 2.5 | 0.2 | 0.1 | 4.7 | 750 |
| | G | 4.5 | 0.2 | 4.5 | 0.2 | 0.1 | 4.7 | 800 |
| | H | 2.5 | 0.2 | 2.5 | 0.2 | 0.15 | 4.5 | 800 |

TABLE 33-continued

Forming conditions (pressure of reaction atmosphere indicates kPa and temperature indicates ° C.) Forming conditions

| Process type | Formation of hard coating layer Formation symbol | Gas group A Supply cycle (seconds) | Gas group A Supply time per cycle (seconds) | Gas group B Supply cycle (seconds) | Gas group B Supply time per cycle (seconds) | Phase difference in supply between gas group A and gas group B (seconds) | Reaction atmosphere Pressure | Reaction atmosphere Temperature |
|---|---|---|---|---|---|---|---|---|
| | I | 1.5 | 0.15 | 1.5 | 0.15 | 0.1 | 4.7 | 750 |
| | J | 3 | 0.15 | 3 | 0.15 | 0.1 | 4.5 | 800 |
| Comparative film forming process | A' | — | — | — | — | — | 5 | 850 |
| | B' | — | — | — | — | — | 4.7 | 800 |
| | C' | — | — | — | — | — | 4.7 | 900 |
| | D' | — | — | — | — | — | 5 | 750 |
| | E' | — | — | — | — | — | 4.7 | 800 |
| | F' | — | — | — | — | — | 4.7 | 750 |
| | G' | — | — | — | — | — | 4.7 | 800 |
| | H' | — | — | — | — | — | 4.5 | 800 |
| | I' | — | — | — | — | — | 4.7 | 750 |
| | J' | — | — | — | — | — | 4.5 | 800 |

TABLE 34

Hard coating layer (Numerical values in the lower sections represent target average layer thickness (μm) of the layer.)

| Type | Tool body symbol | Lower layer First layer | Lower layer Second layer | Lower layer Third layer |
|---|---|---|---|---|
| Coated tools according to the present invention/ Comparative coated tools/ Reference coated tools | 61 A | — | — | — |
| | 62 B | — | — | — |
| | 63 C | — | — | — |
| | 64 D | — | — | — |
| | 65 A | — | — | — |
| | 66 B | TiC (0.5) | — | — |
| | 67 C | TiN-1 (0.3) | — | — |
| | 68 D | TiN-1 (0.5) | 1-TiCN (4) | — |
| | 69 A | TiN-1 (0.3) | 1-TiCN (2) | TiCN (0.7) |
| | 70 B | — | — | — |
| | 71 C | TiN-1 (0.5) | — | — |
| | 72 D | TiC (1) | — | — |
| | 73 A | TiN-1 (0.1) | — | — |
| | 74 B | — | — | — |
| | 75 C | — | — | — |

TABLE 35

Hard coating layer CrAl complex carbide or carbonitride layer $(Cr_{1-p}Al_p)(C_qN_{1-q})$

| Type | Tool body symbol | Formation symbol of process of forming CrAlCN (See Tables 4 and 5) | Content ratio $x_{avg}$ of Al | Content ratio of $y_{avg}$ of C | Area ratio of crystal grains having average crystal grain misorientation equal to or greater than 2 degrees (%) | Area ratio of cubic crystal (%) | Average crystal grain width W of crystal grains (μm) |
|---|---|---|---|---|---|---|---|
| Coated tools according to the present invention | 61 | A | A | 0.74 | 0.0001 or less | 41 | 100 | 1.1 |
| | 62 | B | B | 0.82 | 0.0001 or less | 51 | 100 | 1.1 |
| | 63 | C | C | 0.93 | 0.0001 or less | 35 | 89 | 0.6 |
| | 64 | D | D | 0.95 | 0.0042 | 35 | 65 | 0.1 |
| | 65 | A | E | 0.93 | 0.0001 or less | 42 | 99 | 0.8 |
| | 66 | B | F | 0.74 | 0.0001 or less | 36 | 100 | 0.8 |
| | 67 | C | G | 0.89 | 0.0035 | 20 | 100 | 0.2 |
| | 68 | D | H | 0.83 | 0.0013 | 63 | 100 | 0.5 |
| | 69 | A | I | 0.79 | 0.0001 or less | 30 | 100 | 0.4 |

TABLE 35-continued

| | | | | | | | |
|---|---|---|---|---|---|---|---|
| 70 | B | J | 0.70 | 0.0001 or less | 54 | 100 | 0.30 |
| 71 | C | A | 0.75 | 0.0001 or less | 39 | 100 | 0.9 |
| 72 | D | B | 0.81 | 0.0001 or less | 58 | 100 | 1.3 |
| 73 | A | C | 0.92 | 0.0001 or less | 38 | 92 | 1.2 |
| 74 | B | D | 0.94 | 0.0041 | 39 | 72 | 0.5 |
| 75 | C | E | 0.92 | 0.0001 or less | 38 | 96 | 1.1 |

| | | Hard coating layer |
|---|---|---|
| | | CrAl complex carbide or carbonitride layer $(Cr_{1-p}Al_p)(C_qN_{1-q})$ |

| Type | | Average aspect ratio A of crystal grains | Distribution ratio of frequencies at which inclined angles of normal lines of {111} planes are present in a range of 0 to 12 degrees in the region on the side of the tool body $M_{deg}$ | Distribution ratio of frequencies at which inclined angles of normal lines of {111} planes are present in a range of 0 to 12 degrees in the region on the side of the surface $N_{deg}$ | Inclined angle section in which the highest peak is observed in the region on the side of the surface (degrees) | Target layer thickness (μm) | Upper layer (Numerical values in the lower sections represent target average layer thicknesses (μm) of the layers.) | |
|---|---|---|---|---|---|---|---|---|
| | | | | | | | First layer | Second layer |
| Coated tools according to the present invention | 61 | 1.5 | 32 | 54 | 7.75 to 8.00 | 6 | — | — |
| | 62 | 2.1 | 28 | 56 | 4.75 to 5.00 | 4 | — | — |
| | 63 | 2.6 | 25 | 48 | 3.00 to 3.25 | 4.5 | — | — |
| | 64 | 3.1 | 40 | 61 | 4.25 to 4.50 | 2.5 | — | — |
| | 65 | 4.7 | 15 | 30 | 5.25 to 5.50 | 5 | — | — |
| | 66 | 2.3 | 16 | 39 | 9.00 to 9.25 | 3.5 | — | — |
| | 67 | 3.2 | 21 | 40 | 6.00 to 6.25 | 2 | — | — |
| | 68 | 2.2 | 28 | 45 | 4.50 to 4.75 | 3 | — | — |
| | 69 | 8.5 | 10 | 39 | 8.50 to 8.75 | 7 | — | — |
| | 70 | 1.5 | 31 | 52 | 6.75 to 7.00 | 4 | $Al_2O_3$ (2.5) | — |
| | 71 | 2.4 | 25 | 44 | 5.50 to 5.75 | 3 | TiCN (0.5) | $Al_2O_3$ (3) |
| | 72 | 2.8 | 29 | 59 | 4.25 to 4.50 | 5 | TiCO (1) | $Al_2O_3$ (2) |
| | 73 | 3.8 | 31 | 45 | 3.50 to 3.75 | 6 | TiCNO (0.3) | $Al_2O_3$ (1) |
| | 74 | 4.2 | 40 | 63 | 5.00 to 5.25 | 7 | — | — |
| | 75 | 3.1 | 17 | 29 | 4.50 to 4.75 | 8 | — | — |

TABLE 36

| | | | Hard coating layer |
|---|---|---|---|
| | | | CrAl complex carbide or carbonitride layer $(Cr_{1-p}Al_p)(C_qN_{1-q})$ |

| Type | | Tool body symbol | Formation symbol of process of forming CrAlCN (See Tables 4 and 5) | Content ratio $x_{avg}$ of Al | Content ratio of $y_{avg}$ of C | Area ratio of crystal grains having average crystal grain misorientation equal to or greater than 2 degrees (%) | Area ratio of cubic crystal (%) | Average crystal grain width W of crystal grains (μm) |
|---|---|---|---|---|---|---|---|---|
| Comparative coated tools | 61 | A | A' | 0.76 | 0.0001 or less | 4 | 98 | 0.9 |
| | 62 | B | B' | 0.83 | 0.0001 or less | 9 | 93 | 0.8 |
| | 63 | C | C' | 0.91 | 0.0001 or less | 6 | 91 | 0.4 |
| | 64 | D | D' | 0.94 | 0.0039 | 6 | 81 | 0.2 |
| | 65 | A | E' | 0.91 | 0.0001 or less | 7 | 97 | 0.7 |
| | 66 | B | F' | 0.73 | 0.0001 or less | 4 | 100 | 0.8 |

TABLE 36-continued

| | | | | | | | | |
|---|---|---|---|---|---|---|---|---|
| | | 67 | C | G' | 0.88 | 0.0023 | 0 | 96 | 0.2 |
| | | 68 | D | H' | 0.81 | 0.0022 | 4 | 100 | 0.4 |
| | | 69 | A | I' | 0.77 | 0.0001 or less | 13 | 100 | 0.4 |
| | | 70 | B | J' | 0.71 | 0.0001 or less | 5 | 100 | 0.40 |
| | | 71 | C | A' | 0.78 | 0.0001 or less | 8 | 98 | 0.8 |
| | | 72 | D | B' | 0.81 | 0.0001 or less | 6 | 92 | 0.7 |
| | | 73 | A | C' | 0.94 | 0.0001 or less | 5 | 93 | 1.1 |
| Reference coated tools | 74 | B | AIP | 0.69 | 0.0001 or less | 14 | 100 | 1.4 |
| | 75 | C | AIP | 0.59 | 0.0001 or less | 11 | 100 | 0.7 |

| | | Hard coating layer | | | | | |
|---|---|---|---|---|---|---|---|
| | | CrAl complex carbide or carbonitride layer $(Cr_{1-p}Al_p)(C_qN_{1-q})$ | | | | | |
| Type | | Average aspect ratio A of crystal grains | Distribution ratio of frequencies at which inclined angles of normal lines of {111} planes are present in a range of 0 to 12 degrees in the region on the side of the tool body $M_{deg}$ | Distribution ratio of frequencies at which inclined angles of normal lines of {111} planes are present in a range of 0 to 12 degrees in the region on the side of the surface $N_{deg}$ | Inclined angle section in which the highest peak is observed in the region on the side of the surface (degrees) | Target layer thickness (µm) | Upper layer (Numerical values in the lower sections represent target average layer thicknesses (µm) of the layers.) | |
| | | | | | | | First layer | Second layer |
| Comparative coated tools | 61 | 2.5 | 34 | 43 | 23.25 to 23.50 | 6 | — | — |
| | 62 | 1.5 | 33 | 37 | 21.25 to 21.50 | 4 | — | — |
| | 63 | 2.2 | 26 | 32 | 28.25 to 28.50 | 4.5 | — | — |
| | 64 | 2.6 | 34 | 28 | 18.25 to 18.50 | 2.5 | — | — |
| | 65 | 4.8 | 25 | 32 | 35.00 to 35.25 | 5 | — | — |
| | 66 | 2.6 | 19 | 22 | 28.25 to 28.50 | 3.5 | — | — |
| | 67 | 3.1 | 27 | 22 | 32.75 to 33.00 | 2 | — | — |
| | 68 | 1.9 | 22 | 25 | 31.00 to 31.25 | 3 | — | — |
| | 69 | 7.6 | 24 | 21 | 26.75 to 27.00 | 7 | — | — |
| | 70 | 2.1 | 24 | 28 | 23.25 to 23.50 | 4 | $Al_2O_3$ (2.5) | — |
| | 71 | 1.9 | 32 | 41 | 25.50 to 25.75 | 3 | TiCN (0.5) | $Al_2O_3$ (3) |
| | 72 | 2.4 | 26 | 34 | 17.25 to 17.50 | 5 | TiCO (1) | $Al_2O_3$ (2) |
| | 73 | 3.5 | 35 | 28 | 41.50 to 41.75 | 6 | TiCNO (0.3) | $Al_2O_3$ (1) |
| Reference coated tools | 74 | 3.3 | 27 | 32 | 28.25 to 28.50 | 7 | — | — |
| | 75 | 2.8 | 25 | 31 | 30.25 to 30.50 | 6 | — | — |

(Note)
"AIP" indicates a film formed through arc ion plating.

Next, all the aforementioned variety of coated tools, namely coated tools 61 to 75 according to the present invention, Comparative coated tools 61 to 73, and Reference coated tools 74 and 75 were subjected to the following dry high-speed face milling and a center cutting machining test, which are types of high-speed intermittent cutting of carbon steel, in a state in which the coated tools were clamped with fixing jigs at tip ends of cutters made of tool steel with a cutter diameter of 125 mm, and wear width of a flank faces at all the cutting edges were measured. The results are shown in Table 37.

Tool body: tungsten-carbide-based cemented carbide, titanium-carbonitride-based cermet Cutting test: dry high-speed face milling, center cutting machining Work material: block material of JIS•S55C with a width of 100 mm and a length of 400 mm Rotation speed: 713 min$^{-1}$ Cutting speed: 280 m/min Depth of cut: 2.5 mm Feed rate per tooth: 0.25 mm/tooth Cutting time: 8 minutes

TABLE 37

| Type | | Wear width of a flank face (mm) | Type | | Cutting test result (minutes) |
|---|---|---|---|---|---|
| Coated tools according to the present invention | 61 | 0.13 | Comparative coated tools | 61 | 2.3* |
| | 62 | 0.07 | | 62 | 3.7* |
| | 63 | 0.08 | | 63 | 3.1* |
| | 64 | 0.14 | | 64 | 2.0* |
| | 65 | 0.09 | | 65 | 4.2* |
| | 66 | 0.08 | | 66 | 4.2* |
| | 67 | 0.10 | | 67 | 4.0* |
| | 68 | 0.11 | | 68 | 1.9* |
| | 69 | 0.08 | | 69 | 4.4* |
| | 70 | 0.13 | | 70 | 2.5* |
| | 71 | 0.12 | | 71 | 2.1* |
| | 72 | 0.07 | | 72 | 4.4* |
| | 73 | 0.10 | | 73 | 4.3* |
| | 74 | 0.09 | Reference coated tools | 74 | 3.8* |
| | 75 | 0.12 | | 75 | 2.8* |

The * marks in the sections of the comparative coated tools and the reference coated tools denote cutting times (minutes) at which life end was reached due to the occurrence of chipping.

Example 6

Tool bodies α to γ made of WC-based cemented carbide and a tool body δ made of TiCN-based cermet with insert shapes of ISO standard SEEN1203AFSN, which was similar to that in Example 2, were respectively manufactured.

Next, coated tools 76 to 90 according to the present invention shown in Table 39 were manufactured by using a chemical vapor deposition apparatus on the surfaces of these tool bodies α to γ and the tool body δ to deposit hard coating layers with target layer thicknesses, which included at least $(Cr_{1-p}Al_p)(C_qN_{1-q})$, under the conditions shown in Tables 32 and 33 by a method similar to that in Example 5.

Note that the lower layers shown in Table 38 and/or the upper layers shown in Table 39 were formed for coated tools 79 to 88 according to the present invention under the forming conditions shown in Table 31.

In addition, for the purpose of comparison, Comparative coated tools 76 to 88 shown in Table 40 were similarly manufactured by using an ordinary chemical vapor deposition apparatus on the surfaces of these tool bodies α to γ and the tool body δ to deposit hard coating layers with target layer thicknesses shown in Table 40 under the conditions shown in Tables 32 and 33 in a manner similar to that for the coated tools according to the present invention.

Note that the lower layers shown in Table 38 and/or the upper layers shown in Table 40 were formed for Comparative coated tools 79 to 88 under the forming conditions shown in Table 31 in a manner similar to that for coated tools 79 to 88 according to the present invention.

For reference, Reference coated tools 89 and 90 shown in Table 40 were manufactured by depositing $(Cr_{1-p}Al_p)(C_qN_{1-q})$ layers in the reference examples with target layer thicknesses on the surfaces of the tool body β and the tool body γ by arc ion plating using a physical vapor deposition apparatus in the related art.

Note that conditions similar to the conditions shown in Example 5 were used as conditions for the arc ion plating.

In addition, a scanning electron microscope (magnification: 5000 times) was used to measure sections of the respective constituent layers of coated tools 76 to 90 according to the present invention, Comparative coated tools 76 to 88, and Reference coated tools 89 and 90, and layer thicknesses at five points in an observation field of view were measured and averaged to obtain average layer thicknesses. All the layers had average layer thicknesses that were substantially the same as the target layer thicknesses shown in Tables 39 to 40.

Furthermore, crystal orientations of the individual crystal grains which had cubic structures that formed the layer of a complex nitride or a complex carbonitride of Cr and Al were analyzed in the vertical sectional direction by using an electron backscatter diffraction apparatus, and crystal grain misorientations were mapped by dividing a range of 0 to 10 degrees into sections of each 1 degree, that is, a section of equal to or greater than 0 degrees and less than 1 degree, a section of equal to or greater than 1 degree and less than 2 degrees, a section of equal to or greater than 2 degrees and less than 3 degrees, a section of equal to or greater than 3 degrees and less than 4 degrees, and the like. Average crystal grain misorientations and an area ratio of the crystal grains with the average crystal grain misorientations of 2 degrees or greater with respect to the entire layer of a complex nitride or a complex carbonitride of Cr and Al were obtained from the mapping diagram. The results are shown in Tables 39 and 40.

In addition, for inclined angle frequency distribution of the hard coating layer, a section of the hard coating layer formed of the layer of the complex carbonitride of Cr and Al that had cubic structures was placed in a body tube of a field emission-type scanning electron microscope in a state in which the section was polished, the polished surface as a surface was analyzed in a region on the side of the surface (boundary surface) of the tool body and a region on the side of the surface, which were obtained by equally dividing the polished surface as a surface into two regions in the layer thickness direction, the individual crystal grains that had cubic crystal grain lattice that was present within measurement ranges in the region on the side of the tool body and in the region on the side of the surface were irradiated with electron beams at an acceleration voltage of 10 kV at an incident angle of 70 degrees with an irradiation current of 1 nA, inclined angles of normal lines of {111} planes, which were crystal planes of the crystal grains, with respect to a normal line of the surface of the tool body (a direction perpendicular to the surface of the tool body in the polished section) were measured for the width of 10 μm for five fields of view at intervals of 0.1 μm/step in the horizontal direction of the tool body by using an electron backscatter diffraction image apparatus, measured inclined angles within a range of 0 to 45 degrees from among the measured inclined angles were divided into sections at a pitch of 0.25 degrees on the basis of the measurement results, and frequencies at which the measured inclined angles were present in the respective sections were aggregated, thereby a ratio of frequencies at which the measured inclined angles were present within a range of 0 to 12 degrees being obtained. The results are shown in Tables 39 and 40.

TABLE 38

| | | Hard coating layer (Numerical values in the lower sections represent target average layer thickness (μm) of the layer.) | | | |
|---|---|---|---|---|---|
| | | Lower layer | | | |
| Type | Tool body symbol | First layer | Second layer | Third layer | Fourth layer |
| Coated tools according to the present invention/Comparative coated tools/Reference coated tools | 76 α | — | — | — | — |
| | 77 β | — | — | — | — |
| | 78 γ | — | — | — | — |
| | 79 δ | TiC (0.5) | — | — | — |
| | 80 α | TiN-1 (0.1) | — | — | — |
| | 81 β | TiN-1 (0.5) | 1-TiCN (7) | — | — |
| | 82 γ | TiN-1 (0.3) | 1-TiCN (10) | TiN-2 (0.7) | — |
| | 83 δ | TiN-1 (0.3) | 1-TiCN (4) | TiCN (0.4) | TiN-2 (0.3) |
| | 84 α | — | — | — | — |
| | 85 β | TiN-1 (0.5) | — | — | — |
| | 86 γ | TiC (1) | — | — | — |
| | 87 δ | TiN-1 (0.1) | — | — | — |
| | 88 α | TiN-1 (0.1) | — | — | — |
| | 89 β | — | — | — | — |
| | 90 γ | — | — | — | — |

TABLE 39

| | | | Hard coating layer CrAl complex carbide, carbonitride layer $(Cr_{1-p}Al_p)(C_qN_{1-q})$ | | | | | |
|---|---|---|---|---|---|---|---|---|
| Type | Tool body symbol | Formation symbol of process of forming CrAlCN (See Tables 4 and 5) | Content ratio $x_{avg}$ of Al | Content ratio of $y_{avg}$ of C | Area ratio of crystal grains having average crystal grain misorientation equal to or greater than 2 degrees (%) | Area ratio of cubic crystal (%) | Average crystal grain width W of crystal grains (μm) | Average aspect ratio A of crystal grains |
| Coated tools according to the present invention | 76 α | A | 0.75 | 0.0001 or less | 28 | 97 | 2.0 | 5.6 |
| | 77 β | B | 0.80 | 0.0001 or less | 59 | 98 | 1.8 | 5.8 |
| | 78 γ | C | 0.94 | 0.0001 or less | 46 | 96 | 1.8 | 5.9 |
| | 79 δ | D | 0.93 | 0.0041 | 44 | 79 | 0.6 | 4.8 |
| | 80 α | E | 0.91 | 0.0001 or less | 24 | 93 | 0.4 | 10.0 |
| | 81 β | F | 0.75 | 0.0001 or less | 39 | 100 | 0.9 | 3.2 |
| | 82 γ | G | 0.87 | 0.0033 | 55 | 95 | 0.7 | 2.1 |
| | 83 δ | H | 0.82 | 0.0021 | 33 | 100 | 1.2 | 4.2 |
| | 84 α | I | 0.77 | 0.0001 or less | 48 | 98 | 1.4 | 10.0 |
| | 85 β | J | 0.72 | 0.0001 or less | 51 | 100 | 0.5 | 2.0 |
| | 86 γ | A | 0.78 | 0.0001 or less | 31 | 97 | 1.2 | 3.2 |
| | 87 δ | B | 0.82 | 0.0001 or less | 61 | 96 | 1.7 | 8.2 |
| | 88 α | C | 0.93 | 0.0001 or less | 42 | 95 | 1.2 | 2.1 |
| | 89 β | D | 0.95 | 0.0037 | 42 | 81 | 0.5 | 5.3 |
| | 90 γ | E | 0.90 | 0.0001 or less | 22 | 96 | 0.7 | 8.6 |

TABLE 39-continued

Hard coating layer

CrAl complex carbide, carbonitride layer $(Cr_{1-p}Al_p)(C_qN_{1-q})$

| Type | | Distribution ratio of frequencies at which inclined angles of normal lines of {111} planes are present in a range of 0 to 12 degrees in the region on the side of the tool body $M_{deg}$ | Distribution ratio of frequencies at which inclined angles of normal lines of {111} planes are present in a range of 0 to 12 degrees in the region on the side of the surface $N_{deg}$ | Inclined angle section in which the highest peak is observed in the region on the side of the surface (degrees) | Target layer thickness (μm) | Upper layer (Numerical values in the lower sections represent target average layer thicknesses (μm) of the layer.) | | | |
|---|---|---|---|---|---|---|---|---|---|
| | | | | | | First layer | Second layer | Third layer | Fourth layer |
| Coated tools according to the present invention | 76 | 38 | 49 | 11.75 to 12.00 | 16 | — | — | — | — |
| | 77 | 38 | 67 | 5.25 to 5.50 | 12 | — | — | — | — |
| | 78 | 33 | 55 | 4.75 to 5.00 | 15 | — | — | — | — |
| | 79 | 40 | 61 | 3.75 to 4.00 | 7 | — | — | — | — |
| | 80 | 10 | 38 | 10.00 to 10.25 | 6 | — | — | — | — |
| | 81 | 24 | 44 | 3.50 to 3.75 | 7 | — | — | — | — |
| | 82 | 29 | 56 | 2.75 to 3.00 | 3 | TiN-2 (0.7) | — | — | — |
| | 83 | 16 | 30 | 3.75 to 4.00 | 8 | TiCN (0.4) | TiN-2 (0.3) | — | — |
| | 84 | 21 | 49 | 7.25 to 7.50 | 20 | Al$_2$O$_3$ (2) | — | — | — |
| | 85 | 29 | 59 | 5.75 to 6.00 | 4 | TiCN (0.5) | Al$_2$O$_3$ (2.5) | — | — |
| | 86 | 36 | 52 | 8.75 to 9.00 | 5 | TiCO (1) | Al$_2$O$_3$ (2) | — | — |
| | 87 | 40 | 70 | 4.50 to 4.75 | 16 | TiCNO (0.3) | Al$_2$O$_3$ (1) | — | — |
| | 88 | 36 | 52 | 6.00 to 6.25 | 4 | TiN-2 (0.3) | TiCN (0.8) | TiCNO (0.3) | Al$_2$O$_3$ (3) |
| | 89 | 38 | 59 | 2.00 to 2.25 | 9 | — | — | — | — |
| | 90 | 15 | 42 | 6.00 to 6.25 | 11 | — | — | — | — |

TABLE 40

Hard coating layer
CrAl complex carbide, carbonitride layer $(Cr_{1-p}Al_p)(C_qN_{1-q})$

| Type | | Tool body symbol | Formation symbol of process of forming CrAlCN (See Tables 4 and 5) | Content ratio $x_{avg}$ of Al | Content ratio $y_{avg}$ of C | Area ratio of crystal grains having average crystal grain misorientation equal to or greater than 2 degrees (%) | Area ratio of cubic crystal (%) | Average crystal grain width W of crystal grains (μm) | Average aspect ratio A of crystal grains |
|---|---|---|---|---|---|---|---|---|---|
| Comparative coated tools | 76 | α | A' | 0.76 | 0.0001 or less | 3 | 100 | 2.0 | 4.8 |
| | 77 | β | B' | 0.83 | 0.0001 or less | 6 | 100 | 1.6 | 6.8 |
| | 78 | γ | C' | 0.92 | 0.0001 or less | 4 | 96 | 1.7 | 5.4 |
| | 79 | δ | D' | 0.95 | 0.0038 | 1 | 78 | 0.7 | 3.9 |
| | 80 | α | E' | 0.90 | 0.0001 or less | 6 | 99 | 0.6 | 7.3 |
| | 81 | β | F' | 0.74 | 0.0001 or less | 4 | 100 | 0.8 | 4.2 |
| | 82 | γ | G' | 0.90 | 0.0029 | 10 | 94 | 0.4 | 2.2 |
| | 83 | δ | H' | 0.83 | 0.0017 | 5 | 100 | 1.3 | 3.8 |

TABLE 40-continued

|  | | | | | | | | | |
|---|---|---|---|---|---|---|---|---|---|
| | 84 | α | I' | 0.79 | 0.0001 or less | 5 | 95 | 1.3 | 8.9 |
| | 85 | β | J' | 0.69 | 0.0001 or less | 6 | 100 | 0.3 | 1.9 |
| | 86 | γ | A' | 0.74 | 0.0001 or less | 6 | 100 | 1.1 | 2.8 |
| | 87 | δ | B' | 0.79 | 0.0001 or less | 7 | 98 | 1.5 | 7.3 |
| | 88 | α | C' | 0.91 | 0.0001 or less | 7 | 91 | 0.80 | 2.6 |
| Reference coated tools | 89 | β | AIP | 0.70 | 0.0001 or less | 12 | 100 | 1.5 | 3.3 |
| | 90 | γ | AIP | 0.60 | 0.0001 or less | 13 | 100 | 1.6 | 5.1 |

Hard coating layer

CrAl complex carbide, carbonitride layer $(Cr_{1-p}Al_p)(C_qN_{1-q})$

| Type | | Distribution ratio of frequencies at which inclined angles of normal lines of {111} planes are present in a range of 0 to 12 degrees in the region on the side of the tool body $M_{deg}$ | Distribution ratio of frequencies at which inclined angles of normal lines of {111} planes are present in a range of 0 to 12 degrees in the region on the side of the surface $N_{deg}$ | Inclined angle section in which the highest peak is observed in the region on the side of the surface (degrees) | Target layer thickness (μm) | Upper layer (Numerical values in the lower sections represent target average layer thicknesses (μm) of the layer.) | | | |
|---|---|---|---|---|---|---|---|---|---|
| | | | | | | | First layer | Second layer | Third layer | Fourth layer |
| Comparative coated tools | 76 | 18 | 23 | 32.00 to 32.25 | 16 | — | — | — | — |
| | 77 | 29 | 36 | 32.25 to 32.50 | 12 | — | — | — | — |
| | 78 | 27 | 22 | 33.25 to 33.50 | 15 | — | — | — | — |
| | 79 | 26 | 22 | 15.25 to 15.50 | 7 | — | — | — | — |
| | 80 | 34 | 43 | 24.50 to 24.75 | 6 | — | — | — | — |
| | 81 | 15 | 18 | 33.25 to 33.50 | 7 | — | — | — | — |
| | 82 | 24 | 19 | 26.75 to 27.00 | 3 | TiN-2 (0.7) | — | — | — |
| | 83 | 31 | 28 | 34.25 to 34.50 | 8 | TiCN (0.4) | TiN-2 (0.3) | — | — |
| | 84 | 23 | 18 | 42.50 to 42.75 | 20 | Al$_2$O$_3$ (2) | — | — | — |
| | 85 | 26 | 31 | 32.00 to 32.25 | 4 | TiCN (0.5) | Al$_2$O$_3$ (2.5) | — | — |
| | 86 | 21 | 25 | 29.25 to 29.50 | 5 | TiCO (1) | Al$_2$O$_3$ (2) | — | — |
| | 87 | 25 | 31 | 27.25 to 27.50 | 16 | TiCNO (0.3) | Al$_2$O$_3$ (1) | — | — |
| | 88 | 31 | 27 | 36.75 to 37.00 | 4 | TiN-2 (0.3) | TiCN (0.8) | TiCNO (0.3) | Al$_2$O$_3$ (3) |
| Reference coated tools | 89 | 26 | 33 | 31.75 to 32.00 | 9 | — | — | — | — |
| | 90 | 28 | 36 | 29.25 to 29.50 | 11 | — | — | — | — |

(Note)
"AIP" indicates a film formed through arc ion plating.

Next, all the aforementioned variety of coated tools, namely coated tools 76 to 90 according to the present invention, Comparative coated tools 76 to 88, and Reference coated tools 89 and 90 were subjected to the following dry high-speed intermittent cutting test of carbon steel and a wet high-speed intermittent cutting test of ductile cast iron in a state in which the coated tools were screw-fixed with fixing jigs at tip ends of cutting tools made of tool steel, and wear width of a flank faces at all the cutting edges were measured.

Cutting condition 1:
Work material: round bar of JIS•S15C with four longitudinal grooves at an equal interval in a length direction
Cutting speed: 290 m/min
Depth of cut: 2.5 mm
Feed: 0.32 mm/rev
Cutting time: 5 minutes
(The ordinary cutting speed is 220 m/min)
Cutting condition 2:
Work material: round bar of JIS•FCD450 with four longitudinal grooves at an equal interval in a length direction Cutting speed: 270 m/min
Depth of cut: 2.0 mm
Feed: 0.32 mm/rev
Cutting time: 5 minutes
(The ordinary cutting speed is 200 m/min)
Table 41 shows results of the cutting test.

TABLE 41

| Type | | Wear width of a flank face (mm) | | Type | | Cutting test result (minutes) | |
|---|---|---|---|---|---|---|---|
| | | Cutting condition 1 | Cutting condition 2 | | | Cutting condition 1 | Cutting condition 2 |
| Coated tools according to the present invention | 76 | 0.21 | 0.23 | Comparative coated tools | 76 | 4.0* | 2.4* |
| | 77 | 0.10 | 0.12 | | 77 | 4.7* | 3.5* |
| | 78 | 0.19 | 0.10 | | 78 | 2.3* | 4.3* |
| | 79 | 0.22 | 0.14 | | 79 | 2.4* | 3.9* |
| | 80 | 0.18 | 0.20 | | 80 | 4.4* | 2.7* |
| | 81 | 0.13 | 0.11 | | 81 | 4.5* | 3.0* |
| | 82 | 0.19 | 0.22 | | 82 | 4.2* | 1.8* |
| | 83 | 0.21 | 0.13 | | 83 | 3.2* | 4.4* |
| | 84 | 0.15 | 0.21 | | 84 | 3.9* | 2.4* |
| | 85 | 0.23 | 0.23 | | 85 | 2.5* | 1.9* |
| | 86 | 0.22 | 0.16 | | 86 | 2.9* | 4.1* |
| | 87 | 0.12 | 0.20 | | 87 | 4.8* | 4.2* |
| | 88 | 0.20 | 0.17 | | 88 | 3.6* | 2.5* |
| | 89 | 0.16 | 0.22 | Reference coated tools | 89 | 4.3* | 2.3* |
| | 90 | 0.22 | 0.18 | | 90 | 3.4* | 3.7* |

The * marks in sections of the comparative coated tools and the reference coated tools denote cutting times (minutes) at which life end was reached due to the occurrence of chipping.

From the results shown in Tables 37 and 41, hardness was improved due to strain of the crystal grains, and toughness is improved while high wear resistance is maintained in the coated tools according to the present invention, by the predetermined average crystal grain misorientations being present in the crystal grains which formed the layer of a complex nitride or a complex carbonitride of Al and Cr that formed the hard coating layer and which had cubic structures, and by the inclined angles of the normal lines of the {111} planes having the predetermined inclined angle frequency distribution in the region on the side of the tool body and in the region on the side of the surface of the crystal grains. Further, it was obvious that excellent chipping resistance and fracture resistance were achieved even in a case in which the coated tools were used in a high-speed intermittent cutting in which an intermittent and impact, high load exerted on cutting edges, and as a result, excellent wear resistance was exhibited in use over a long period of time.

In contrast, it was obvious that Comparative coated tools 61 to 73 and 76 to 88 and Reference coated tools 74, 75, 89, and 90 in which the predetermined average crystal grain misorientations were not present in the crystal grains which had cubic structures which formed the layer of a complex nitride or a complex carbonitrides of Al and Cr that formed the hard coating layers or in which the inclined angles of the normal lines of the {111} planes did not have the predetermined inclined angle frequency distribution in the region on the side of the tool body and in the region on the side of the surface of the crystal grains ended the life thereof in short periods of time due to the occurrence of chipping, fracture, and the like in a case in which the coated tools were used in the high-speed intermittent cutting, which was accompanied with high heat generation, in which an intermittent and impact, high load exerted on the cutting edges.

INDUSTRIAL APPLICABILITY

As described above, since the coated tool according to the present invention can be used not only in a high-speed intermittent cutting of alloy steel but also as a coated tool for a variety of work materials to be cut, and further, the coated tool exhibits excellent chipping resistance and wear resistance in use over a long period of time, the coated tool can sufficiently satisfactorily address an improvement in a performance of a cutting apparatus, and power saving, energy saving, and cost reduction for a cutting.

REFERENCE SIGNS LIST

P Measurement point (pixel)
B Grain boundary
1 Tool body
2 Hard coating layer
3 Layer of a complex nitride or a complex carbonitride

The invention claimed is:
1. A surface-coated cutting tool comprising:
a hard coating layer; and
a tool body that is formed of any of tungsten-carbide-based cemented carbide, titanium-carbonitride-based cermet, and cubic boron-nitride-based ultra-high-pressure sintered body, wherein
the hard coating layer is formed on a surface of the tool body,
(a) the hard coating layer contains at least any of a layer of a complex nitride or a complex carbonitride of Ti and Al or a layer of a complex nitride or a complex carbonitride of Ti, Al, and Me (where Me is one kind of element selected from Si, Zr, B, V, and Cr), or a layer of a complex nitride or a complex carbonitride of Cr and Al, with an average layer thickness of 2 to 20 μm,
(b) the layer of a complex nitride or a complex carbonitride contains at least a phase of a complex nitride or a complex carbonitride that has an NaCl-type face-centered cubic structure,
(c) in a case in which crystal orientations of crystal grains that have NaCl-type face-centered cubic structures from among crystal grains that form the layer of a complex nitride or a complex carbonitride are analyzed in a vertical sectional direction by using an electron backscatter diffraction apparatus, and average crystal grain misorientations in the individual crystal grains are obtained, crystal grains with average crystal grain mis- orientations of 2 degrees or more are present at an area ratio of 20% with respect to the entire area of the layer of a complex nitride or a complex carbonitride,
(d) further, in a case in which inclined angles formed by normal lines of {111} planes, which are crystal planes, with respect to a normal line direction of a surface of a tool body of the crystal grains are measured in a region on a side of the tool body and a region on a side of the surface obtained by equally dividing the layer of a complex nitride or a complex carbonitride into two regions in a layer thickness direction, and frequencies at which measured inclined angles within a range of 0 to 45 degrees with respect to the normal line direction are present from among the measured inclined angles in the respective sections obtained by dividing the inclined angles into each pitch of 0.25 degrees are aggregated,
  in a case where a ratio of total frequencies of the presence in a range of 0 to 12 degrees with respect to the entire frequencies in inclined angle frequency distribution is set as be $M_{deg}$, $M_{deg}$ ranges from 10 to 40%, and
  in a case where a highest peak is present in an inclined angle section within a range of 0 to 12 degrees in a region on the side of the surface, and a ratio of total frequencies of the presence in the range of 0 to 12 degrees with respect to the entire frequencies in inclined angle frequency distribution is set as be $N_{deg}$, $N_{deg}$ is $M_{deg}+10$ to $M_{deg}+30\%$.

2. The surface-coated cutting tool according to claim 1, wherein the layer of a complex nitride or a complex carbonitride is a layer of a complex nitride or a complex carbonitride of Ti and Al, and in a case in which a composition is represented by a composition formula: $(Ti_{1-x}Al_x)(C_yN_{1-y})$, and
an average content ratio $x_{avg}$ of Al with respect to the total amount of Ti and Al and an average content ratio $y_{avg}$ of C with respect to the total amount of C and N (where both $x_{avg}$ and $y_{avg}$ are atomic ratios) in the layer of a complex nitride or a complex carbonitride satisfy $0.60 \leq x_{avg} \leq 0.95$ and $0 \leq y_{avg} \leq 0.005$, respectively.

3. The surface-coated cutting tool according to claim 1, wherein the layer of a complex nitride or a complex carbonitride is layer of a complex nitride or a complex carbonitride of Ti, Al, and Me (where Me is one kind of element selected from Si, Zr, B, V, and Cr), and in a case in which a composition thereof is represented by a composition formula: $(Ti_{1-\alpha-\beta}Al_\alpha Me_\beta)(C_\gamma N_{1-\gamma})$, and
an average content ratio $\alpha_{avg}$ of Al with respect to the total amount of Ti, Al, and Me, an average content ratio $\beta_{avg}$ of Me with respect to the total amount of Ti, Al, and Me, and an average content ratio $\gamma_{avg}$ of C with respect to the total amount of C and N (where all of $\alpha_{avg}$, $\beta_{avg}$, and $\gamma_{avg}$ are atomic ratios) in the layer of a complex nitride or a complex carbonitride satisfy $0.60 \leq \alpha_{avg}$, $0.005 \leq \beta_{avg} \leq 0.10$, $0 \leq \gamma_{avg} \leq 0.05$, and $0.605 \leq \alpha_{avg}+\beta_{avg} \leq 0.95$, respectively.

4. The surface-coated cutting tool according to claim 1, wherein the layer of a complex nitride or a complex carbonitride is a layer of a complex nitride or a complex carbonitride of Cr and Al, and in a case in which a composition thereof is represented by a composition formula: $(Cr_{1-p}Al_p)(C_qN_{1-q})$, and
an average content ratio $p_{avg}$ of Al with respect to the total amount of Cr and Al and an average content ratio $q_{avg}$ of C with respect to the total amount of C and N (where both $p_{avg}$ and $q_{avg}$ are atomic ratios) in the layer of a complex nitride or a complex carbonitride satisfy $0.70 \leq p_{avg} \leq 0.95$ and $0 \leq q_{avg} \leq 0.005$, respectively.

5. The surface-coated cutting tool according to claim 1, wherein the layer of a complex nitride or a complex carbonitride contains at least 70% by area or more of a phase of a complex nitride or a complex carbonitride that has an NaCl-type face-centered cubic structure.

6. The surface-coated cutting tool according to claim 1, wherein in a case in which the layer of a complex nitride or a complex carbonitride is observed in a vertical sectional direction of the layer, the layer of a complex nitride or a complex carbonitride has a columnar structure in which an average crystal grain width W of the individual crystal grains that have NaCl-type face-centered cubic structures ranges from 0.1 to 2 μm and an average aspect ratio A ranges from 2 to 10.

7. The surface-coated cutting tool according to claim 1, wherein a lower layer that is formed of a Ti compound layer including one layer or two or more layers from among a carbide layer, a nitride layer, a carbonitride layer, a oxycarbide layer, and a oxycarbonitride layer of Ti and that has a total average layer thickness of 0.1 to 20 μm is present between the tool body and the layer of a complex nitride or a complex carbonitride.

8. The surface-coated cutting tool according to claim 1, wherein an upper layer that contains at least an aluminum oxide layer and has a total average layer thickness of 1 to 25 μm is formed above the layer of a complex nitride or a complex carbonitride.

9. A method for manufacturing the surface-coated cutting tool according to claim 1, comprising a step of:
  forming the layer of a complex nitride or a complex carbonitride by a chemical vapor deposition method in which at least trimethyl aluminum is contained as a reaction gas component.

* * * * *